United States Patent
Hanser et al.

(10) Patent No.: US 9,263,266 B2
(45) Date of Patent: Feb. 16, 2016

(54) GROUP III NITRIDE ARTICLES AND METHODS FOR MAKING SAME

(71) Applicant: KYMA Technologies, Inc., Raleigh, NC (US)

(72) Inventors: Andrew D. Hanser, Raleigh, NC (US);
Lianghong Liu, Raleigh, NC (US);
Edward Preble, Raleigh, NC (US);
Denis Tsvetkov, Morrisville, NC (US);
N. Mark Williams, Raleigh, NC (US);
Xueping Xu, Stamford, CT (US)

(73) Assignee: Kyma Technologies, Inc., Raleigh, NC (US)

( * ) Notice: Subject to any disclaimer, the term of this patent is extended or adjusted under 35 U.S.C. 154(b) by 0 days.

(21) Appl. No.: 14/739,110

(22) Filed: Jun. 15, 2015

(65) Prior Publication Data

US 2015/0279675 A1    Oct. 1, 2015

Related U.S. Application Data

(63) Continuation of application No. 13/856,684, filed on Apr. 4, 2013, now Pat. No. 9,082,890, which is a
(Continued)

(51) Int. Cl.
*H01L 21/28* (2006.01)
*H01L 21/02* (2006.01)

(52) U.S. Cl.
CPC ...... *H01L 21/02694* (2013.01); *H01L 21/0254* (2013.01); *H01L 21/0257* (2013.01);
(Continued)

(58) Field of Classification Search
CPC ......... H01L 21/44; H01L 29/24; H01L 21/04; H01L 21/0237; H01L 21/0242; H01L 29/04; H01L 33/007; H01L 33/30; H01L 33/32

USPC ............ 257/76, 189, 615, E21.09, E21.097, 257/E21.131, E20.089, E21.053, E21.108, 257/E21.138, E21.117, E29.144, E29.244, 257/E23.023, E33.049, E31.019, E31.059, 257/E27.012

See application file for complete search history.

(56) References Cited

U.S. PATENT DOCUMENTS

| 5,563,422 A | 10/1996 | Nakamura et al. |
| 5,611,955 A | 3/1997 | Barrett et al. |

(Continued)

FOREIGN PATENT DOCUMENTS

| JP | 10-312971 A | 11/1998 |
| JP | 11-103135 A | 4/1999 |

(Continued)

OTHER PUBLICATIONS

Akita et al. "Advantages of GaN Substrates in InAlGaN Quaternary Ultraviolet-Light-Emitting Diodes", Japanese Journal of Applied Physics, vol. 43, No. 12, 2004, pp. 8030-8031.
(Continued)

*Primary Examiner* — Selim Ahmed
(74) *Attorney, Agent, or Firm* — Morgan, Lewis & Bockius LLP

(57) ABSTRACT

Group III (Al, Ga, In)N single crystals, articles and films useful for producing optoelectronic devices (such as light emitting diodes (LEDs), laser diodes (LDs) and photodetectors) and electronic devices (such as high electron mobility transistors (HEMTs)) composed of III-V nitride compounds, and methods for fabricating such crystals, articles and films.

22 Claims, 44 Drawing Sheets

Related U.S. Application Data continuation of application No. 12/085,857, filed as application No. PCT/US2006/045965 on Nov. 30, 2006, now Pat. No. 8,435,879.

(60) Provisional application No. 60/749,728, filed on Dec. 12, 2005, provisional application No. 60/750,982, filed on Dec. 16, 2005, provisional application No. 60/810,537, filed on Jun. 2, 2006, provisional application No. 60/843,036, filed on Sep. 8, 2006, provisional application No. 60/847,855, filed on Sep. 28, 2006.

(52) U.S. Cl.
CPC ...... *H01L21/0262* (2013.01); *H01L 21/02458* (2013.01); *H01L 21/02581* (2013.01); *H01L 21/02631* (2013.01)

(56) References Cited

U.S. PATENT DOCUMENTS

| | | |
|---|---|---|
| 5,868,837 A | 2/1999 | DiSalvo et al. |
| 6,086,673 A | 7/2000 | Molnar |
| 6,086,734 A | 7/2000 | Harada |
| 6,146,457 A | 11/2000 | Solomon |
| 6,156,581 A | 12/2000 | Vaudo et al. |
| 6,177,688 B1 | 1/2001 | Linthicum et al. |
| 6,255,198 B1 | 7/2001 | Linthicum et al. |
| 6,261,929 B1 | 7/2001 | Gehrke et al. |
| 6,265,289 B1 | 7/2001 | Zheleva et al. |
| 6,273,948 B1 | 8/2001 | Porowski et al. |
| 6,274,518 B1 | 8/2001 | Yuri et al. |
| 6,380,108 B1 | 4/2002 | Linthicum et al. |
| 6,403,451 B1 | 6/2002 | Linthicum et al. |
| 6,413,627 B1 | 7/2002 | Motoki et al. |
| 6,440,823 B1 | 8/2002 | Vaudo et al. |
| 6,447,604 B1 | 9/2002 | Flynn et al. |
| 6,468,347 B1 | 10/2002 | Motoki et al. |
| 6,488,767 B1 | 12/2002 | Xu et al. |
| 6,521,514 B1 | 2/2003 | Gehrke et al. |
| 6,528,394 B1 | 3/2003 | Lee |
| 6,533,874 B1 * | 3/2003 | Vaudo .............. B82Y 15/00 148/33.5 |
| 6,596,079 B1 | 7/2003 | Vaudo et al. |
| 6,608,327 B1 | 8/2003 | Davis et al. |
| 6,616,757 B1 | 9/2003 | Melnik et al. |
| 6,649,287 B2 | 11/2003 | Weeks, Jr. et al. |
| 6,652,648 B2 | 11/2003 | Park |
| 6,656,823 B2 | 12/2003 | Lee et al. |
| 6,667,184 B2 | 12/2003 | Motoki et al. |
| 6,686,261 B2 | 2/2004 | Gehrke et al. |
| 6,692,568 B2 | 2/2004 | Cuomo et al. |
| 6,693,021 B1 | 2/2004 | Motoki et al. |
| 6,750,121 B1 | 6/2004 | Kim |
| 6,765,240 B2 | 7/2004 | Tischler et al. |
| 6,768,146 B2 | 7/2004 | Yoshida |
| 6,773,504 B2 | 8/2004 | Motoki et al. |
| 6,784,085 B2 | 8/2004 | Cuomo et al. |
| 6,897,483 B2 | 5/2005 | Zheleva et al. |
| 6,909,165 B2 | 6/2005 | Nakayama et al. |
| 6,923,859 B2 | 8/2005 | Kim |
| 6,924,159 B2 | 8/2005 | Usui et al. |
| 6,943,095 B2 | 9/2005 | Vaudo et al. |
| 6,951,695 B2 | 10/2005 | Xu et al. |
| 7,012,318 B2 | 3/2006 | Motoki et al. |
| 7,118,813 B2 | 10/2006 | Xu et al. |
| 8,435,879 B2 | 5/2013 | Hanser et al. |
| 2002/0068201 A1 | 6/2002 | Vaudo et al. |
| 2002/0069816 A1 | 6/2002 | Gehrke et al. |
| 2003/0157376 A1 | 8/2003 | Vaudo et al. |
| 2003/0207125 A1 | 11/2003 | Sunakawa et al. |
| 2004/0080010 A1 | 4/2004 | Parikh et al. |
| 2004/0124434 A1 | 7/2004 | D'Evelyn et al. |
| 2005/0009310 A1 | 1/2005 | Vaudo et al. |
| 2005/0098095 A1 | 5/2005 | D'Evelyn et al. |
| 2005/0103257 A1 | 5/2005 | Xu et al. |
| 2005/0133818 A1 | 6/2005 | Johnson et al. |
| 2005/0167775 A1 | 8/2005 | Nagy et al. |
| 2006/0003556 A1 | 1/2006 | Lee et al. |
| 2006/0091500 A1 | 5/2006 | Lee et al. |
| 2007/0072396 A1 | 3/2007 | Feltin et al. |
| 2007/0138505 A1 | 6/2007 | Preble et al. |
| 2007/0141823 A1 | 6/2007 | Preble et al. |
| 2010/0044718 A1 | 2/2010 | Hanser et al. |

FOREIGN PATENT DOCUMENTS

| | | |
|---|---|---|
| JP | 2003-124128 A | 4/2003 |
| JP | 2004-523450 A | 8/2004 |
| WO | 2005/031045 A2 | 4/2005 |
| WO | 2008/048303 A2 | 4/2008 |
| WO | 2008/048303 A3 | 7/2008 |

OTHER PUBLICATIONS

Amano et al. "Metal Organic Vapor Phase Epitaxial Growth of a High Quality GaN Film using an AlN Buffer Layer", Appl. Phys. Lett., vol. 48, No. 5, Feb. 3, 1986, pp. 353-355.

Baik et al. "160-A Bulk GaN Schottky Diode array", Appl. Phys. Lett., vol. 83, No. 15, 2003, pp. 3192-3194.

Balmer et al. "GaN-Based Heterojunction PET's on 100mm Si Substrates", 2nd EMRS DTC, Technical Conference, Edinburgh, A24, 2005, 6 pages.

Baur et al. "Infrared Luminescence of Residual Iron Deep Level Acceptors in Gallium Nitride (GaN) Epitaxial Layers", Applied Physics Letters, vol. 64, No. 7, Feb. 14, 1994, pp. 857-859.

Beccard et al. "Growth of Semi-Insulating InP:Fe in the Low Pressure Hydride VPE System", Cryst. Growth, vol. 121, 1992, pp. 373-380.

Carrion et al. "Growth of Fe-doped GaN by RF Plasma-Assisted Molecular Beam Epitaxy", Journal of Crystal Growth, vol. 289, 2006, pp. 587-595.

Chyi et al. "Temperature Dependence of GaN High Breakdown Voltage Diode Rectifiers", Solid-State Electronics, 44, 2000, pp. 613-617.

Zhang et al. "Vertical and Lateral GaN Rectifiers on Free-Standing GaN Substrates", Applied Physics Letters, vol. 79, No. 10, Sep. 3, 2001, pp. 1555-1557.

Dang et al. "High Breakdown Voltage Au/Pt/GaN Schottky Diodes", J. Vac. Sci. Technol., vol. 18, No. 4, Jul./Aug. 2000, pp. 1135-1138.

Etzkorn et al. "Cracking of GaN Films", J. Appl. Phys., vol. 89, No. 2, Jan. 15, 2001, pp. 1025-1034.

Heikman, S. "Growth of Fe Doped Semi-Insulating GaN by Metalorganic Chemical Vapor Deposition", Applied Physics Letters, vol. 81, No. 3, Jul. 15, 2002, pp. 439-441.

Heitz et al. "Excited States of Fe3+ in GaN", Physical Review B, vol. 55, No. 7, Feb. 15, 1997, pp. 4382-4387.

Johnson et al. "Breakdown Voltage and Reverse Recovery Characteristics of Free-Standing GaN Schottky Rectifiers", IEEE Transactions on Electronic Devices, vol. 49, No. 1, 2002, pp. 32-36.

Johnson et al. "Schottky Rectifiers Fabricated on Free-Standing GaN Substrates", Solid-State Electronics, vol. 45, 2001, pp. 405-410.

Kang et al. "Temperature Dependent Characteristics of Bulk GaN Schottky Rectifiers on Freestanding GaN Substrates", J. Vac. Sci. Technol., vol. 22, No. 2, 2004, pp. 710-714.

Karpov et al. "Dislocation Effect on Light Emission Efficiency in Gallium Nitride", Applied Physics Letters, vol. 81, No. 25, Dec. 16, 2002, pp. 4721-4723.

Karrer et al. "Influence of Crystal Polarity on the Properties of Pt/GaN Schottky Diodes", Appl. Phys. Lett., vol. 77, No. 13, Sep. 22, 2000, pp. 2012-2014.

Katz et al. "Anisotropy in Detectivity of GaN Schottky Ultraviolet Detectors: Comparing Lateral and Vertical Geometry", Appl. Phys. Lett., vol. 80, No. 3, 2002, pp. 347-349.

Kelly et al. "Large Free-Standing GaN Substrates by Hydride Vapor Phase Epitay and Laser-Induced Liftoff", Jpn. J. Appl. Phys., vol. 38, 1999, pp. L217-L219.

Kuznetsov et al. "Insulating GaN:Zn Layers Grown by Hydride Vapor Phase Epitaxy on SiC Substrates", Applied Physics Letters, vol. 75, No. 20, Nov. 15, 1999, pp. 3138-3140.

(56) References Cited

OTHER PUBLICATIONS

Lester et al. "High Dislocation Densities in High Efficiency GaN-based Light-Emitting Diodes", Appl. Phys. Lett. 66 (10), Mar. 6, 1995, pp. 1249-1251.
Look et al. "Dislocation Scattering in GaN", Phys. Rev. Lett., vol. 82, No. 6, Feb. 8, 1999, pp. 1237-1240.
Misra et al. "Investigation of Vertical Transport in n-GaN Films Grown by Molecular Beam Epitaxy using Schottky Barrier Diodes", Appl. Phys. Lett., vol. 76, No. 8, Feb. 21, 2000, pp. 1045-1047.
Monemar, B. "Growth of Thick GaN Layers with Hydride Vapour Phase Epitaxy", J. Crystal Growth 281, 2005, pp. 17-31.
Nakamura et al. "Room-Temperature Continuous-Wave Operation of InGaN Multi-Quantum-Well Structure Laser Diodes with a Lifetime of 27 Hours", Appl. Phys. Lett., vol. 70 No. 11, 1997, pp. 1417-1419.
Nakamura "Superbright Green InGaN Single-Quantum-Well-Structure Light-Emitting Diodes", Jpn. J. Appl. Phys., vol. 34, Part 2, No. 10B, Oct. 15, 1995, pp. L1332-L1335.
Nakamura, S. "GaN Growth Using GaN Buffer Layer", Jpn. J. Appl. Phys., vol. 30, No. 10A, Oct. 1991, pp. L1705-L1707.
Ng et al. "The Role if Dislocation Scattering INN-type GaN films", Appl. Phys. Lett., vol. 73, No. 6, Aug. 10, 1998, pp. 821-823.
Otoki et al. "GaN-HEMT on 100mm Diameter Sapphire Substrate Grown by MOVPE", 2003 International Conference on Compound Semiconductor Mfg., GaAs MANTECH, 2003, pp. 1-4.
Pearton et al. "Fabrication and Performance of GaN Electronic Devices", Materials Science and Engineering, R30, 2000, pp. 55-212.
Polyakov et al. "Electrical Properties and Defect States in Undoped High-Resistivity GaN Films used in High-Power Rectifiers", J. Vac. Sci. Technol., vol. 18, No. 3, May/Jun. 2000, pp. 1237-1243.
Porowski et al. "Thermodynamical Properties of III-V Nitrides and Crystal Growth of GaN at High N2 Pressure", J. Cryst. Growth, vol. 178, 1997, pp. 174-188.
Rosner et al. "Cathodoluminescence Mapping of Epitaxial Lateral Overgrowth in Gallium Nitride", Appl. Phys. Lett., vol. 74, No. 14, Apr. 5, 1999, pp. 2035-2037.
Rosner et al. "Correlation of Cathodoluminescence Inhomogeneity with Microstructural Defects in Epitaxial GaN Grown by Matalorganic Chemical-Vapor Deposition", Appl. Phys. Lett., vol. 70, No. 4, Jan. 1997, pp. 420-422.
Shin et al. "Superior Characteristics of RuO2/GaN Schottky-Type UV Photodetector", Phys. Stat. Sol. A, 188, No. 1, 2001, pp. 341-344.
Shur, M. S. "GaN Based Transistors for High Power Applications", Solid-State Electronics, vol. 42, No. 12, 1998, pp. 2131-2138.
Strite et al. "GaN, AlN, and InN: A review", J. Vac. Sci. Technol., B vol. 10, No. 4, Jul./Aug. 1992, pp. 1237-1266.
Sugiura "Dislocation Motion in GaN Light-Emitting Devices and its Effect on device lifetime", Appl. Phys., vol. 81, No. 4, Feb. 15, 1997, pp. 1633-1638.
Suo, Z. "Fracture in Thin Films", Encyclopedia of Materials: Science and Technology, Elsevier Science, Jun. 26, 2000.
Tomiya et al. "Structural Defects Related Issues of GaN-based Laser Diodes", Mater. Res. Soc. Symp. Proc., vol. 831, 2005, pp. E1.1.1-E1.1.11.
Trivedi et al. "Performance Evaluation of High-Power Wide Band-Gap Semiconductor Rectifiers", J. Appl. Phys., vol. 85, No. 9, May 1, 1999, pp. 6889-6897.
Yoshida et al. "Improvements on the Electrical and Luminescent Properties of Reactive Molecular Beam Epitaxially Grown GaN films by using AlN-Coated Sapphire Substrates", Appl. Phys. Lett., vol. 42, No. 5, Mar. 1, 1983, pp. 427-429.
Weimann et al. "Scattering of Electrons at Threading Dislocations in GaN", J. Appl. Phys., vol. 83, No. 7, Apr. 1, 1998, pp. 3656-3659.
Yasan et al. "Comparison of Ultraviolet Light-Emitting Diodes with Peak Emission at 340 nm Grown on GaN Substrate and Sapphire", Applied Physics Letters, vol. 81, No. 12, Sep. 16, 2002, pp. 2151-2153.
Examination Report Received for Japanese Patent Application No. 2008-545630, mailed on Nov. 19, 2013, 11 pages. (5 pages of English Translation and 6 pages of Official Copy).
Examination Report Received for Japanese Patent Application No. 2008-545630, mailed on May 20, 2014, 6 pages. (3 pages of English Translation and 3 pages of Official Copy).
Mathis et al., "Modeling of Threading Dislocation Reduction in Growing GaN Layers", Journal of Crystal Growth, vol. 231, 2001, pp. 317-390.

* cited by examiner

GROUP III NITRIDE ARTICLES AND METHODS FOR MAKING SAME

CROSS-REFERENCE TO RELATED APPLICATIONS

This application is a continuation of U.S. patent application Ser. No. 13/856,684, filed on Apr. 4, 2013, which is a continuation of U.S. patent application Ser. No. 12/085,857, filed on Sep. 14, 2009, which is the U.S. national stage application of International (PCT) Patent Application Serial No. PCT/US2006/045965, filed Nov. 30, 2006, which claims the benefit of U.S. Provisional Patent Application Ser. No. 60/749,728, filed Dec. 12, 2005, titled "Bulk Gallium Nitride Crystals and Method of Making the Same;" U.S. Provisional Patent Application Ser. No. 60/750,982, filed Dec. 16, 2005, titled "Method of Producing Freestanding Gallium Nitride by Self-Separation;" U.S. Provisional Patent Application Ser. No. 60/810,537, filed Jun. 2, 2006, titled "Low Defect GaN Films Useful for Electronic and Optoelectronic Devices and Method of Making the Same;" U.S. Provisional Patent Application Ser. No. 60/843,036, filed Sep. 8, 2006, titled "Methods for Making Inclusion-Free Uniform Semi-Insulating Gallium Nitride Substrate;" and U.S. Provisional Patent Application Ser. No. 60/847,855, filed Sep. 28, 2006, titled "Method of Producing Single Crystal Gallium Nitride Substrates by HVPE Method Incorporating a Polycrystalline Layer for Yield Enhancement," the contents of each of which are incorporated by reference herein in their entireties.

FEDERALLY SPONSORED RESEARCH

This invention was made with government support under grant number N00164-04-C-6066 by the Missile Defense Agency ("MDA"). The United States Government may have certain rights in the invention.

BACKGROUND

1. Field of the Invention

This invention relates to Group III (Al, Ga, In)N articles (e.g., crystals, boules, substrates, wafers, layers, films, and the like) useful for producing optoelectronic devices (such as light emitting diodes (LEDs), laser diodes (LDs) and photodetectors) and electronic devices (such as high electron mobility transistors (HEMTs)) composed of III-V nitride compounds, and to methods for producing such articles.

2. Description of the Related Art

Group III-V nitride compounds such as aluminum nitride (AlN), gallium nitride (GaN), indium nitride (InN), and alloys such as AlGaN, InGaN, and AlGaInN, are direct bandgap semiconductors with bandgap energy ranging from about 0.6 eV for InN to about 6.2 eV for AlN. These materials may be used to produce light emitting devices such as LEDs and LDs in short wavelength in the green, blue and ultraviolet (UV) spectra. Blue and violet laser diodes may be used for reading data from and writing data to high-density optical storage discs, such as those used by Blu-Ray and HD-DVD systems. By using proper color conversion with phosphors, blue and UV light emitting diodes can be made to emit white light, which may be used for energy efficient solid-state light sources. Alloys with higher bandgaps may be used for UV photodetectors that are insensitive to solar radiation. The material properties of the III-V nitride compounds are also suitable for fabrication of electronic devices that may be operated at higher temperature, higher power, and higher frequency than conventional devices based on silicon (Si) or gallium arsenide (GaAs).

Most of the III-V nitride devices are grown on foreign substrates such as sapphire ($Al_2O_3$) and silicon carbide (SiC) because of the lack of available low-cost, high-quality, large-area native substrates such as GaN substrates. Blue LEDs are mostly grown on insulating sapphire substrates or conductive silicon carbide substrates using a metal-organic chemical vapor deposition (MOCVD) process. Sapphire belongs to the trigonal symmetry group, while SiC belongs to the hexagonal symmetry group. GaN films and InGaN films have been heteroepitaxially grown on the c-plane sapphire surface for LED devices. Due to lattice mismatch, the GaN films grown on both sapphire and SiC substrates typically have high crystal defects with a dislocation density of $10^9$ to $10^{10}$ cm$^{-3}$. Despite the high defect density of the LEDs grown on these substrates, commercial LEDs have long lifetimes suitable for some applications.

The MOCVD process is a slow growth rate process with a growth rate of a few microns per hour. In a typical GaN-based device growth process, a low-temperature buffer layer of GaN or $Al_xGa_{1-x}N$ (x=0-1) is first grown on a foreign substrate (e.g., sapphire or silicon carbide), followed by the growth of a few microns of GaN. The active device layer, such as quantum well structures for LEDs, is subsequently grown. For example, U.S. Pat. No. 5,563,422 to S. Nakamura et al. describes a GaN-based device grown by an MOCVD process. A thin GaN nucleation layer of about 10 nanometers is first deposited on a sapphire substrate at a low temperature of 500-600° C. The GaN nucleation layer is annealed at high temperature to recrystallize the GaN, and epitaxial GaN film is grown at higher temperature (approximately 1000-1200° C.).

UV LEDs based on alloys of GaN, however, show strong dependence of the power output on the substrate material used. The UV LEDs can be grown on native GaN substrates or on foreign substrates such as sapphire and silicon carbide. On the foreign substrate, a GaN or AlGaN thin film is first grown by utilizing appropriate techniques and the active UV LED structure is subsequently grown. It has been found that the power output of UV LEDs grown on native GaN substrates is much greater than the power output of those grown foreign substrates (see, for example, Yasan et al. Applied Physics Letters, Volume 81, pages 2151-2154 (2002); Akita et al. Japanese Journal of Applied Physics, Volume 43, pages 8030-8031 (2004)). The lower density of crystal defects in the device structure grown on a native GaN substrate contributes to higher power output.

Group III-V nitride-based laser diodes also show a remarkable dependence of lifetime on the crystal defect density. The lifetime of the LDs dramatically decreases with the increase of the dislocation density (see, for example, "Structural defects related issues of GaN-based laser diodes," S. Tomiya et al., MRS Symposium Proceedings, Vol. 831, p. 3-13, 2005). Low defect density single-crystal gallium nitride substrates are needed for the long lifetime (>10,000 hours) nitride laser diodes. For LEDs based on an AlGaN active layer operating at the deeper UV range, it is also found that dislocation density has a detrimental effect on the performance and lifetime of the devices. For LEDs operating at higher power levels, it is also desirable to have a lower defect density GaN layer.

Because of the very high equilibrium nitrogen pressure at the melting point, gallium nitride single crystals cannot be grown with conventional crystal growth methods such as the Bridgman method or Czochralski method where single crystals are grown from the stoichiometric melt. At ambient pressure, GaN starts to decompose well before melting.

Despite such difficulties, small-size high-quality single-crystal GaN substrates have been made with several methods. Porowski et al. discloses a method of growing bulk GaN at high nitrogen pressure (S. Porowski and I. Grzegory, J. Cryst. Growth, Vol 178, 174 (1997)). Gallium metal is reacted with gaseous nitrogen at a nitrogen pressure as high as 20 kbar and a temperature as high as 2000 K. The crystal growth rate of the process is slow and long growth times of 60-150 hours are needed to produce crystal platelets of about 1 cm in length and about 0.1 mm in thickness. It is also believed that the process is not scalable, i.e., longer growth times or larger reactors cannot increase the crystal size substantially. Disalvo et al. in U.S. Pat. No. 5,868,837 discloses a method of GaN growth using sodium flux where gallium metal reacts with gaseous nitrogen under moderate temperature and pressure. However, the GaN crystals grown with the sodium flux method are small, about a few millimeters in size. D'Evelyn et al. in U.S. Pat. App. Pub. Nos. 2004/0124434 and 2005/0098095 discloses the growth of GaN in supercritical ammonia ($NH_3$). Although high crystal quality can be achieved, the growth rate may be quite slow, and thus produces crystals with small area. Therefore, GaN crystal growth from liquid phase, in general, yields small crystals, and is not suitable for commercial applications.

Large-area GaN crystals may be grown by hydride vapor phase epitaxy (HVPE) methods. In the HVPE process, gallium chloride (GaCl), formed by reacting gaseous hydrochloric acid (HCl) with gallium metal in the upstream of the reactor, reacts with ammonia ($NH_3$), depositing GaN on the surface of a substrate. The size of the GaN crystal grown may be the same as the size of the substrate. Substrates such as sapphire, gallium arsenide, silicon carbide, and other suitable foreign substrates have been used. Since large-sized substrates with a diameter from 2 inches to 12 inches are available, large-sized GaN, in theory, could be grown with HVPE techniques. However, bulk GaN growth on sapphire substrate by HVPE encounters many obstacles, such as nucleation of polycrystalline material, cracking and microcracking during growth and cool down, and an unstable crystal growth front that leads to polycrystalline formation or microcracking during the bulk growth.

Bulk GaN growth methods, in which multiple wafers can be produced, can significantly reduce the cost the GaN wafer manufacturing. The material quality also improves with the bulk growth. Vaudo et al. in U.S. Pat. No. 6,596,079 discloses a vapor phase method for growing a GaN boule using native GaN crystal as a seed. However, to practice the invention, a high-quality GaN seed is first required. Melnik et al. in U.S. Pat. No. 6,616,757 discloses a similar method for growing GaN crystal boule by hydride vapor phase epitaxy. A GaN single-crystal layer is first grown on a silicon carbide substrate, the substrate is subsequently removed by etching in molten KOH to form a GaN seed, and a GaN boule is grown on the seed to a length greater than 1 centimeter. However, silicon carbide substrates are of higher cost than sapphire substrates and the process is not applicable to sapphire substrate since sapphire cannot be etched away. Motoki et al. in U.S. Pat. Nos. 6,413,627; 6,468,347; and 6,667,184 discloses methods for growing a bulk GaN crystalline boule by HVPE on GaAs and on native GaN seeds. Because of the processes used, the GaN crystal boule grown by Motoki's methods contain clusters of highly defective material.

In view of such prior-art approaches to bulk GaN crystal growth, it is well-acknowledged that there is still a need in the art for low-cost methods for manufacturing high-quality GaN crystal boules and wafers.

It is also of interest to produce free-standing GaN articles by separating or removing the underlying substrate. Vaudo et al. in U.S. Pat. No. 6,440,823 discloses a method for producing low defect GaN using HVPE on sapphire substrates. The sapphire substrate can be removed to produce large-area GaN substrate, for example, by a laser induced liftoff process as described by Kelly et al. ("Large freestanding GaN substrates by hydride vapor phase epitaxy and laser-induced liftoff," Jpn J. Appl. Phys., Vol. 38, L217-L219, 1999). The wavelength of the laser beam, or the energy of the laser beam, is chosen so that it is smaller than the bandgap of the substrate, but larger than the bandgap of GaN. The substrate is transparent to the laser beam, but the GaN absorbs the laser energy, heating the interface and decomposing the GaN at the interface, which separates the GaN film from the substrate. In U.S. Pat. App. Pub. No. 2002/0068201, Vaudo et al. further discloses a method for producing freestanding GaN near the growth temperature by shining a laser beam at the interface between the grown GaN layer and the template, and decomposing the interface material. This process involves dangerous high-energy laser beams and high manufacturing cost. Park et al. in U.S. Pat. No. 6,652,648 discloses a similar method for producing GaN substrate by first growing HVPE GaN on sapphire substrates and followed by laser liftoff. Motoki et al. in U.S. Pat. No. 6,693,021 discloses a method for growing a thick GaN film on a gallium arsenide (GaAs) substrate, in which the GaAs substrate was wet-etched away to produce a free-standing GaN substrate.

The known methods for producing GaN substrates such as disclosed in U.S. Pat. Nos. 6,693,021; 6,652,648; and 6,440,823 can only yield one wafer per growth run, and thus are of high manufacturing cost.

Chin Kyo Kim in U.S. Pat. No. 6,923,859 discloses an apparatus and associated manufacturing method for GaN substrates in which a substrate and a GaN layer are separated from each other after growing the GaN layer on the substrate in the same chamber. The apparatus contains a transparent window at the circumference of the chamber to allow the introduction of the laser beam to the substrate. This process likewise involves dangerous high-energy laser beams and has high manufacturing cost.

Bong-Cheol Kim in U.S. Pat. No. 6,750,121 discloses an apparatus and method for forming a single crystalline nitride substrate using hydride vapor phase epitaxy and a laser beam. After growth of the GaN film on sapphire substrate, the wafer is moved to a heated chamber for laser-introduced separation. Because the wafer does not cool to room temperature, cracking induced by the mismatch of the coefficient of thermal expansion is eliminated. This process likewise involves dangerous high-energy laser beams and has high manufacturing cost.

Park et al. in U.S. Pat. No. 6,652,648 discloses a method for producing GaN substrate by first growing HVPE GaN on sapphire substrates. The backside of the sapphire substrate is protected for minimal parasitic deposition. After GaN growth on sapphire substrate, the GaN/sapphire structure is removed from the reactor. The GaN layer is subsequently separated from the sapphire substrate by a laser liftoff process. In addition to involving dangerous high-energy laser beams, the GaN layer on sapphire is likely to crack upon cool down, and thus this process suffers with low yield and high manufacturing cost.

Motoki et al. in U.S. Pat. No. 6,693,021 discloses a method of growing thick GaN film on gallium arsenide (GaAs) substrate. The GaAs substrate is wet-etched away to produce a free-standing GaN substrate. However, GaAs substrates tend to thermally decompose at the GaN growth temperature and in the GaN crystal growth environment, introducing impurities to the GaN film.

Yuri et al. in U.S. Pat. No. 6,274,518 discloses a method for producing a GaN substrate. A first semiconductor film (AlGaN) layer is formed on a sapphire substrate, and a plurality of grooves is formed on the AlGaN layer. A relatively thick GaN film is grown on a grooved AlGaN template by an HVPE method, and upon cooling down from the growth temperature to room temperature, GaN separates from the template, forming a large area freestanding GaN substrate. However, this method requires deposition and patterning of several films in different systems and cracking-separation. Thus, the process is one of low yield and high manufacturing cost.

Solomon in U.S. Pat. No. 6,146,457 discloses a thermal mismatch compensation method to produce a GaN substrate. The GaN film is deposited at a growth temperature on a thermally mismatched foreign substrate to a thickness on the order of the substrate, where the substrate is either coated with a thin interlayer or patterned. After cool down from the growth temperature to the room temperature, it is stated that thermal mismatch generates defects in the substrate, not in the GaN film, producing a thick high-quality GaN material. However, the GaN material of Solomon's invention is still attached to the underlying substrate, with the underlying substrate containing substantial defects and/or cracks. Subsequently, other processing steps are required to create a free-standing GaN layer.

Usui et al. in U.S. Pat. No. 6,924,159 discloses a void-assisted method for manufacturing GaN substrate. In this method, a first GaN thin film is deposited on a foreign substrate, and a thin metal film such as titanium film is then deposited on the first GaN thin film. The titanium metal film is heated in hydrogen-containing gas to form voids in the first GaN thin film. A thick GaN film is subsequently deposited on the first void-containing GaN film. The voids in the first GaN film create fracture weakness, and upon cooling from the growth temperature to ambient room temperature, the thick GaN layer separates itself from the substrate, forming a GaN wafer. However, this method requires deposition of several layers of films in different systems and cracking-separation. Thus, the process is one of low yield and high manufacturing cost.

The techniques of the prior art for manufacturing GaN wafers are attended by high manufacturing cost. There are some commercial vendors currently selling 2" GaN wafers, but at very high price, reflecting the high manufacturing cost. Additionally, researchers have shown that the freestanding GaN substrates formed using the laser-induced liftoff process can be subject to substantial bowing, which limits their usability for device manufacturing (see, for example, "Growth of thick GaN layers with hydride vapour phase epitaxy," B. Monemar et al., J. Crystal Growth, 281 (2005) 17-31).

In view of such prior-art approaches to forming GaN substrates, it is well-acknowledged that there is still a need in the art for low-cost methods for producing high-quality free-standing GaN substrates.

There is also interest in fabricating electronic devices in which an active layer is built on GaN film. Because of the lattice mismatch between gallium nitride and the non-native substrate, there is a large number of crystal defects in the GaN film and active device layer. The defect density in the GaN nucleation layer is thought to be on the order of $10^{11}$ cm$^{-2}$ or greater, and in the subsequently grown GaN layer and active device layer, the typical density of crystal defects, in particular, the threading dislocation density, is on the order of $10^9$-$10^{10}$ cm$^{-2}$ or greater in typical GaN-based LEDs as previously noted. Moreover, because of the large mismatch in both the thermal expansion coefficients and the lattice constants of the foreign substrate and the GaN film, problems such as a high defect density lead to short device lifetime and bowing of GaN/heteroepitaxial substrate structures. Bowing leads to difficulty in fabricating devices with small feature sizes.

For LEDs based on an AlGaN active layer operating at the deeper UV range, it is also found that dislocation density has a detrimental effect on the performance and lifetime of the devices. For LEDs operating at higher power levels, it is also desirable to have a lower defect density GaN layer.

There are several growth methods that may possibly be performed to reduce the defect density of the gallium nitride film. One common approach in MOCVD growth of gallium nitride is epitaxial lateral overgrowth (ELOG) and its variations. In an ELOG GaN growth process, a GaN film is first grown by a MOCVD method with the 2-step process (low-temperature buffer and high-temperature growth). A dielectric layer such as silicon oxide or silicon nitride is deposited on the first GaN film. The dielectric layer is patterned with a photolithographic method and etched so that portions of GaN surface are exposed and portions of the GaN film are still covered with the dielectric mask layer. The patterned GaN film is reloaded into the MOCVD reactor and growth is recommenced. The growth condition is chosen such that the second GaN layer can only be grown on the exposed GaN surface, but not directly on the masked area. When the thickness of the second GaN layer is thicker than the dielectric layer, GaN can grow not only along the original c direction, but also along the sidewalls of the GaN growing out of the exposed area and gradually covering the dielectric mask. At the end of the growth, the dielectric mask will be completely covered by the GaN film and the GaN film overall is quite smooth. However, the distribution of the threading dislocation density is not uniform. Since the dislocation density of the first GaN layer is quite high, the defect density is also high in the area of the second GaN layer grown directly on the exposed first GaN layer. In comparison, the defect density is much reduced in the area above the dielectric mask area where the second GaN layer was grown laterally in the direction parallel to the surface. The defect density is still high in the area where the second GaN layer was grown directly on the first GaN layer and in the area where the lateral grown GaN coalesced. Multiple ELOG processes can be used to further reduce the defect density by patterning a second dielectric mask covering the high defect density areas of the first ELOG GaN film, and growing GaN film in the ELOG condition that yields a coalesced second ELOG film.

The manufacturing cost of the prior-art low defect density GaN film based on MOCVD is high due to multiple growth and photolithographic steps. The high cost of the film also increases the overall manufacturing cost of end products such as UV LEDs.

Therefore, there is still a compelling need in the art for low-cost methods for producing high-quality, low defect density GaN films that are suitable for electronic and optoelectronic devices to be built on.

Conductive GaN substrates have recently become available. Such conductive GaN substrates are advantageously employed in the manufacturing of blue and UV lasers. However, in a number of electronic applications such as high electron mobility transistors (HEMTs), an insulating or semi-insulating GaN substrate is highly desirable.

Unintentionally doped GaN exhibits n-type conductivity due to the presence of residual n-type impurities as well as crystal defects. Since GaN has a high bandgap energy, a pure and defect-free GaN material should exhibit insulating or semi-insulating electric properties. However, current GaN crystal growth techniques still allow the unintentional incorporation of impurities and various crystal defects such as vacancies and dislocations, which render the GaN crystals conductive.

It is known in the prior art that by introducing deep-level compensating impurities in the crystal, a wide bandgap semiconductor can be made semi-insulating. For example, U.S. Pat. No. 5,611,955 issued to Barrett et al. discloses the use of vanadium doping in silicon carbide to produce a semi-insulating SiC crystal. Similarly, Beccard et al. discloses the use of iron chloride formed by reacting elemental iron with gaseous hydrochloric acid in a vapor phase reactor during the HVPE growth of indium phosphide (InP) to produce iron-doped semi-insulating InP crystals (R. Beccard et al., J. Cryst. Growth, Vol. 121, page 373-380, 1992). The compensating impurities act as deep-level acceptors to trap the otherwise free electrons generated by unintentionally doped n-type impurities and crystal defects. The concentration of the deep-level acceptor is typically higher than the concentration of the free electrons generated by the n-type impurities and crystal defects.

Several deep-level acceptors generated by compensating impurities in gallium nitride (GaN) have been identified in the prior art. For example, Group II metals such as Be, Mg, and Zn, and transition metals such as Fe and Mn, can be incorporated in the GaN crystal resulting in semi-insulating electric properties. The energy level of iron in gallium nitride is well-documented and iron incorporation can result in gallium nitride exhibiting the semi-insulating electric property (see, for example, R. Heitz et al., Physical Review B, Vol. 55, page 4382, 1977). Iron-doped gallium nitride thin films can be grown with metal-organic chemical vapor deposition, molecular beam epitaxy, and hydride vapor phase epitaxy (see, for example, J. Baur et al., Applied Physics Letters, Vol. 64, page 857, 1994; S. Heikman, Applied Physics Letters, Vol. 81, page 439, 2002; and A. Corrion, et al., Journal of Crystal Growth, Vol. 289, page 587, 2006). Zinc-doped gallium nitride thin films grown by hydride vapor phase epitaxy can be semi-insulating as well (N. I. Kuznetsov et al., Applied Physics Letters, Vol. 75, page 3138, 1999).

U.S. Pat. No. 6,273,948 issued to Porowski et al. discloses a method for making a highly resistive GaN bulk crystal. The GaN crystal is grown from molten gallium under an atmosphere of high-pressure nitrogen (0.5-2.0 GPa) and at high temperature (1300-1700° C.). When pure gallium is used, the GaN crystal grown is conductive due to residual n-type impurities and crystal defects. When a mixture of gallium and a Group II metal such as beryllium, magnesium, calcium, zinc, or cadmium is used, the grown GaN crystal is highly resistive, with a resistivity of $10^4$-$10^8$ ohm-cm. However, the crystals obtained from molten gallium under the high-pressure, high-temperature process were quite small, on the order of one centimeter, which is not suitable for most commercial electronic applications.

U.S. Pat. App. Pub. No. 2005/0009310 by Vaudo et al. discloses a large-area semi-insulating GaN substrate grown by hydride vapor phase epitaxy (HVPE). Typically, undoped HVPE-grown GaN is of n-type conductivity due to the residual impurities and crystal defects. By introducing a deep-level doping species during the growth process and at a sufficiently high concentration of the dopant species in the GaN crystal, the grown GaN crystal becomes semi-insulating. Typical dopant species are transitional metals such as iron.

However, during the HVPE growth of single-crystal GaN, there are various surface morphologies observed and these different growth morphologies have different levels of impurity incorporation. U.S. Pat. No. 6,468,347 by Motoki et al. discloses that in the growth of GaN on c-plane substrate by HVPE, the growth surface has inverse pyramidal pits. Because of the presence of the pits on the growing GaN surface, the actual GaN growth takes place both on the non-pitted area, which is normal c-plane growth, and on the faces of the pits, which is non-c-plane growth. U.S. Pat. No. 6,773,504 and U.S. Pat. No. 7,012,318 by Motoki et al. disclose that GaN growth on the surfaces other than the c-plane has much higher oxygen incorporation.

The presence of inverse pyramidal pits on the GaN crystal surface during HVPE growth results in a non-uniform distribution of n-type impurity concentration in the GaN crystal due to higher impurity incorporation on the non-c-plane surfaces. The impurity concentrations in these pitted areas can be an order of magnitude or more higher than in non-pitted areas. Even when compensating deep-level impurities such as iron are introduced during the crystal growth, the electric characteristics of the grown GaN crystal are not uniform when pits are present during the growth, and GaN wafers made from such crystals will have a non-uniform sheet resistance across the wafer surface. When the as-grown GaN is polished to remove the pits and to produce a smooth surface, the impurity concentration on the surface is still not uniform. The areas where pits were present have a higher oxygen impurity concentration, appear to be darker in color than the surrounding area, and are considered as "inclusions" of more conductive spots. Electronic devices grown on substrates with non-uniform electric properties have lower performance, resulting in lower device yield. Substrates that are "inclusion-free," or those substrates without non-uniform areas of more conductive spots, would have a more uniform sheet resistance across the wafer surface and higher performance, resulting in higher device yield.

Therefore, there is also a compelling need in the art for large-area, inclusion-free, uniform semi-insulating GaN substrates and methods for making such substrates.

SUMMARY

The present invention in some aspects generally relates to gallium nitride (Al, Ga, In)N articles (e.g., crystals, boules, substrates, wafers, layers, films, and the like) and to methods for producing such articles.

According to one implementation, a bulk crystal structure includes a substrate, an AlN epitaxial layer grown on the substrate, a GaN nucleation layer grown on the AlN epitaxial layer, a transitional GaN layer on the nucleation layer, and a bulk GaN layer grown on the transitional layer.

According to another implementation, a bulk crystal structure includes a substrate, a GaN nucleation layer grown on the substrate, a transitional GaN layer on the nucleation layer, and a bulk GaN layer grown on the transitional layer.

According to another implementation, a method is provided for growing a bulk crystal structure. A GaN nucleation layer is grown on a substrate by HVPE. A transitional GaN layer is grown on the nucleation layer by HVPE. A bulk GaN layer is grown on the transitional GaN layer by HVPE.

According to another implementation, a method is provided for growing a bulk crystal structure, in which an AlN epitaxial layer is deposited on the substrate and the GaN nucleation layer is grown on the AlN epitaxial layer.

According to another implementation, a method is provided for growing a bulk crystal structure. A GaN nucleation layer is grown on a substrate by HVPE under nucleation layer growth conditions including a first growth temperature, a first ammonia partial pressure, a first V:III ratio, and a first growth rate. A transitional GaN layer is grown on the nucleation layer by HVPE under transitional layer growth conditions including a second growth temperature, a second ammonia partial pressure, a second V:III ratio, and a second growth rate, wherein at least one of the transitional layer growth conditions is changed from the corresponding nucleation layer growth condition. A bulk GaN layer is grown on the transitional GaN layer by HVPE.

According to another implementation, a method is provided for growing a bulk crystal structure, in which the transitional layer growth conditions are selected from the group consisting of the first growth temperature being increased to the second growth temperature, the first ammonia partial pressure being reduced to the second ammonia partial pressure, the first growth rate being reduced to the second growth rate, and two or more of the foregoing.

According to another implementation, a method is provided for growing a bulk crystal structure, in which the nucleation layer growth conditions produce a pitted nucleation layer surface, and the transitional layer growth conditions produce a transitional layer surface having a lesser percentage of pits than the pitted nucleation layer surface.

The present invention in other aspects generally relates to free-standing gallium nitride (Al, Ga, In)N articles and methods for making such articles.

According to one implementation, a method is provided for making a free-standing GaN substrate. An epitaxial nitride layer is deposited on a single-crystal substrate to form a nitride-coated substrate. A 3D nucleation GaN layer is grown on the epitaxial nitride layer by HVPE under a substantially 3D growth mode. A GaN recovery layer is grown on the 3D nucleation GaN layer by HVPE under a condition that gradually changes the growth mode from the substantially 3D growth mode to a substantially 2D growth mode. A bulk GaN layer is grown on the recovery layer by HVPE under the substantially 2D growth mode to form a GaN/substrate bi-layer. The GaN/substrate bi-layer is cooled from a growth temperature at which the bulk layer is grown to an ambient temperature, wherein GaN material of the bi-layer separates from the substrate to form a substantially crack-free free-standing GaN substrate.

According to another implementation, a method is provided for reproducibly growing a GaN single crystal by HVPE. A sapphire substrate is provided. An epitaxial AlN layer is deposited on the substrate. A GaN layer is grown on the AlN layer by HVPE, wherein the growth temperature is in the range between 900° C. and 1100° C., the growth rate in the range from about 50 microns per hour to about 500 micron per hours, and the V:III ratio is in the range between 10 and 100.

According to another implementation, a method is provided for preventing GaN microcracking during the growth of GaN single crystal film on a foreign substrate by HVPE. A substrate is processed wherein the substrate is ready for epitaxial GaN growth by HVPE. A first layer of epitaxial GaN is deposited by HVPE, wherein the first layer is grown in a 3D growth mode. A second layer of GaN is deposited on the first layer by HVPE under a growth mode selected from the group consisting of a 2D growth mode and a 3D growth mode.

According to another implementation, a free-standing GaN substrate is provided, which is produced according to any one of the foregoing methods.

The present invention in other aspects generally to high-quality gallium nitride (Al, Ga, In)N films and methods for making such films.

According to one implementation, a method for making a low-defect single-crystal gallium nitride (GaN) film is provided. An epitaxial aluminum nitride (AlN) layer is deposited on a substrate. A first epitaxial GaN layer is grown on the AlN layer by HVPE under a growth condition that promotes the formation of pits, wherein after growing the first GaN layer the GaN film surface morphology is rough and pitted. A second epitaxial GaN layer is grown on the first GaN layer to form a GaN film on the substrate. The second GaN layer is grown by HVPE under a growth condition that promotes filling of the pits, and after growing the second GaN layer the GaN film surface morphology is essentially pit-free.

According to another implementation, the GaN growth condition for growing the first GaN layer is selected from the group consisting of a higher growth rate than during growth of the second GaN layer, a lower growth temperature than during growth of the second GaN layer, a higher ammonia flow than during growth of the second GaN layer, and two or more of the foregoing.

According to another implementation, a low-defect single-crystal GaN film produced according to any of the above methods is provided.

According to another implementation, a low-defect single-crystal GaN film is provided. The GaN film has a characteristic dimension of about 2 inches or greater, and a thickness normal to the characteristic dimension ranging from approximately 10 to approximately 250 microns. The GaN film includes a pit-free surface. The threading dislocation density on the GaN film surface being less than $1 \times 10^8$ cm$^{-2}$.

According to another implementation, low-defect single-crystal gallium nitride (GaN) on substrate structure is provided. The structure includes a substrate, an epitaxial aluminum nitride (AlN) layer on the substrate, and a GaN film on the substrate. The GaN film includes a first epitaxial GaN growth layer and a second epitaxial GaN growth layer. The first epitaxial GaN layer is grown on the AlN layer under a growth condition that promotes the formation of pits, and after growing the first GaN layer the GaN film surface morphology is rough and pitted. The second epitaxial GaN is grown on the first GaN layer by HVPE under a growth condition that promotes filling of the pits formed, and after growing the second GaN layer the GaN film surface morphology is essentially pit-free.

According to any of the above implementations, the threading dislocation density on the GaN film surface is minimal. In one example, the threading dislocation density on the surface of the GaN film may be less than $1 \times 10^8$ cm$^{-2}$, in another example less than $5 \times 10^7$ cm$^{-2}$, in another example less than $1 \times 10^7$ cm$^{-2}$, and in another example less than $5 \times 10^6$ cm$^{-2}$.

According to any of the above implementations, the amount of bowing the GaN film on an underlying substrate is minimal. In one example, the bow of the GaN film may be less than about 200 microns. In another example, the bow of the GaN film may be less than about 100 microns. In another example, the bow of the GaN film may be less than about 50 microns. In another example, the bow of the GaN film may be less than about 25 microns.

According to any of the above implementations, the surface of the GaN film may have a root-mean square (RMS) surface roughness of about 0.5 nm or less.

The present invention in other aspects generally relates to large-area, inclusion-free, semi-insulating gallium nitride (Al, Ga, In)N articles and methods for growing such articles.

According to one implementation, a method is provided for making an inclusion-free uniformly semi-insulating GaN crystal. An epitaxial nitride layer is deposited on a single-crystal substrate. A 3D nucleation GaN layer is grown on the epitaxial nitride layer by HVPE under a substantially 3D growth mode, wherein a surface of the nucleation layer is substantially covered with pits and the aspect ratio of the pits is essentially the same. A GaN transitional layer is grown on the 3D nucleation layer by HVPE under a condition that changes the growth mode from the substantially 3D growth mode to a substantially 2D growth mode. After growing the transitional layer, a surface of the transitional layer is substantially pit-free. A bulk GaN layer is grown on the transitional layer by HVPE under the substantially 2D growth mode. After growing the bulk layer, a surface of the bulk layer is smooth and substantially pit-free. The GaN is doped with a transition metal during at least one of the foregoing GaN growth steps.

According to another implementation, an inclusion-free uniformly semi-insulating GaN crystal is provided, which is produced according to the foregoing method.

According to another implementation, a GaN/substrate bi-layer is formed according to the foregoing method. The GaN/substrate bi-layer is cooled from a growth temperature at which the bulk layer is grown to an ambient temperature, wherein GaN material of the bi-layer separates from the substrate to form a substantially crack-free free-standing GaN article.

According to another implementation, an inclusion-free uniformly semi-insulating free-standing GaN article is provided, which is produced according to the foregoing method.

According to another implementation, a method is provided for making an inclusion-free uniformly semi-insulating GaN substrate. A c-plane GaN seed substrate is provided. An epitaxial GaN boule is grown on the seed substrate by HVPE in a reactor. The growth mode is a substantially 2D growth mode and a surface of the growing GaN boule is smooth and pit-free. A volatile iron compound is flowed into the reactor. The GaN boule is sliced into a plurality of wafer blanks. The wafer blanks are polished to form a plurality of epi-ready GaN substrates.

According to another implementation, a semi-insulating GaN substrate is provided, in which the sheet resistance is uniformly greater than $1 \times 10^5$ ohm/square as measured with a non-contact eddy-current based sheet resistance mapping system such as the Lehighton method.

According to another implementation, a semi-insulating GaN substrate is provided, in which the resistivity is greater than about $1 \times 10^7$ ohm-cm.

According to another implementation, a semi-insulating GaN substrate is provided, in which the density of brown-spot inclusions is less than about 1 $cm^{-2}$.

The present invention in other aspects generally relates to high-quality gallium nitride (Al, Ga, In)N articles that include a polycrystalline GaN layer, and to methods for growing such articles.

According to one implementation, a method is provided for making a free-standing GaN article. An epitaxial nitride layer is deposited on a single-crystal substrate to form a nitride-coated substrate. A 3D nucleation GaN layer is grown on the epitaxial nitride layer by HVPE under a substantially 3D growth mode. A GaN transitional layer is grown on the 3D nucleation layer by HVPE under a condition that changes the growth mode from the substantially 3D growth mode to a substantially 2D growth mode. A bulk GaN layer is grown on the transitional layer by HVPE under the substantially 2D growth mode. A polycrystalline GaN layer is grown on the bulk GaN layer.

According to another implementation, a GaN article is provided, which is produced according to the foregoing method.

According to another implementation, the foregoing method is carried out to form a GaN/substrate bi-layer. The GaN/substrate bi-layer is cooled from a growth temperature at which the bulk layer is grown to an ambient temperature, wherein GaN material of the bi-layer cracks laterally and separates from the substrate to form a substantially crack-free free-standing GaN article.

According to another implementation, a free-standing GaN article is provided, which is produced according to the foregoing method.

Other aspects, features and embodiments of the invention will be more fully apparent from the ensuing disclosure and appended claims.

DETAILED DESCRIPTION

Figure 1:
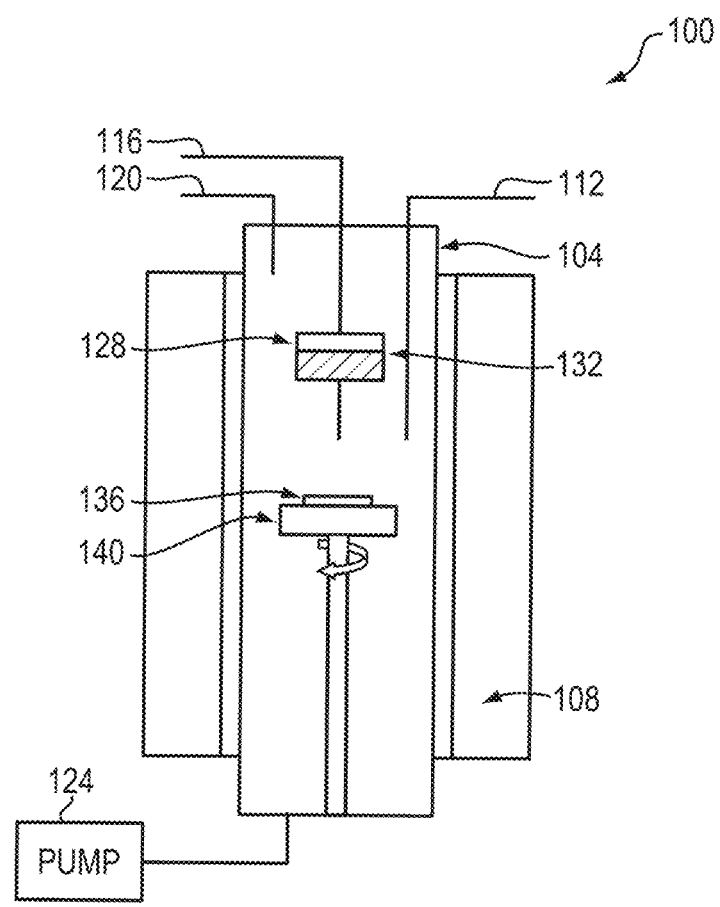
FIG. 1 is a schematic view of a vertical HVPE reactor.

Throughout the disclosure, unless specified otherwise, certain terms are used as follows. "Single crystalline film" or "single crystal" means a crystalline structure that can be characterized with x-ray rocking curve measurement. The narrower the peak of the rocking curve, the better the crystal quality. "Single crystal" does not necessarily mean that the whole crystal is a single grain; it may contain many crystalline grains with orientation more or less aligned. "Polycrystalline film" or "polycrystal" means that a crystal has many grains whose crystal orientations are randomly distributed. An X-ray rocking curve measurement of a polycrystalline film does not exhibit a peak. "Microcracks" are a cluster of localized cracks with high density of cracks. The distance between the parallel cracks in the microcrack cluster is typically less than 100 microns. "Growth cracks" are the cracks formed during crystal growth. "Cool down cracks" or "thermal cracks" are the cracks formed after the crystal growth and during the cooling of the crystal from the growth temperature to ambient or room temperature. "Pits" are typically inverse pyramidal pits on the crystal surface. "Pit-free surface" is a surface essentially having no pits on its surface. "2D growth mode" means that a growth surface remains planar and smooth during the growth. "3D growth mode" means that a growth surface develops non-planar, three-dimensional features such as pits during the growth. "Pitted surface morphology" means a surface having a substantial amount of pits on its surface. "Faceted surface morphology" means that a single crystal film surface is completely covered with pits so that the sides of the pits become the surface itself and the surface appears faceted. "Smooth surface morphology" means that a surface is specular and has no visual defects (such as pits). "Nucleation layer" in some implementations may be the layer first grown on a substrate. In other implementations, a "template layer" may be the layer first grown on a substrate. "Bulk layer" is where the majority of the crystal is grown. "V:III ratio" in some implementations is the ratio of the ammonia flow to the HCl flow used during a hydride vapor phase epitaxy GaN growth process. "Ammonia partial pressure" is calculated according to the ammonia flow, the total gas flow into a reactor, and the reactor pressure. "Growth surface" or "growing surface" or "growth front" is the surface of the crystal during the instance of the growth. "Front side" of a GaN substrate is the growth surface side. "Back side" of a GaN substrate is the side opposite to the front side. The c-plane GaN is a polar substrate, with one surface terminated with gallium (Ga-surface or Ga face) and the other surface is terminated with nitrogen (nitrogen-surface or nitrogen face). In this disclosure, the "front-side" of the c-plane single crystal GaN wafer is the Ga-face. "Semi-insulating" (SI) is defined as the resistivity measured at room temperature equal to or greater than $1 \times 10^5$ ohm-cm.

For purposes of the present disclosure, it will be understood that when a layer (or film, region, substrate, component, device, or the like) is referred to as being "on" or "over" another layer, that layer may be directly or actually on (or over) the other layer or, alternatively, intervening layers (e.g., buffer layers, transition layers, interlayers, sacrificial layers, etch-stop layers, masks, electrodes, interconnects, contacts, or the like) may also be present. A layer that is "directly on" another layer means that no intervening layer is present, unless otherwise indicated. It will also be understood that when a layer is referred to as being "on" (or "over") another layer, that layer may cover the entire surface of the other layer or only a portion of the other layer. It will be further understood that terms such as "formed on" or "disposed on" are not intended to introduce any limitations relating to particular methods of material transport, deposition, fabrication, surface treatment, or physical, chemical, or ionic bonding or interaction.

Unless otherwise indicated, terms such as "gallium nitride" and "GaN" are intended to describe binary, ternary, and quaternary Group III nitride-based compounds such as, for example, gallium nitride, indium nitride, aluminum nitride, aluminum gallium nitride, indium gallium nitride, indium aluminum nitride, and aluminum indium gallium nitride, and alloys, mixtures, or combinations of the foregoing, with or without added dopants, impurities or trace components, as well as all possible crystalline structures and morphologies, and any derivatives or modified compositions of the foregoing. Unless otherwise indicated, no limitation is placed on the stoichiometries of these compounds. Thus, the term "GaN" encompasses Group III nitrides and nitride alloys; that is, $Al_1Ga_yIn_zN$ ($x+y+z=1$, $0 \leq x \leq 1$, $0 \leq y \leq 1$, $0 \leq z \leq 1$), or (Al, Ga, In)N.

Large-area GaN substrates can be made by growing thick GaN films on foreign substrates, followed by separation of the film from the substrate. Prior art in U.S. Pat. Nos. 6,413,627; 6,468,347; 6,667,184; 6,693,021; 6,773,504; and 6,909,165 teaches methods for making a bulk GaN substrate by first growing a GaN film on a gallium arsenide (GaAs) substrate by hydride vapor phase epitaxy (HVPE) and subsequently removing the GaAs substrate by etching or grinding. Prior art in U.S. Pat. Nos. 6,440,823; 6,528,394; 6,596,079; 6,652,648; 6,750,121; 6,765,240; 6,923,859; and U.S. Pat. App. Pub. Nos. 2002/0068201; 2005/0103257; and 2005/0009310 teaches methods for making a bulk GaN substrate by first growing a GaN film on a sapphire substrate, followed by separating the grown GaN from the sapphire by, for example, laser-induced separation.

Single-crystal GaN films can be grown on sapphire substrates with various vapor phase growth techniques, such as molecular beam epitaxy (MBE), metal-organic vapor phase epitaxy (MOVPE), and hydride vapor phase epitaxy (HVPE). In the MBE and MOVPE growth of GaN films on sapphire, a low-temperature buffer layer is typically needed to grow high-quality GaN films. It is not clear whether a buffer layer is needed for HVPE GaN growth on sapphire. Lee in U.S. Pat. No. 6,528,394 discloses a specific method of pre-treatment for growing GaN on sapphire using HVPE. The pre-treatment involves etching sapphire with a gas mixture of hydrochloric acid (HCl) and ammonia ($NH_3$), as well as nitridation of the sapphire substrate. Molnar in U.S. Pat. No. 6,086,673 discloses the use of a zinc oxide (ZnO) pretreatment layer that was further reacted in the gaseous environment of HCl and/or $NH_3$. After this treatment of the sapphire substrate, single-crystal GaN film is then grown by HVPE. On the other hand, Vaudo et al. in U.S. Pat. No. 6,440,823 discloses the growth of a low defect density GaN layer on sapphire by an HVPE method, without using any buffer layers or nucleation layers.

Since teachings in the prior art regarding sapphire substrate treatment or initiation prior to HVPE GaN growth are in conflict, we systematically investigated the growth of gallium nitride film on sapphire using an HVPE process. Vertical HVPE reactors were used for the investigation. FIG. 1 schematically illustrates an example of a vertical HVPE reactor 100. The HVPE reactor 100 includes a quartz reactor tube 104 that is heated by a multi-zone furnace 108. The reactor tube 104 is connected to gas inlets 112, 116, and 120 for introducing reactants, carrier gases, and diluting gases. The reactor tube 104 is also connected to a pump and exhaust system 124. In some implementations, inside the reactor 100, gaseous hydrochloric acid (HCl) is flowed through a vessel 128 containing gallium metal 132, which is at a temperature of, for example, about 850° C. The hydrochloric acid reacts with the gallium metal 132, forming gaseous GaCl, which is transported by a carrier gas, such as nitrogen, to the deposition zone in the reactor tube 104. Ammonia ($NH_3$) and an inert diluent gas, such as nitrogen, are also flowed to the deposition zone where GaN crystals are deposited. The reactor 100 is designed such that the mixing of GaCl and $NH_3$ does not occur near the gas outlets, ensuring no deposition of GaN on the outlets of GaCl and $NH_3$ and enabling long-term stability of gas flow patterns. Epi-ready c-plane sapphire substrates or other suitable substrates 136 may be used. The substrate 136 is placed on a rotating platter 140 and heated to a temperature of, for example, 900-1100° C.

A typical deposition run process is as follows: (1) a substrate 136 is placed on the platter 140, (2) the reactor 100 is sealed, (3) the reactor 100 is evacuated and purged with high-purity nitrogen to remove any impurities from the system, (4) the platter 140 with the substrate 136 is raised to the deposition zone, (5) the platter temperature is controlled at the desired deposition temperature, (6) ammonia is flowed into the reactor 100, (7) HCl is flowed to the reactor 100 to start the GaN deposition, (8) deposition proceeds according to a predetermined recipe for a predetermined time, (9) the HCl and NH₃ gas flows are stopped, (10) the platter 140 is lowered and the grown crystal is gradually cooled down, and (11) the grown crystal is removed for characterization and further processing.

After systematically investigating the HVPE growth of GaN on sapphire substrates, we uncovered several issues that were not disclosed in the prior art, namely, (1) irreproducible nucleation of single-crystal GaN film on untreated sapphire substrate, (2) microcracking of single-crystalline GaN films, (3) fracture of the sapphire substrate during deposition of thick GaN crystals, and (4) instability of surface morphology during long GaN boule growth.

GaN Nucleation on Sapphire

First, we grew many HVPE GaN films directly on sapphire substrates without any buffer layer or pretreatment under the conditions taught by the prior art, i.e., growth temperature about 950-1050° C., V:III ratio (i.e., $NH_3/HCl$) of about 10-50, and growth rate of about 100 microns per hour. The bare sapphire substrate was heated up to the growth temperature, ammonia flow was turned on first to fill the reactor to a pre-determined partial pressure, and HCl flow was turned on to initiate the growth. After analyzing the grown GaN films with x-ray rocking curve and optical microscope, we determined that the GaN films grown directly on bare sapphire substrates were not single-crystalline films. In fact, they were polycrystalline GaN. We wish not to be bound by any particular theory regarding the various results of HVPE GaN crystal growth on sapphire, but the discrepancy in the various prior-art work and our own work may be related to particular reactor configurations or surface treatments. The prior art did not teach a reproducible method for growing single-crystal GaN films on sapphire substrates by HVPE.

There is a large lattice mismatch between sapphire and gallium nitride. Furthermore, c-plane GaN is a polar crystal, i.e., one face is terminated with gallium and the opposite face of the crystal is terminated with nitrogen. On the other hand, sapphire is not a polar crystal; the c-plane of sapphire is terminated with oxygen on both faces. In other GaN thin-film deposition techniques such as molecular beam epitaxy (MBE) or metal-organic vapor phase epitaxy (MOVPE), a thin buffer layer is required for high-quality single-crystalline GaN growth. The buffer layer may be an AlN layer (S. Yoshida et al., Appl. Phys. Lett., 42, 427 (1983); H. Amano et al, Appl. Phys. Lett. 48, 353 (1986)) or a GaN layer grown at low temperature (S. Nakamura, Jpn. J. Appl. Phys. 30. L1705 (1991)). Lee in U.S. Pat. No. 6,528,394 postulated formation of thin AlN layer on the sapphire surface by the pre-treatment step prior to HVPE GaN growth.

U.S. Pat. No. 6,784,085, the entire contents of which are incorporated by reference into the present disclosure, discloses a high-temperature reactive sputtering method for growing high-quality AlN film on sapphire substrate. Using this method, we coated sapphire substrates with AlN for use as substrates for HVPE GaN growth. High-quality GaN thin films were successfully and reproducibly grown on the AlN-coated sapphire substrate. The following examples compare HVPE GaN growth on bare sapphire substrates and on AlN-coated sapphire substrates.

Example 1

Single Crystal GaN Film Grown on AlN-Coated Sapphire

Figure 2:
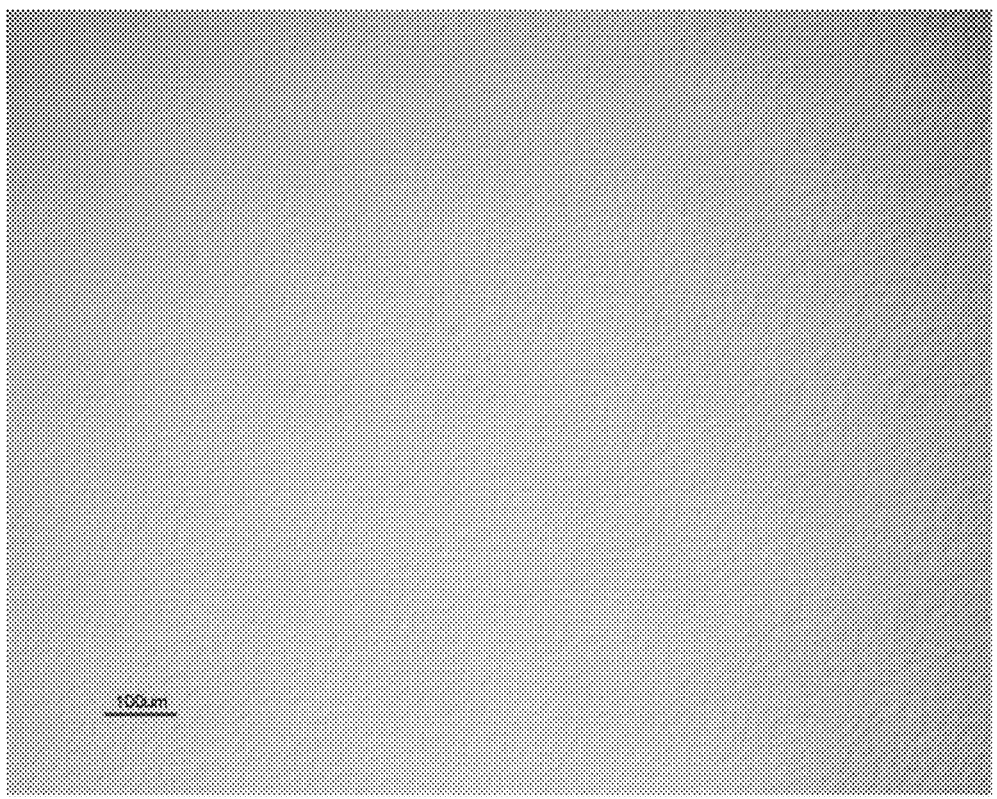
FIG. 2 is an optical micrograph at 50× magnification of the surface of a GaN film grown on an AlN-coated sapphire substrate under a typical HVPE GaN growth condition. The GaN film thickness was about 1 micron.

In this example, we used a 2" sapphire substrate. A thin layer of AlN film was sputter-grown on the sapphire substrate using the method disclosed in U.S. Pat. No. 6,784,085. The thickness of the AlN layer was about 0.5-1.5 microns. X-ray rocking curve measurement indicated the AlN film was epitaxial single-crystalline film with (0002) rocking curve full width at half maximum (FWHM) of 50 arcsec. The AlN-coated sapphire substrate was loaded into the HVPE reactor and a GaN film was grown using the aforementioned procedure. The growth rate was about 60 microns per hour, the GaCl partial pressure was about 3 (2.97) Torr, the NH₃ partial pressure was about 45 (44.6) Torr, the V:III ratio was about 15, and the growth temperature was about 950° C. as measured with a thermocouple under the platter. The growth time was 1 minute. The GaN film grown was transparent with a smooth specular surface. FIG. 2 shows an optical micrograph of the surface of the GaN film. FIG. 2 shows typical hillock surface morphology for HVPE GaN film. X-ray rocking curve measurement confirmed the single-crystalline nature of the GaN film, with a FWHM value of 297 arcsec.

Comparative Example 1

Polycrystalline GaN Film Grown on Bare Sapphire

Figure 3:
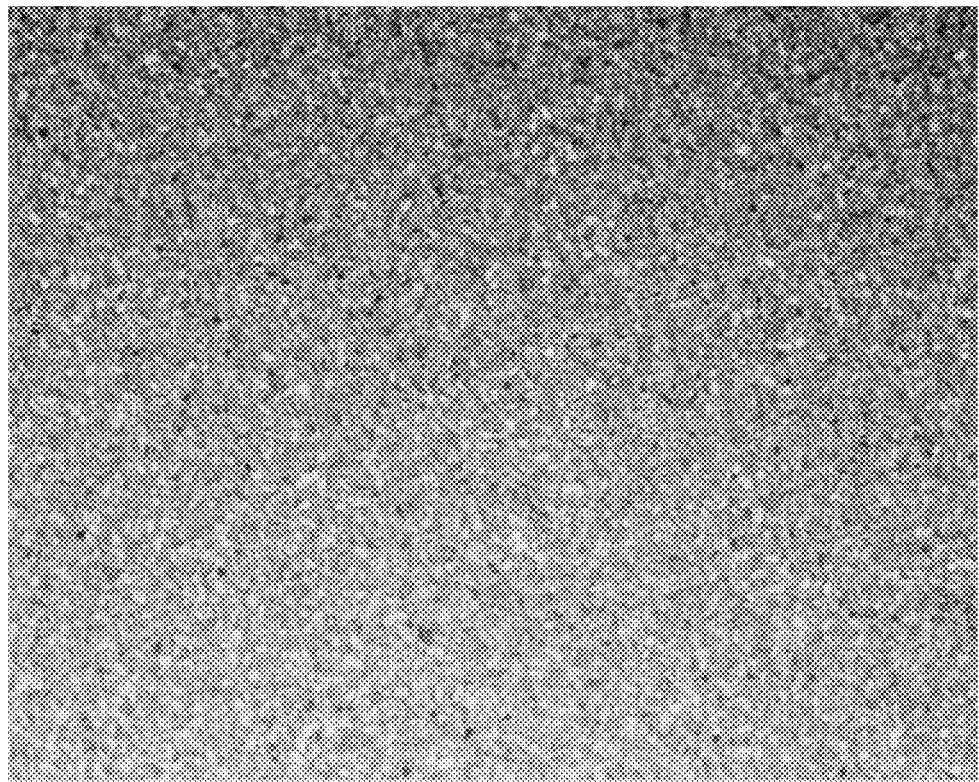
FIG. 3 is an optical micrograph of the surface of a GaN film grown on a bare sapphire without any pretreatment. The GaN film thickness was about 1 micron.

In this comparative example, we used a bare 2" sapphire substrate. The bare sapphire substrate was loaded into the HVPE reactor, and a GaN film was grown using the aforementioned procedure. No particular pre-treatment was performed on the sapphire substrate. The growth conditions were the same as the conditions used in Example 1: the growth rate was about 60 microns per hour, the GaCl partial pressure was about 3 Torr, the NH₃ partial pressure was about 45 Torr, the V:III ratio was about 15, and the growth temperature was about 950° C. The growth time was 1 minute. The GaN film was frost-like and not transparent. FIG. 3 shows an optical micrograph of the surface of the GaN film grown directly on the bare sapphire substrate. The surface is very rough, showing a multi-grained thin film. X-ray rocking curve measurement demonstrated that the GaN film grown on bare sapphire was polycrystalline.

GaN Film Microcracking

Figure 4:
FIG. 4 is an optical micrograph at 50× magnification of a GaN film, about 5 microns thick, grown on an AlN-coated sapphire substrate using an HVPE technique. Microcracking of the film is visible.
Figure 5:
FIG. 5 is an optical micrograph (Nomarski) of ~300 µm thick GaN film grown on an AlN-coated sapphire substrate using an HVPE technique under conditions for producing a smooth surface morphology. Out-of-focus cracks in the bulk of the material can be seen in the image.

After developing the nucleation of a GaN single-crystalline film on AlN sputter-coated sapphire substrates, we investigated the growth of thicker GaN films. We discovered a problem, namely, microcracking in the GaN films. The HVPE growth conditions were chosen to produce a smooth GaN surface. FIG. 4 shows an optical micrograph of thin GaN film about 5 microns thick on an AlN-coated sapphire substrate. The surface exhibits typical smooth HVPE GaN morphology with hillock features. However, microcracks in the GaN film are apparent. The sapphire substrate remains intact without any cracking in this case. Microcracking also occurs in thicker GaN films. For thicker films (~300-1000 µm) cracks can be seen intersecting the surface and below the surface of the film (FIG. 5). By focusing the microscope into the bulk of the film, different strata of cracks can be seen down to the sapphire substrate. The sapphire substrates were also cracked when the thick GaN films were grown.

Because of the difference between the coefficients of thermal expansion of the sapphire substrate and the GaN film, thermal stress builds up when the film cools down from the typical growth temperature of about 1000° C. to ambient room temperature. As discussed in open literature (for example, E. V. Etzkorn and D. R. Clarke, "Cracking of GaN Films," J. Appl. Phys., 89 (2001) 1025), sapphire substrate shrinks faster than GaN film during cool down, causing a compressive stress in the GaN film due to this thermal expansion mismatch. The compressive thermal stress in the GaN film should not cause microcracking in the GaN film during cool down. Therefore, the microcracks must be formed during the GaN growth and prior to cool down.

The microcracking of the GaN film during the growth suggests a tensile stress in the GaN film during the growth. We wish not be bound by any particular theory regarding the origin of microcracking during GaN growth. However, the tensile stress may be related to the AlN layer employed in the study, or may be related to the HVPE growth condition used, or may be universal to the HVPE GaN growth in general. While cracking is noted in some instances, most prior-art teachings in HVPE GaN growth do not disclose the formation of microcracks in GaN film during growth. The prior art also does not teach how to eliminate the microcracks during the HVPE GaN growth.

In order to eliminate the microcracks formed during the HVPE GaN growth, we systematically investigated GaN growth on the AlN-coated sapphire under various growth conditions by varying growth parameters such as GaCl flow or partial pressure (which may be determined by the flow of hydrochloric acid (HCl)), $NH_3$ flow or partial pressure, growth temperature, and associated variables such as growth rate and V:III ratio (e.g., $NH_3$/HCl ratio). In this example, the V:III ratio is the ratio of the $NH_3$/HCl flow. The growth rate is typically proportional to GaCl partial pressure, which is directly related to the HCl flow. We found that the surface morphology varies substantially with the growth temperature, growth rate, and ammonia partial pressure (or V:III ratio). If the "optimal" HVPE GaN growth condition is defined as the condition that yields a smooth, crack-free, thin GaN film (e.g., equal to or less than 3 microns thick) on the AlN-coated sapphire substrate, a thick GaN film (e.g., equal to or greater than 20 microns thick) grown under such "optimal" condition is microcracked. The GaN film, grown under a condition with higher growth temperature and/or lower V:III ratio than the "optimal" growth condition, has a higher density of cracking. On the other hand, the GaN film, grown under a condition with slightly lower growth temperature and/or higher V:III ratio, is crack-free but with macroscopic pits on the surface.

At a constant growth temperature and GaCl partial pressure, increasing $NH_3$ partial pressure dramatically alters the behavior of microcracking and surface morphology. For a constant growth time (similar film thickness, about 100 microns), the HVPE GaN surface morphology gradually changes from a smooth, hillocked morphology with microcracks at low $NH_3$ partial pressure, to a surface covered with pits at moderately high $NH_3$ partial pressure, and eventually to polycrystalline material at high $NH_3$ partial pressure. When the GaN film is covered with pits, microcracking during the growth may be eliminated. The following Examples 2-4 illustrate the effect of $NH_3$ partial pressure (V:III ratio) on the surface morphology.

Example 2

GaN Growth Under Low $NH_3$ Partial Pressure Conditions

Figure 6:
FIG. 6 is an optical micrograph for a GaN film grown under a low $NH_3$ partial pressure growth condition: a growth rate of 88 microns per hour, a growth temperature of 950° C., and a V:III ratio of 26. The film thickness was about 6 microns.

In this example, we grew a GaN film under a low $NH_3$ partial pressure condition (low V:III ratio). An AlN-coated 2" sapphire substrate was used. The AlN coated sapphire substrate was loaded into the HVPE reactor and a GaN film was grown using the aforementioned procedure. The growth rate was about 87.5 microns per hour, the GaCl partial pressure was about 0.73 Torr, the $NH_3$ partial pressure was about 19.5 Torr, the V:III ratio was about 26, and the growth temperature was about 950° C. The growth time was 5 minutes. The GaN film grown was transparent with a smooth surface. However, the GaN film was microcracked. FIG. 6 shows an optical micrograph of the surface of the GaN film, showing microcracking of the film. X-ray rocking curve measurement confirmed the single crystalline nature of the GaN film, with FWHM of 300 arcsec. The observed trend of microcracked films under low $NH_3$ partial pressure conditions was consistent over a range of growth rates and temperatures. The partial pressure of $NH_3$ required to prevent microcracking increased with increasing temperature.

Example 3

GaN Growth Under Moderate $NH_3$ Partial Pressure Conditions

Figure 7:
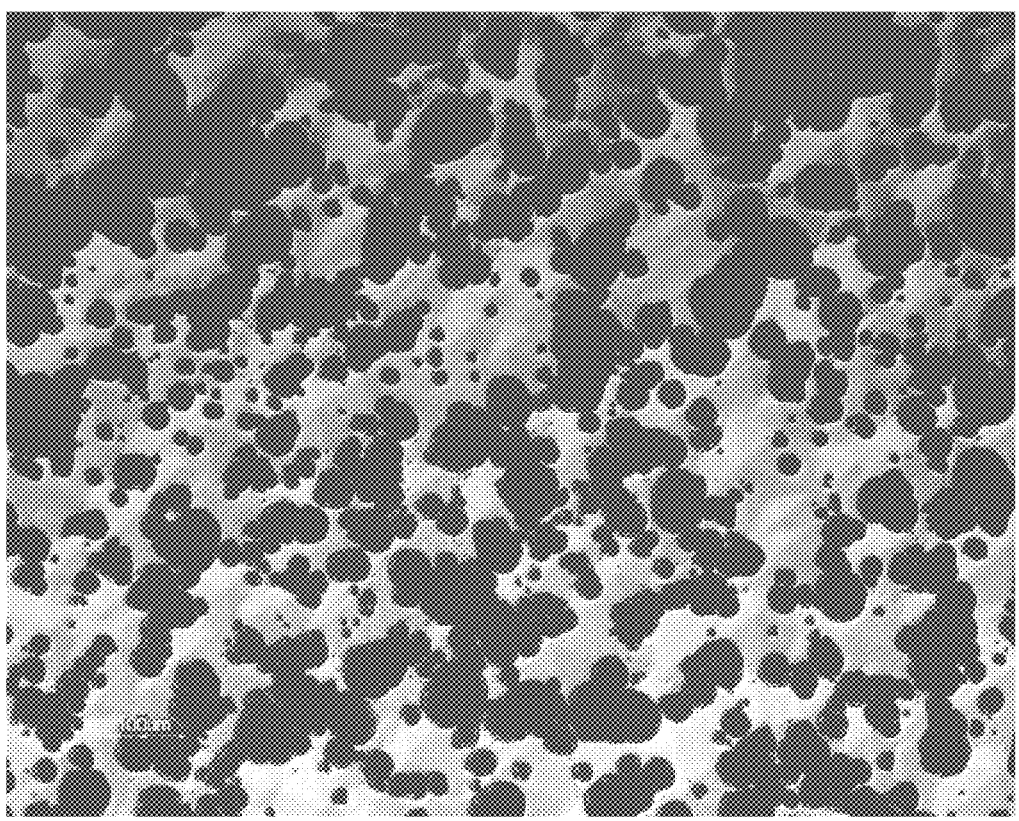
FIG. 7 is an optical micrograph at 50× magnification of a crack-free but pitted single-crystal GaN film grown on sapphire under a moderate $NH_3$ partial pressure growth condition: a growth rate of 320 microns per hour, a growth temperature of 990° C., and a V:III ratio of 58. The GaN film thickness was about 100 microns.

In this example, we grew a GaN film under a moderate $NH_3$ partial pressure condition (moderate V:III ratio). An AlN-coated 2" sapphire substrate was used. The AlN coated sapphire substrate was loaded into the HVPE reactor, and a GaN film was grown using the aforementioned procedure. The growth rate was about 320 microns per hour, the GaCl partial pressure was around 1.8 Torr, the $NH_3$ partial pressure was around 112.8 Torr, the V:III ratio was about 58, and the growth temperature was about 990° C. The growth time was 20 minutes. Under optical microscope examination, the GaN surface was covered with pits. FIG. 7 shows an optical micrograph of the surface of the GaN film. Although the GaN film surface is covered with pits, the film is still an epitaxial single-crystalline film, as confirmed by x-ray rocking curve measurement, with FWHM of 400 arcsec. The larger FWHM value of the film is due in part to curvature of the sample, which is known to broaden the X-ray diffraction peak.

Example 4

GaN Growth Under High $NH_3$ Partial Pressure Conditions

Figure 8:
FIG. 8 is an optical micrograph of a polycrystalline GaN film grown under a high $NH_3$ partial pressure growth condition: a growth rate of 320 microns per hour, a growth temperature of 990° C., and a V:III ratio of 75. The GaN film thickness was about 320 microns.

In this example, we grew a GaN film under a high $NH_3$ partial pressure condition (high V:III ratio). An AlN-coated 2" sapphire substrate was used. The AlN coated sapphire substrate was loaded into the HVPE reactor, and a GaN film was grown using the aforementioned procedure. The growth rate was about 320 microns per hour, the GaCl partial pressure was around 1.8 Torr, the $NH_3$ partial pressure was around 135 Torr, the V:III ratio was about 75, and the growth temperature was about 990° C. The growth time was 60 minutes. The GaN film grown was light-brown with a rough surface. FIG. 8 shows an optical micrograph of the surface of the GaN film, showing many grains. X-ray rocking curve measurement confirmed the film was polycrystalline.

Similar surface morphology trends are observed with growth temperature at otherwise constant conditions, or with growth rate at otherwise constant conditions. Under constant GaCl and $NH_3$ partial pressures (constant growth rate and V:III ratio), reducing the growth temperature alters the growth morphology from a smooth, hillocked structure to a pitted surface morphology and eventually to polycrystalline growth. Similarly, at a constant growth temperature and V:III ratio, increasing the growth rate (by increasing both GaCl and $NH_3$ partial pressure) alters the surface morphology from a smooth pit-free surface to a pitted surface and eventually to a polycrystalline morphology.

Figure 9:
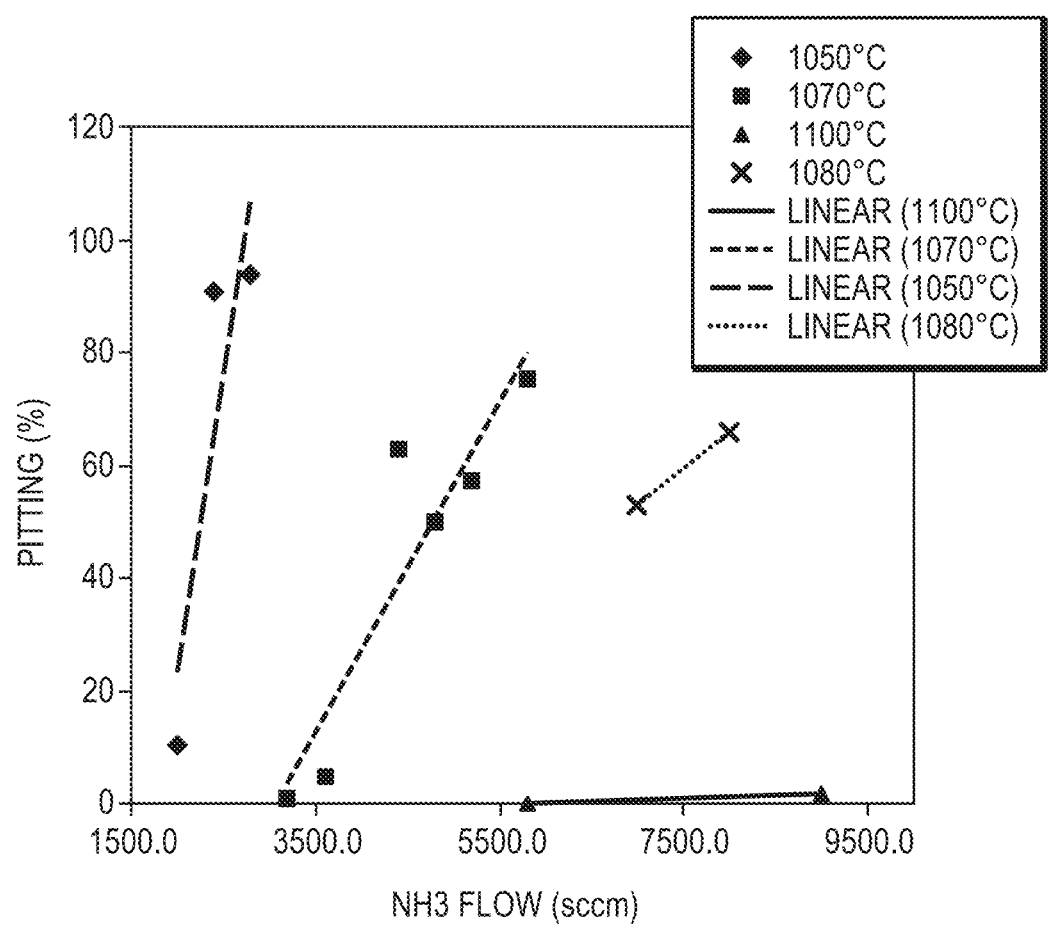
FIG. 9 is a graph showing pitting percentage, defined as the percentage of area covered with pits on GaN film, versus $NH_3$ flow, for growth temperatures between 1050° C. and 1100° C. The HCl flow rate was about 120 sccm, the growth rate was about 300 microns per hour, and the film thickness was about 100 microns.

Since the pitted surface morphology eliminates the microcracks in the GaN film during the growth, we extensively studied the growth conditions that could yield pitted morphology. Furthermore we defined a pitting percentage as the percentage of the surface area covered with pits. Typically, for a 100-micron thick GaN film grown under constant conditions on AlN-coated sapphire substrate, a pitting percentage greater than 30% in the GaN film eliminates the growth microcracks. We evaluated pitting percentage as a function of growth $NH_3$ partial pressure for several growth temperatures. FIG. 9 illustrates pitting percentage for 100-micron thick GaN films grown on AlN-coated sapphire substrates versus the $NH_3$ flow for furnace temperatures ranging from 1050° C. to 1100° C. The growth rate for this study was about 300 microns per hour and the film thickness was about 100 microns. At lower growth temperature, a slight change in $NH_3$ partial pressure leads to a large change in pitting percentage, whereas at higher growth temperature, a change in $NH_3$ partial pressure leads to a lesser change in pitting percentage. This indicates that growth morphology is more sensitive to the $NH_3$ partial pressure at lower temperature than at higher growth temperature.

Thick GaN Film GaN Growth

Figure 10A:
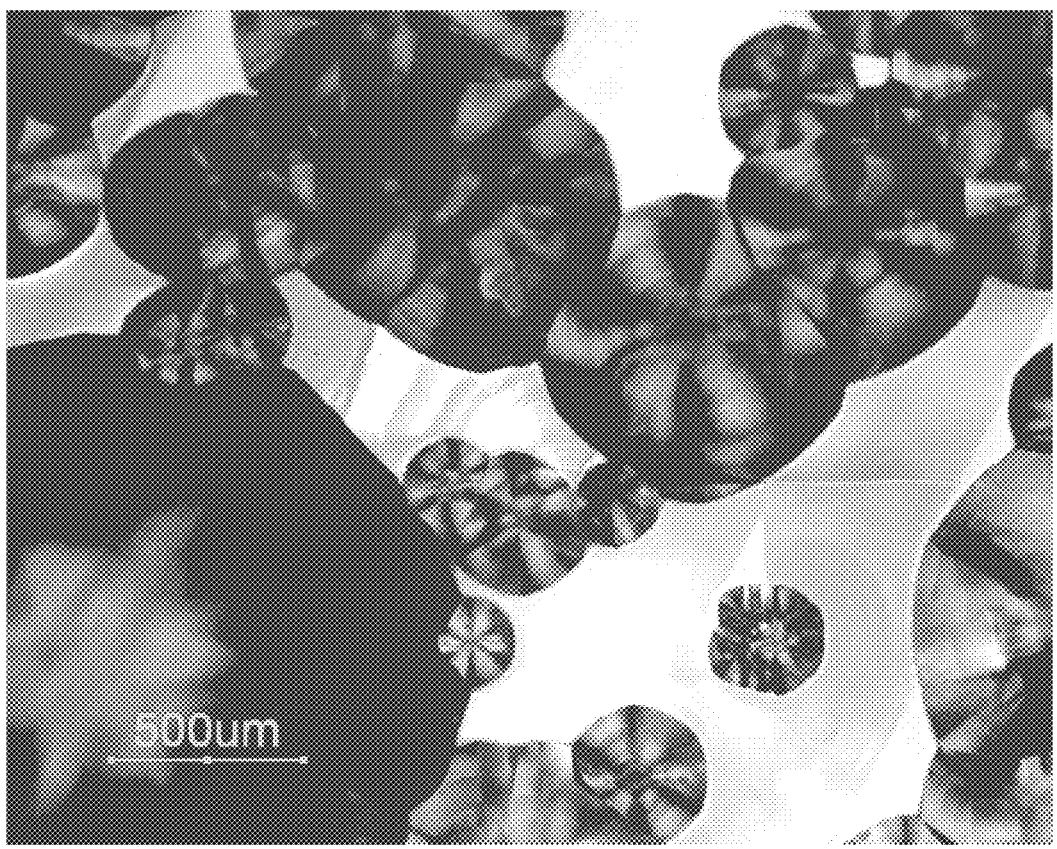
FIG. 10a is an optical micrograph of a 2.64 mm thick HVPE GaN film grown under pitted growth conditions, showing the surface covered with approximately 60% of pits.
Figure 10B:
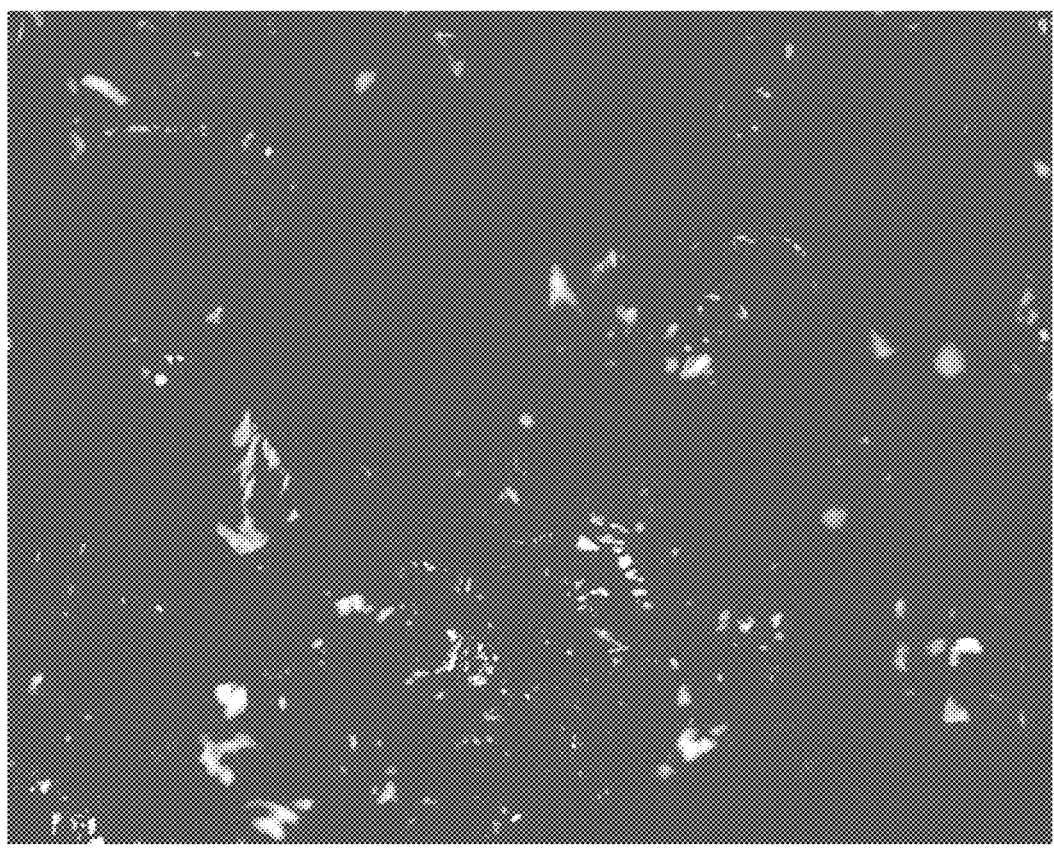
FIG. 10b is an optical micrograph of a 5.28 mm thick HVPE GaN film grown under pitted growth conditions, showing the surface is polycrystalline.

After discovering that HVPE GaN grown under conditions that yield pitted surface morphology eliminates the microcracks in GaN during the growth, we extended the growth time to grow thick films. However, we found that for most pitted growth conditions, extending the growth time leads to a gradual formation of polycrystalline material. FIG. 10a is optical micrograph of a 2.64 mm (2,640 micron) thick GaN film grown under a pitted growth condition (growth rate 110 microns per hour, growth time 24 hours, growth temperature around 940° C., and V:III ratio around 48). The HVPE GaN film is covered with approximately 60% of pits. FIG. 10b shows an optical micrograph of a GaN film grown under conditions identical to the film shown in FIG. 10a, but 24 hours longer. The surface material is polycrystalline material. A cross-sectional examination under optical microscope suggested that the GaN growth surface nucleated polycrystalline material at about 30 hours after growth. The prior art did not teach the growth morphology instability with longer growth and how to overcome it.

We developed several strategies to overcome the deterioration of GaN surface morphology during long HVPE GaN growth. We found that the size of the pits typically grows with the GaN growth time, and that the GaN growth surface eventually nucleates polycrystalline material. Since there are broad growth parameter (growth rate, growth temperature, ammonia partial pressure, and V:III ratio) windows that produce a pitted surface morphology, there may be conditions where the pit size does not grow with GaN growth time. We have systematically evaluated GaN growth with the pitted surface morphology. It is noted that the size of the various pits on the surface is not the same, and typically follows a normal distribution curve. Sometimes there are more than one pit size distribution for a film, for example, a distribution curve for smaller pits and a distribution curve for larger pits.

The experiments were performed in the following way. In the first stage of the growth, a pitted GaN layer was grown on AlN-coated sapphire substrate under the pitted condition for 1 to 4 hrs, depending on the growth rate. Then the growth conditions were changed at the second stage, and growth was allowed to proceed for additional time. The pit size and the growth rate of the pit size were analyzed. We found that pits formed in the first stage evolve during the second stage according to the growth condition of the second stage. The pits can be completely filled to form a pit-free GaN film in the second stage at the conditions of either higher growth temperature, or lower growth rate, or lower ammonia partial pressure, or a combination thereof. The pit size can be maintained or the pit size can be increased if the growth condition of the second stage is close to the condition of the first stage.

Figure 11:
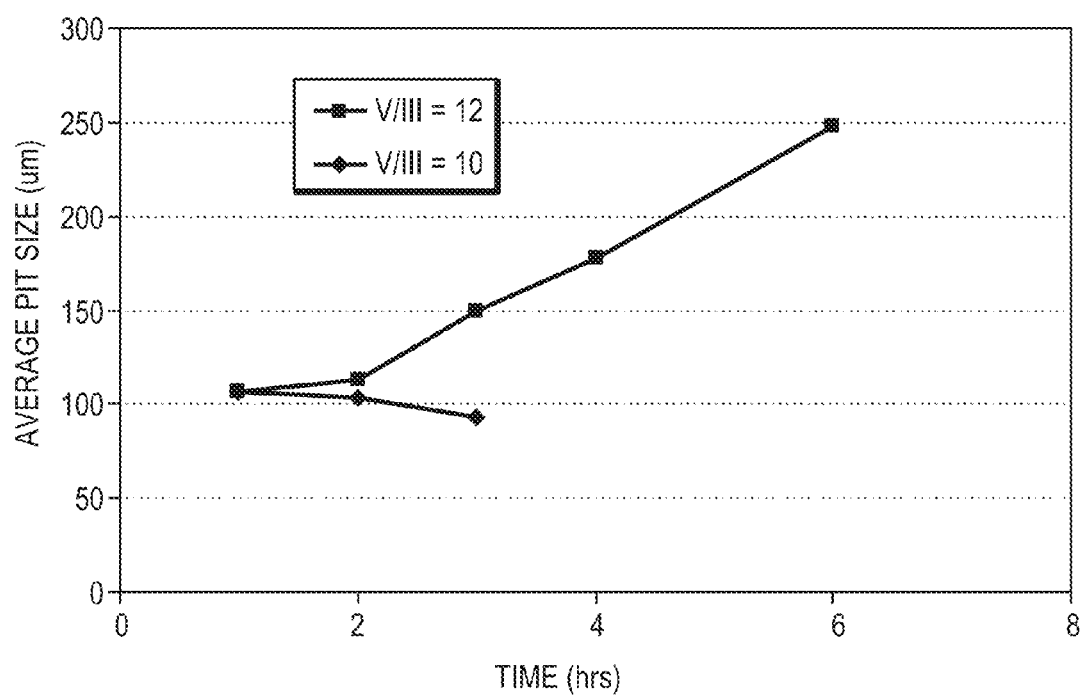
FIG. 11 is a graph showing pit size versus growth time for several growth conditions.

FIG. 11 shows pit size versus growth time for several growth conditions. Under a growth condition of growth rate of 320 microns per hour, V:III ratio of around 10, and growth temperature of 1000° C., the size of the pits was maintained or decreased slightly with longer growth time. Under another condition of growth rate of 320 microns per hour, V:III ratio of around 12, and growth temperature of 1000° C., the pit size increases linearly with growth time. The growth conditions discussed here are specific to the HVPE reactor used. The exact condition may differ if a different type of reactor configuration is used. However, the general trend should be similar.

Bulk GaN Crystal Growth

According to implementations of the invention, several methods for growing bulk GaN crystals on appropriate substrates will now be described. Generally, the methods involve several aforementioned aspects of HVPE GaN growth that were not taught in the prior art. First, to reproducibly nucleate GaN single crystalline film, certain implementations utilize a thin, epitaxial single-crystalline nitride layer (e.g., AlN) formed by high-temperature sputter growth. Second, to prevent microcracking of GaN film during HVPE growth, growth conditions are utilized that produce a pitted surface morphology. Third, multiple steps with different growth conditions are utilized to control the surface morphology during bulk crystal growth.

Bulk GaN crystal growth in some implementations generally includes three major stages: nucleation with a pitted surface morphology on a nitride-coated substrate or a bare substrate, transitioning the growth condition from the nucleation stage to the bulk growth stage, and bulk growth. Each stage may include one or more steps. The growth parameters in each step may be held constant or may be ramped or stepped.

Figure 12:
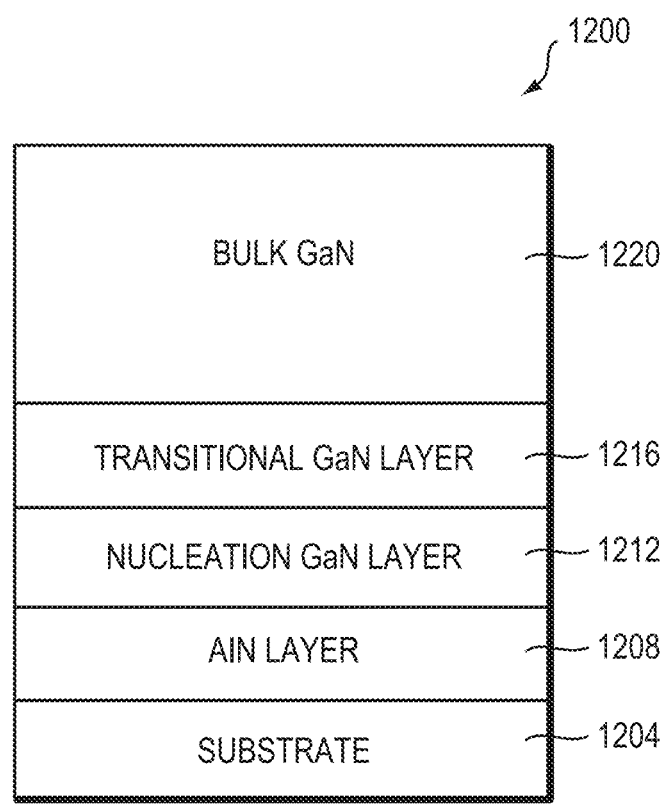
FIG. 12 is schematic view of a GaN crystal structure that includes a bulk GaN crystal grown on a substrate, showing different layers of the crystal structure.

FIG. 12 illustrates an example of a bulk crystal structure 1200 produced according to methods described in the present disclosure. The bulk crystal structure 1200 includes a substrate 1204, an epitaxial nitride layer 1208 such as a Group III nitride (e.g., AlN), a nucleation layer 1212 of GaN, a GaN transitional layer 1216, and a bulk GaN layer or crystal 1220. These different GaN layers 1212, 1216 and 1220 may be grown under different growth conditions. The purpose of the nucleation GaN layer 1212 is to prevent microcracking during the growth, and the purpose of the transitional GaN layer 1216 is to provide a stable surface morphology for the growing crystal for the bulk GaN crystal growth. The transition between different GaN layers 1212, 1216 and 1220 may be gradual, i.e., no distinct interface may exist between different GaN layers 1212, 1216 and 1220.

In some implementations, the substrate 1204 may have a characteristic dimension (e.g., diameter) of about 2 inches or greater. As further examples, the substrate 1204 may be about 3" or greater, about 4" or greater, or any other suitable size such as about 12" or greater. The substrate 1204 may be sapphire ($Al_2O_3$), although other suitable single-crystal substrates 1204 may be utilized. Non-limiting examples of suitable substrates 1204 include sapphire, silicon carbide, gallium arsenide, zinc oxide, silicon, spinel, lithium gallate, lithium aluminate, etc.

An epitaxial nitride thin film 1208 such as AlN may be deposited on the substrate 1204 with a suitable technique such as high-temperature sputtering, metal-organic vapor phase deposition, molecular beam epitaxy, hydride vapor phase epitaxy, or high-temperature annealing of the substrate 1204 in ammonia. In one example, the thickness of the AlN layer 1208 is in the range (ranges) from about 0.05 to about 10 microns. In another example, the thickness of the AlN layer 1208 is in the range from about 0.5 to 2 microns. In another example, the thickness of the AlN layer 1208 is in the range from about 0.5 to 1.5 microns. The AlN layer 1208 serves as a template for single-crystalline GaN film growth.

The purpose of the GaN nucleation layer 1212 is to prevent microcracking during subsequent growth. The thickness of GaN film 1212 grown during the nucleation stage may range from about 5 to about 100 microns. In other examples, the thickness ranges from about 10 to about 50 microns. The pitting percentage of the nucleation layer 1212, defined as the percentage of the surface covered with pits, may be greater than about 50%. In other examples, the pitting percentage is greater than about 75%. In other examples, the pitting percentage is greater than about 90%. The diameter of the pits in the nucleation layer 1212 may range from about 5 to about 50 microns. In other examples, the diameter of the pits ranges from about 10 to about 30 microns. The growth conditions for the nucleation stage are the conditions that preferentially produce a pitted surface morphology. Such conditions are, for example, higher growth rate, and/or higher ammonia flow, and/or lower growth temperature than the "optimal" thin-film growth condition that would produce smooth, substantially pit-free, crack-free thin films (e.g., with a thickness equal to or less than 3 microns), but would produce microcracked thick films (e.g., with a thickness equal to or greater than 20 microns). Example 1, given above, is an example of an optimized growth condition for a thin film. When growing a thin film (≤3 μm), this optimal" thin-film growth condition typically produces a crack-free film, whereas when growing a thick film (≥20 μm), the optimal" growth condition typically produces a microcracked film.

During the growth of the nucleation layer, the surface morphology of the growing GaN crystal is constantly evolving. For instance, the size of the pits may be increasing. For a given growth temperature, there is a preferred growth rate, ammonia partial pressure, V:III ratio and thickness to achieve the desired result. As an example, for a growth temperature of 940° C., the growth rate for nucleation may be approximately 190-200 μm/hr at a V:III ratio of around 17-18. In this case, a thickness of 15-20 μm has been shown to result in the desired outcome. As another example, for a growth temperature of 980° C., the growth rate for nucleation may be approximately 250 μm/hr at a V:III ratio of about 50, for which a thickness of 25-30 μm has shown similar results. If the GaN film continues to grow under the nucleation growth condition, the GaN film will eventually become polycrystalline. The specific conditions for the optimal nucleation may be different if a different reactor geometry is employed.

In one implementation, the growth temperature in the nucleation stage ranges from about 900° C. to about 1000° C., the V:III ratio in the nucleation stage ranges from about 10 to about 100, and the growth rate in the nucleation stage ranges from about 50 μm/hr to about 500 μm/hr. In some implementations, one or more of these growth conditions remain constant or substantially constant, at a value or values of a corresponding one of the foregoing ranges, during the nucleation stage. In other implementations, one or more of these growth conditions is varied (e.g., stepped or ramped) within values of a corresponding one of the foregoing ranges during the nucleation stage.

The purpose of the GaN transitional layer 1216 is to change the growth morphology from a highly pitted nucleation to a morphology that is stable with growth time. The transitional layer 1216 may be grown under a different growth condition that gradually changes the surface morphology of the growing GaN crystal from a much pitted surface to a less pitted surface. The stable morphology may be pit-free textured morphology, or may still be a pitted surface with growth conditions that do not increase the size of pit with longer growth, or may be a mostly faceted surface wherein the facets are the sidewalls of the pits. In some implementations, the density of the pits is gradually reduced during the growth of the transitional GaN layer 1216. In one example, the thickness of the transitional layer 1216 may range from about 50 to about 1000 microns (or about 0.05 to about 1 mm).

In one implementation, the surface morphology of the growing GaN crystal during growth of the transitional layer 1216 is evolved from a much pitted surface of the nucleation layer 1212 to a substantially pit-free surface. This evolution of the surface morphology of the growing GaN crystal during growth of the transitional GaN layer 1216 is accomplished by changing the growth conditions from a pitted growth condition to a less pitted growth condition. This can be achieved by increasing the growth temperature, and/or by reducing $NH_3$ partial pressure, and/or by reducing the growth rate. The growth parameters during the transition layer growth may be stepped or ramped. The morphology of the growing crystal is evolving during the growth of the transitional layer 1216.

In one implementation, the growth temperature in the transitional stage ranges from about 920° C. to about 1100° C., the V:III ratio in the transitional stage ranges from about 8 to about 80, and the growth rate in the transitional stage ranges from about 50 μm/hr to about 550 μm/hr. In some implementations, one or more of these growth conditions remain constant or substantially constant, at a value or values of a corresponding one of the foregoing ranges, during the transitional stage. In other implementations, one or more of these growth conditions is varied (e.g., stepped or ramped) within values of a corresponding one of the foregoing ranges during the transitional stage.

The bulk growth layer 1220 is grown on the transitional layer 1216, and is where the most GaN crystal is grown. In some implementations, the surface morphology of the growing GaN crystal does not change substantially during the bulk growth step. The growth condition is chosen based on the criteria that GaN surface morphology does not deteriorate during the long growth. In some examples, the bulk growth layer 1220 is thicker than about 1 mm. In other examples, the bulk growth layer 1220 is thicker than about 2 mm. In other examples, the bulk growth layer 1220 is thicker than about 5 mm. In other examples, the bulk growth layer 1220 is thicker than about 1 cm. In other examples, the bulk growth layer 1220 is thicker than about 2 cm. In other examples, the bulk growth layer 1220 is thicker than about 5 cm. The growth conditions may be kept constant during the bulk growth stage. Alternatively, the growth conditions may be slightly ramped in order to compensate for any local growth chemistry change associated with parasitic GaN deposition on the reactor wall, temperature changes, or other changes in the growth environment during growth.

In some implementations, the surface morphology of the bulk layer 1220 during the bulk growth stage may be smooth and essentially pit-free. The transition layer 1216 in this case completely eliminates the pits. The bulk growth conditions chosen maintain such morphology throughout the bulk layer growth.

Figure 13:
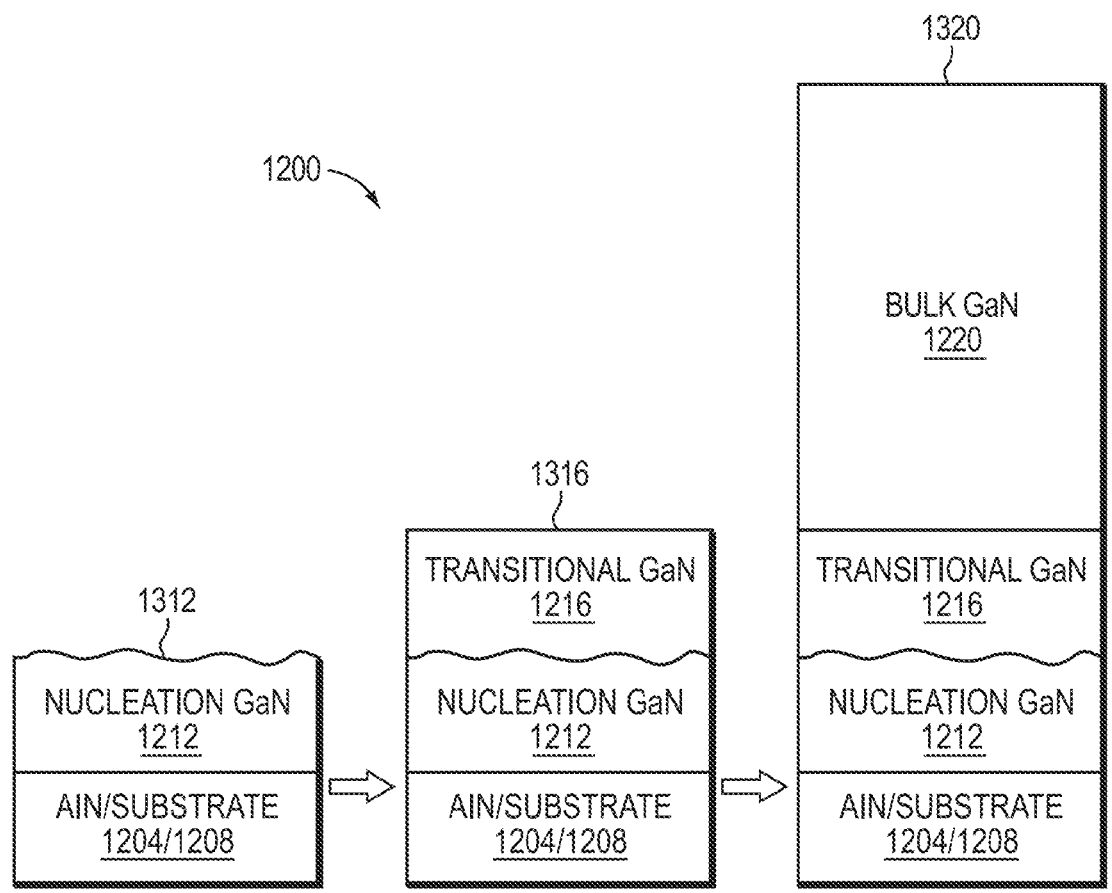
FIG. 13 illustrates an evolution of GaN surface morphology during the various steps of bulk GaN crystal growth on a substrate according to an implementation of the present invention. The surface of the growing GaN crystal during the bulk growth retains a pit-free smooth morphology.

FIG. 13 illustrates an evolution of GaN surface morphology (cross-section) during the various steps of GaN bulk crystal growth on the substrate 1204 according to this embodiment. After the growth of the nucleation GaN layer 1212, the surface 1312 of the nucleation GaN layer 1212 is pitted. During the growth of the transitional GaN layer 1216, the pit size and pit density on the growing GaN crystal surface is gradually reduced. After the growth of the transitional layer 1216, the pits are eliminated and a pit-free surface 1316 is formed. During the bulk growth step, this pit-free surface morphology is maintained, as illustrated by the pit-free surface 1320 of the bulk layer 1220 in this example.

In other implementations, the surface morphology of the bulk layer 1220 during growth may have some pits. The growth conditions may be chosen to maintain the pit size throughout the bulk layer growth.

In other implementations, the surface morphology of the bulk layer 1220 during the growth may be completely faceted. These facets are formed via the growth and coalescence of pits during the transitional layer growth. In this case, the surface morphology of the growing GaN crystal during the transitional layer growth is evolved from the nucleation layer growth with a high density of small pits to a surface with a smaller density of the larger pits. At the end of the transitional layer growth, the surface may be almost completely covered with the pits. The surface mostly comprises various facets of the pits, and this surface is called a faceted surface. The facets of the pits typically have crystal planes of (10-11), (10-12), (11-21), (11-22) and other planes. During the bulk growth, these facets are maintained. The growth conditions chosen prevent nucleation of polycrystalline grains at the bottom of the pits, and also maintain the faceted surface morphology.

Figure 14:
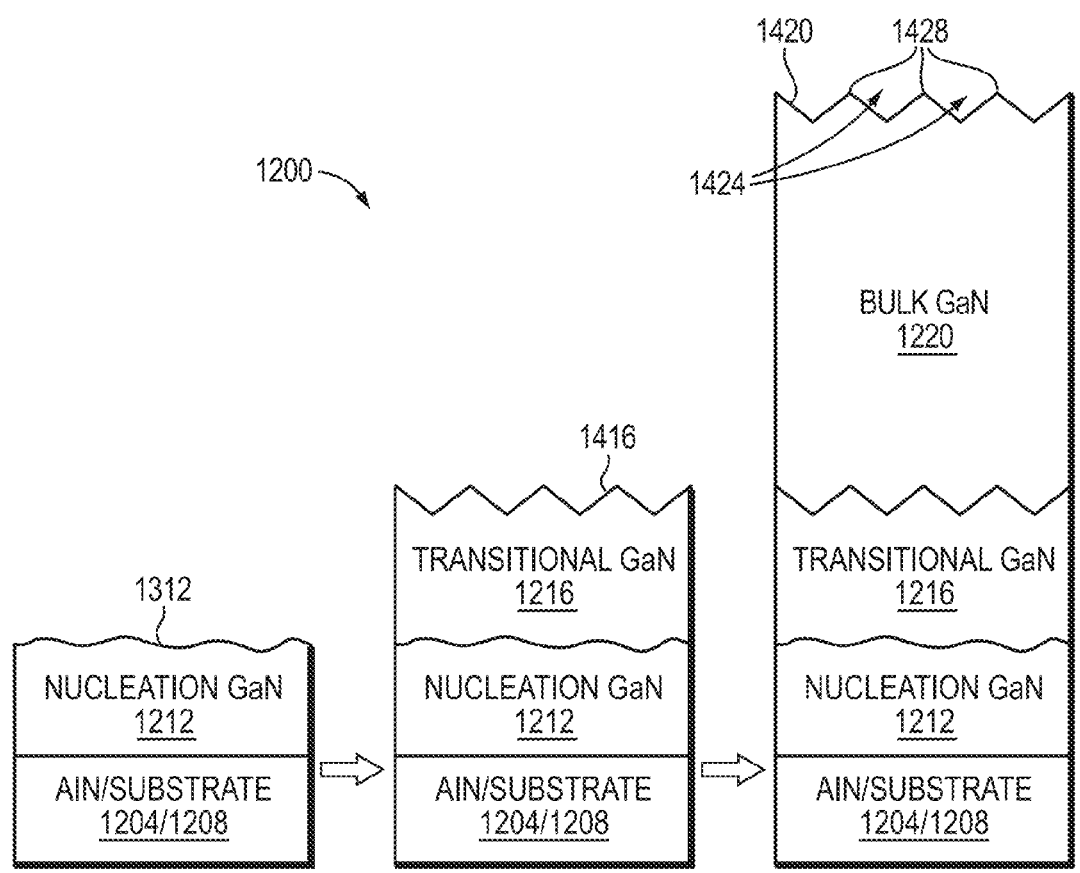
FIG. 14 illustrates an evolution of GaN surface morphology during the various steps of bulk GaN crystal growth on a substrate according to another implementation of the present invention. The surface of the growing GaN crystal during the bulk growth remains faceted.

FIG. 14 illustrates the evolution of the surface morphology during the growth according to this example. After the growth of the nucleation layer 1212, the surface 1312 is covered with high density of small pits. During the growth of the transitional GaN layer 1216, some small pits are gradually filled, some pits coalesce, and some pits grow larger. After the growth of the transitional layer 1216, the pits are coalesced and grown, forming a faceted surface morphology 1416. During the bulk growth, the faceted surface morphology is maintained, as illustrated by the faceted surface 1420 of the bulk layer 1220 in this example. The spacing between facets 1424, defined as the distance between ridges 1428, may be less than 2 mm. In other examples, the spacing is less than 1 mm. In other examples, the spacing is in the range from about 0.5 to about 2 mm.

In one implementation, the growth temperature in the bulk growth stage ranges from about 950° C. to about 1100° C., the V:III ratio in the bulk growth stage ranges from about 5 to about 50, and the growth rate in the bulk growth stage ranges from about 50 µm/hr to about 500 µm/hr. In some implementations, one or more of these growth conditions remain constant or substantially constant, at a value or values of a corresponding one of the foregoing ranges, during the bulk growth stage. In other implementations, one or more of these growth conditions is varied (e.g., stepped or ramped) within values of a corresponding one of the foregoing ranges during the bulk growth stage.

In some implementations, during the bulk growth, no impurity is introduced and all the gas sources are purified in order to achieve high-purity GaN crystals. In some examples, the impurity concentration in the high-purity GaN layer 1220 is less than about $10^7$ cm$^{-3}$. In other examples, the impurity concentration is less than about $10^{16}$ cm$^{-3}$. In other examples, the impurity concentration is less than about $10^{15}$ cm$^{-3}$.

Alternatively, in other implementations, during the bulk growth, n-type impurities, such as silicon (introduced, for example, as silane) or oxygen, are introduced to produce n-type GaN crystals. The introduction of impurities may occur at any stage of the GaN growth. It will be understood that the growth conditions may be slightly different when n-type doping is introduced. In some examples, the electron concentration in the n-type bulk GaN layer 1220 is greater than about $10^{17}$ cm$^{-3}$. In other examples, the electron concentration is greater than about $10^{18}$ cm$^{-3}$. In other examples, the electron concentration is greater than about $10^{19}$ cm$^{-3}$. In some examples, the resistivity of the n-type GaN layer 1220 is less than about 0.1 ohm-cm. In other examples, the resistivity is less than about 0.01 ohm-cm. In other examples, the resistivity is less than about 0.001 ohm-cm.

In other implementations, the bulk GaN crystal may be p-type doped by introducing p-type impurities such as magnesium (Mg). Mg may be introduced as a metal-organic compound. Mg may also be introduced as Mg vapor by heating Mg metal in a quartz enclosure and carrying the Mg to the deposition zone by carrier gas. It will be understood that the growth conditions may be slightly different when p-type doping is introduced. In some examples, the hole concentration in the p-type bulk GaN layer 1220 is greater than about $10^{17}$ cm$^{-3}$. In other examples, the hole concentration is greater than about $10^{18}$ cm$^{-3}$. In other examples, the hole concentration is greater than about $10^{19}$ cm$^{-3}$. In some examples, the resistivity of the p-type GaN layer 1220 is less than about 0.1 ohm-cm. In other examples, the resistivity is less than about 0.01 ohm-cm. In other examples, the resistivity is less than about 0.001 ohm-cm.

In other implementations, the bulk GaN crystal can also be made into a semi-insulating (SI) material by introducing a deep-level acceptor. Transition metals, such as iron, cobalt, nickel, manganese, and zinc, are deep-level acceptors. The transition metal may be introduced to the deposition zone either via a metal-organic or metal-chloride compound formed by reacting, for example, iron metal with hydrochloric acid. When iron is used as a deep-level acceptor, gaseous ferrocene may be introduced into the HVPE reactor. It will be understood that the growth conditions may be slightly different when transitional metal doping is introduced. The concentration of the transition metal in the bulk GaN layer 1220 may range from about $10^{16}$ to about $10^{20}$ cm$^{-3}$. In other examples, the concentration of the transition metal ranges from about $10^{17}$ to about $10^{19}$. In other examples, the concentration of the transition metal is around $10^{18}$ cm$^{-3}$. The resistivity of the SI bulk GaN layer 1220 at room temperature may be greater than about $10^6$ ohm-cm. In other examples, the resistivity is greater than about $10^7$ ohm-cm. In other examples, the resistivity is greater than about $10^8$ ohm-cm.

After the growth of bulk GaN crystal on the substrate 1204, the crystal may be cooled to ambient temperature. The bulk crystal may be ground to form a desired size such as about 2 inches or greater, or in some specific examples, about 2", about 3", about 4", about 6", about 8", or about 12" with major and minor flats. Subsequently, the ground boule may be sliced into multiple wafers via a wire saw or other suitable technique. The substrate 1204 and the nucleation layer GaN material 1212 may be discarded. In some examples, the substrate 1204 delaminates from the bulk GaN crystal. Whether the substrate 1204 is attached to the bulk crystal or not, the wafering process may be the same.

Prior to slicing the bulk GaN crystal into multiple wafers, the crystal may be orientated into a specific crystallographic orientation. The GaN wafers may be a vicinal plane of a regular crystallographic plane. The GaN wafers may be, for example, C-plane, or A-plane, or M-plane, or (10-1n) (n=1, 2, 3, 4, 5) family of planes, or (11-2n) (n=1, 2, 3, 4, 5) family of planes. Because of the rotational symmetry of the GaN crystal, each (10-1n) plane and (11-2n) plane represent a group of six similar planes.

The sliced GaN wafers may be mechanically polished to a specified wafer thickness. To remove the subsurface damage, the wafer may be chemically mechanically polished as the last step. Reactive ion etching or inductively coupled plasma etching may also be used to remove the damaged surface layer. Other suitable surface finishing techniques may alternatively or additionally be employed.

The GaN wafers produced according to embodiments of the present invention are of high crystalline quality. Crystal quality can be measured with x-ray diffraction such as rocking curve measurement. The full width at half maximum (FWHM) for the GaN(0002) reflection may be less than 300 arcsec. In other examples, the FWHM is less than 200 arcsec. In other examples, the FWHM is less than 100 arcsec. In other examples, the FWHM is less than 50 arcsec. In some examples, the microscopic crystalline defects, and, specifically, the average dislocation density of the GaN wafer is less than about $10^7$ $cm^{-2}$. In other examples, the dislocation density is less than about $10^6$ $cm^{-2}$. In other examples, the dislocation density is less than about $10^5$ $cm^{-2}$. In other examples, the dislocation density is less than about $10^4$ $cm^{-2}$. In other examples, the dislocation density is less than about $10^3$ $cm^{-2}$.

Certain implementations of the present invention may be further understood by following illustrative, non-limiting examples.

Example 5

Semi-Insulating GaN Boule Growth

In this example, we illustrate a semi-insulating GaN boule. Sapphire was used as the starting substrate. Using the sputtering method disclosed in U.S. Pat. No. 6,784,085, an AlN layer approximately 0.7 μm thick was grown on the sapphire substrate for use as a nucleation layer for the HVPE GaN growth. X-ray diffraction was used to verify the AlN film was single crystal. The AlN/sapphire structure was loaded into the previously described vertical HVPE system 100 (FIG. 1) and the GaN growth was commenced.

Figure 15:
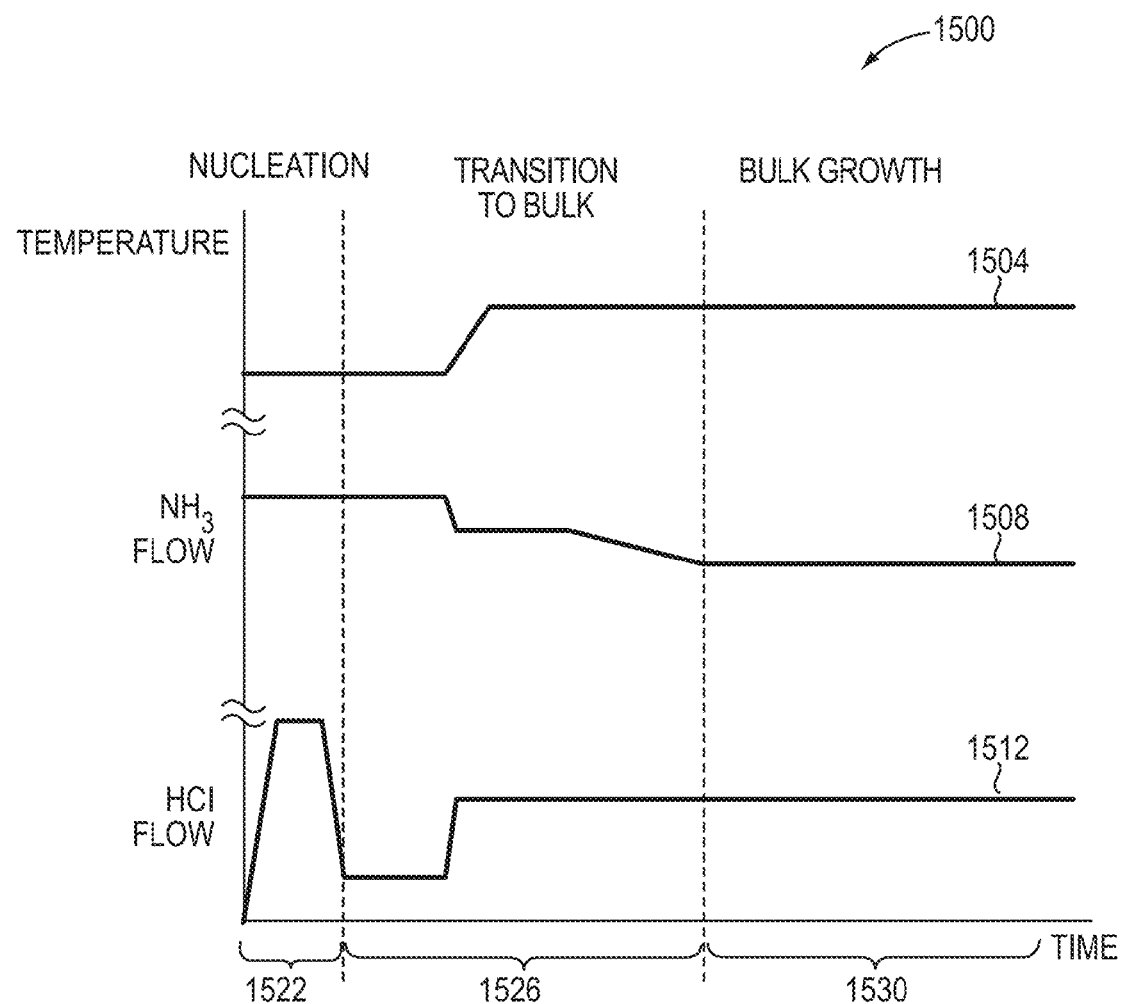
FIG. 15 is an illustration of an example of a process for growing a semi-insulating bulk GaN crystal, including the temperature, $NH_3$ flows, and HCl flows for the nucleation, transition, and bulk growth stages.

FIG. 15 is an illustration of an example of a process 1500 for growing the semi-insulating bulk GaN substrate or boule, including the temperature 1504, $NH_3$ flows 1508, and HCl flows 1512 for the nucleation stage 1522, transition stage 1526, and bulk growth stage 1530. The bulk growth process 1500 included a nucleation step 1522 on the AlN-coated sapphire substrate with a rough surface morphology, transitioning 1526 the growth condition from the nucleation stage 1522 to the bulk growth stage 1530, and bulk growth 1530.

The nucleation layer consisted of an 18 μm thick layer with a pitted morphology, grown at higher growth rate and lower growth temperature than the bulk layer. The growth rate for the nucleation layer was around 225 microns per hour, the growth time was around 5 minutes, the growth temperature was around 955° C., and the V:III ratio was around 15.

The transition to the bulk growth consisted of two layers. The first layer of about 7 μm thick was grown at a much reduced growth rate, resulting in a slightly less pitted morphology than the initial nucleation layer. The growth rate was around 50 microns per hour, the growth time was around 8 minutes, the growth temperature was around 955° C., and the V:III ratio was around 60. The second transition layer consisted of a layer approximately 800 μm thick, which resulted in a surface nominally free of growth pits. The growth rate was around 100 microns per hour, the growth time was around 8 hours, and the growth temperature was around 970° C. During growth of the transition layer, the ammonia flow (and thus V:III ratio) was gradually reduced to achieve the desired conditions for bulk growth. The initial V:III ratio was around 28 and was reduced over the course of approximately four hours to a value around 16. Additionally, during growth of the transition layer, ferrocene was introduced into the growth reactor to incorporate iron as a compensating impurity and achieve semi-insulating behavior. The iron concentration was approximately $1\times10^{18}$ $cm^{-3}$. The ferrocene flow was held constant during the remainder of the growth of both the transition layer and the bulk layer.

Following the transition layer, the bulk growth layer was grown. The bulk layer was grown for at least 24 hours at the growth conditions at the end of the transition layer. Depending on the final growth rate and temperature, the $NH_3$ flow or the temperature or the growth rate or some combination of the three were adjusted to prevent either pitting or microcracking from developing.

Figure 16:
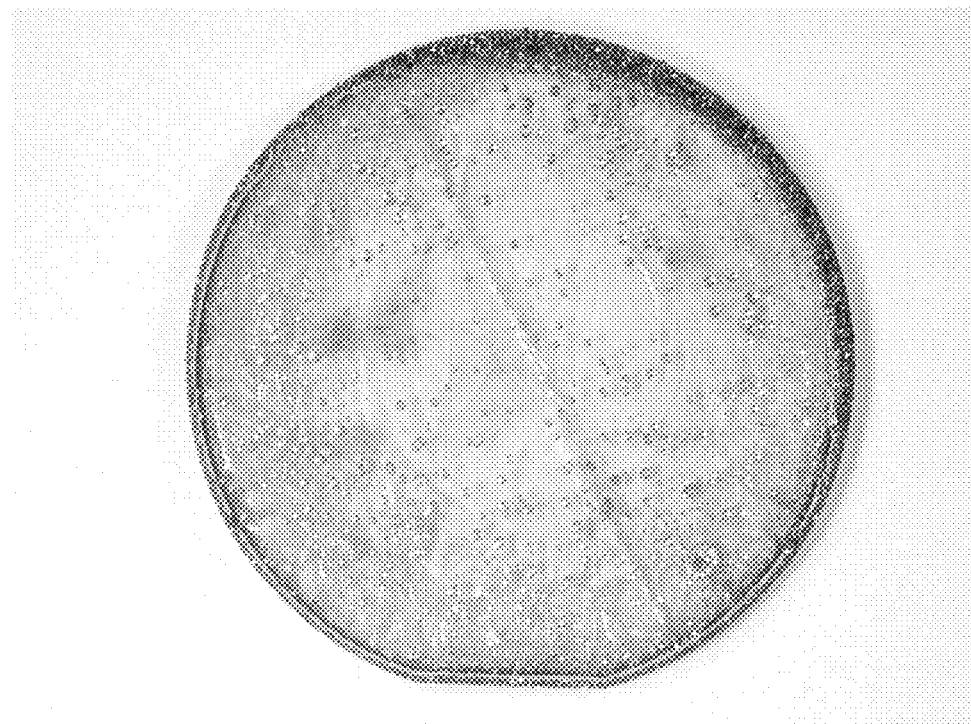
FIG. 16 is an optical image of a 3" GaN substrate or boule grown with the semi-insulating growth scheme.

After completion of the growth sequence, the resulting GaN/sapphire bi-layer was cooled to room temperature at a cooling rate of approximately 6° C. per minute. During the cooling process, the sapphire substrate completely delaminated from the GaN/sapphire bi-layer forming a freestanding GaN substrate or boule. The GaN substrate in this example was 3 inches in diameter and the thickness of the substrate was about 3.6 mm. FIG. 16 is an optical picture showing the top view of the GaN substrate obtained in this example. The surface of the boule still had a few pits. The GaN boule was sliced into 4 slices, and polished to a mirror finish to remove the pits. The wafers were further subjected to a chemical mechanical polishing step that eliminated surface and subsurface damage.

Figure 17:
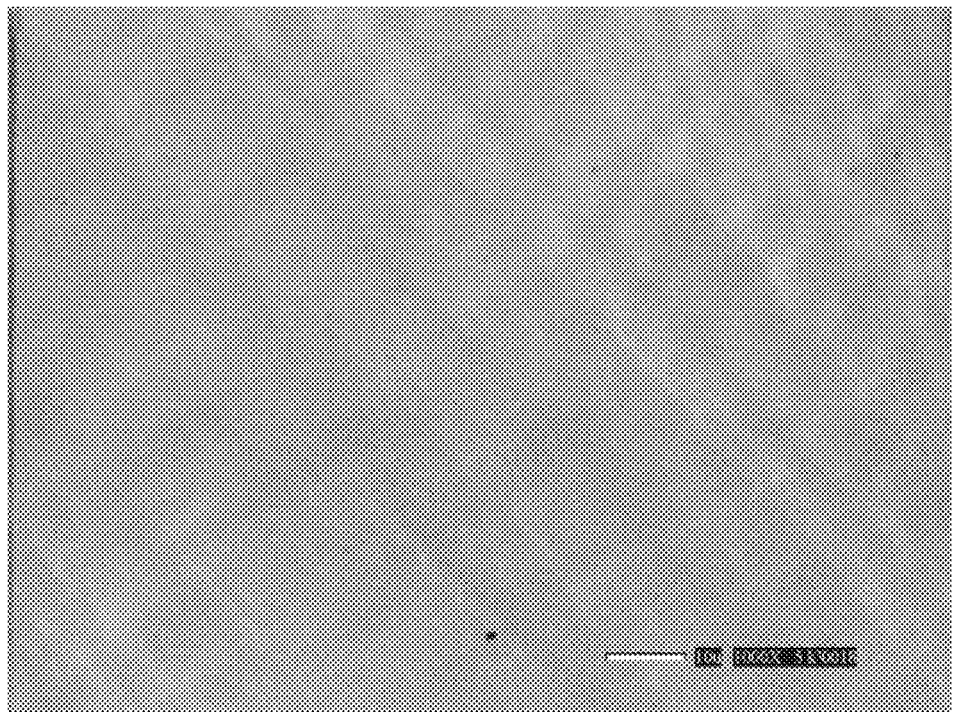
FIG. 17 is a room-temperature panchromatic cathodoluminescence image of the surface of a semi-insulating GaN substrate or boule. The dislocation density is $5 \times 10^4$ cm$^{-2}$. The image size is approximately 118 µm×90 µm.

The GaN crystal grown had very low crystal defects. The GaN boule was sliced into multiple wafers. FIG. 17 shows the dislocation density in the iron-doped, semi-insulating GaN crystal as measured by room-temperature cathodoluminescence (CL) imaging (panchromatic). In the CL imaging process, an electron beam is rastered across the sample and luminescence intensity is recorded. Crystal defects such as threading dislocations act as non-radiative recombination centers and emit less luminescence and thus exhibit dark spots in the CL image. Using this technique, the dislocation density was measured to be as low as about $5\times10^4$ $cm^{-2}$.

Figure 18:
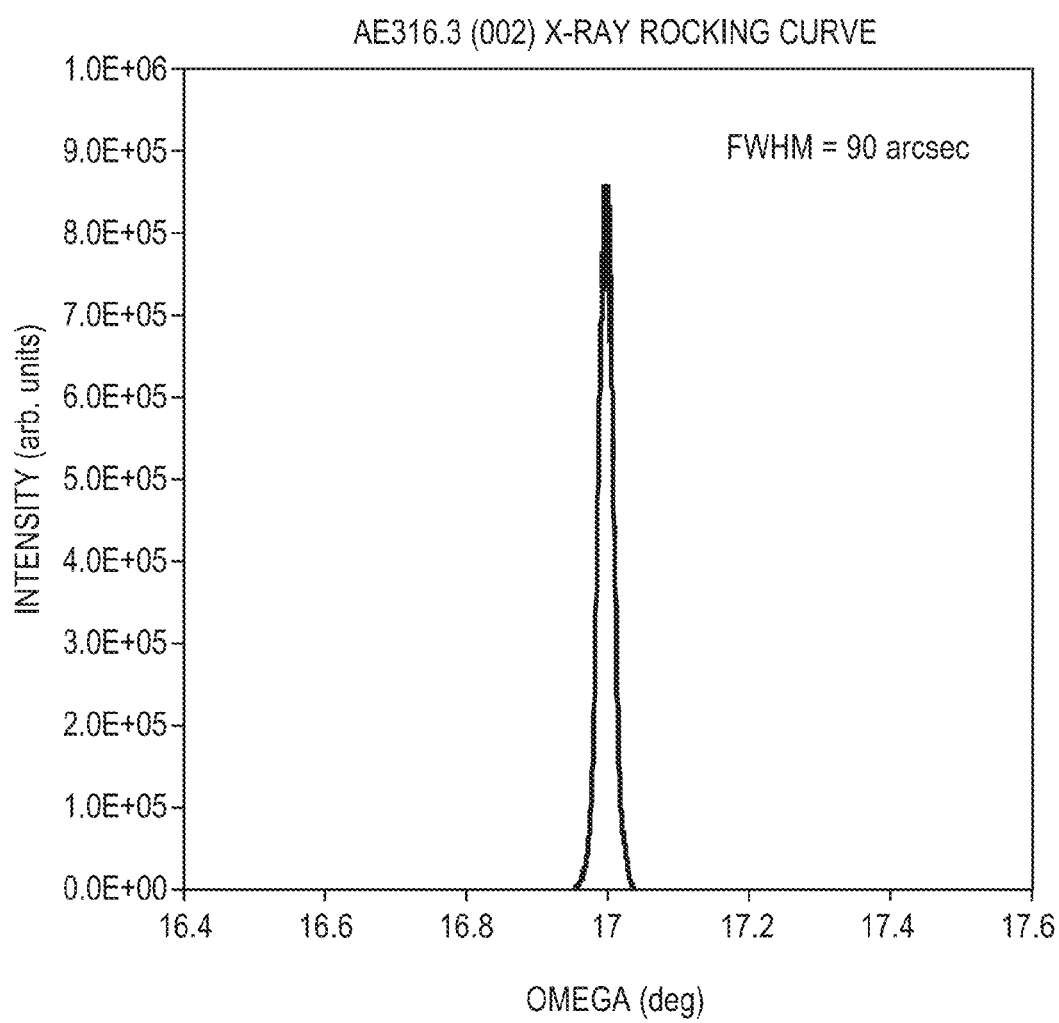
FIG. 18 is an x-ray rocking curve for the GaN substrate grown with the semi-insulating growth scheme.

The high crystal quality of the GaN crystal grown in this example is also confirmed with x-ray rocking curve measurement. FIG. 18 is the x-ray rocking curve for the (0002) reflection. The FWHM was about 90 arcsec for the (0002) rocking curve, and was about 120 arcsec for the asymmetric (102) rocking curve.

Figure 19:
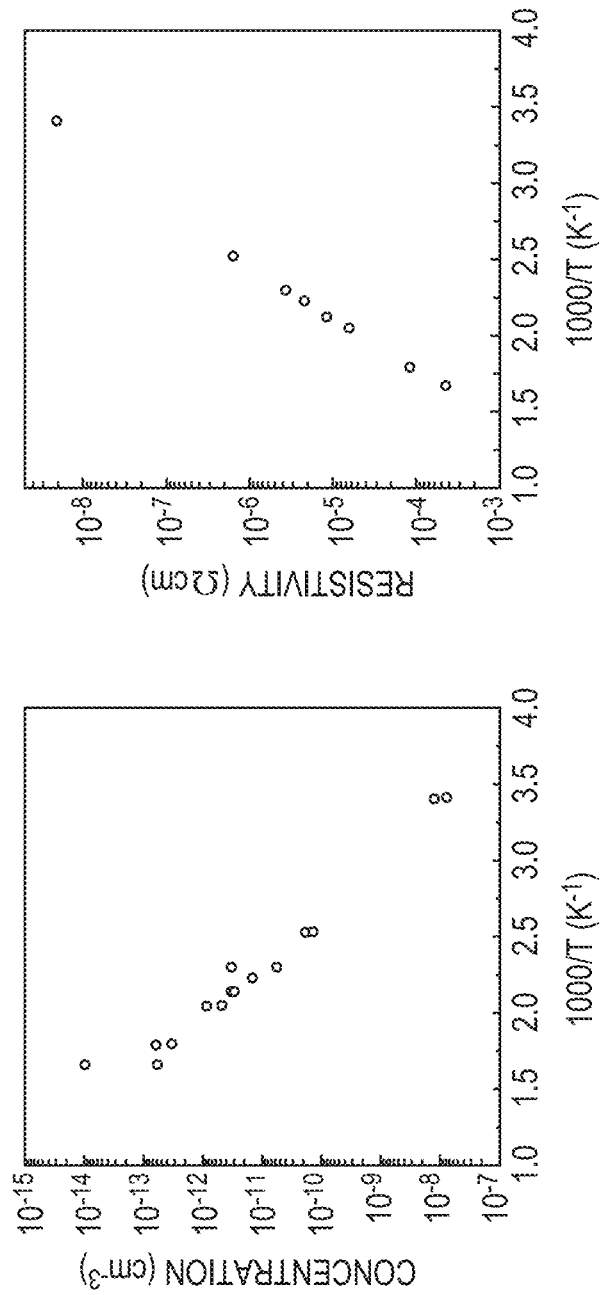
FIG. 19 illustrates plots of carrier concentration data (left) and Hall resistivity data (right) for a wafer created with the semi-insulating growth scheme that shows high resistivity ($>10^8$ ohm-cm) at room temperature.

The iron-doped GaN crystal is semi-insulating. A 10 mm×10 mm GaN piece was obtained from the wafer or boule and the resistivity of the piece was measured by Hall measurement and by contactless resistivity mapping (COREMA) techniques. FIG. 19 shows the resistivity and carrier concentration as a function of temperature. The room temperature resistivity of the sample was greater than about $2\times10^8$ ohm-cm.

Figure 20:
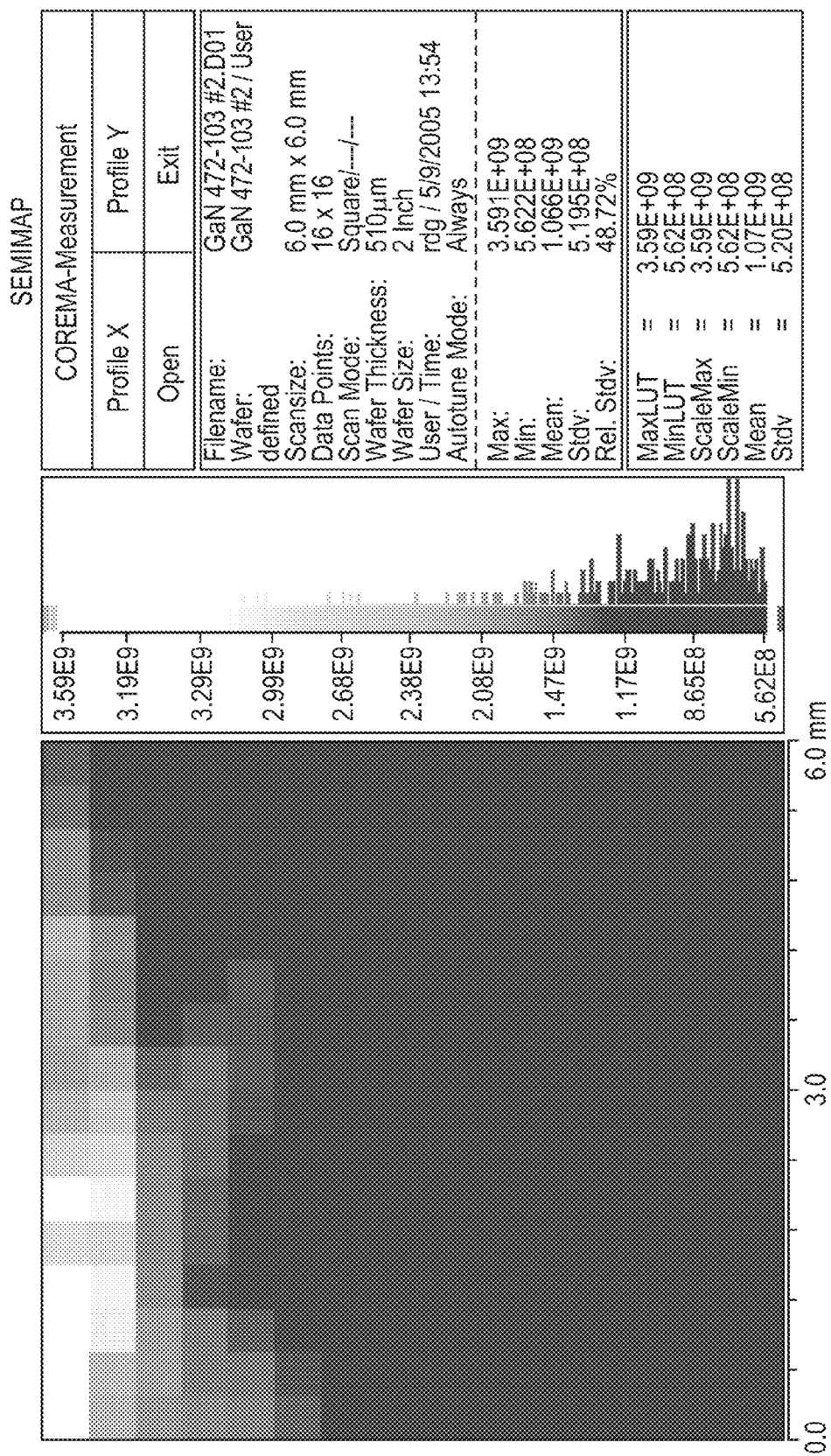
FIG. 20 is a room temperature Corema resistivity map of a semi-insulating GaN substrate. The mean resistivity of the substrate is $1.07 \times 10^9$ Ω·cm.

FIG. 20 is a COREMA resistivity map of a 10 mm×10 mm GaN substrate obtained from the iron-doped GaN boule. The mean room temperature resistivity was about $1\times10^9$ ohm-cm and the minimum resistivity measured on the sample was about $5\times10^8$ ohm-cm. Both the Hall and COREMA measurements demonstrated that the iron-doped GaN wafers were semi-insulating.

Example 6

Undoped GaN Boule Growth

In this example, we illustrate another embodiment of the present invention in which a high-purity undoped GaN substrate or boule was grown. Sapphire was used as the starting substrate. Using the sputtering method disclosed in U.S. Pat. No. 6,784,085, an AlN layer approximately 0.7 μm thick was grown on the sapphire substrate for use as a nucleation layer for the HVPE GaN growth. X-ray diffraction was used to verify the AlN film was single crystal. The AlN/sapphire structure was loaded into the previously described vertical HVPE system 100 (FIG. 1) and the GaN growth was commenced.

Figure 21:
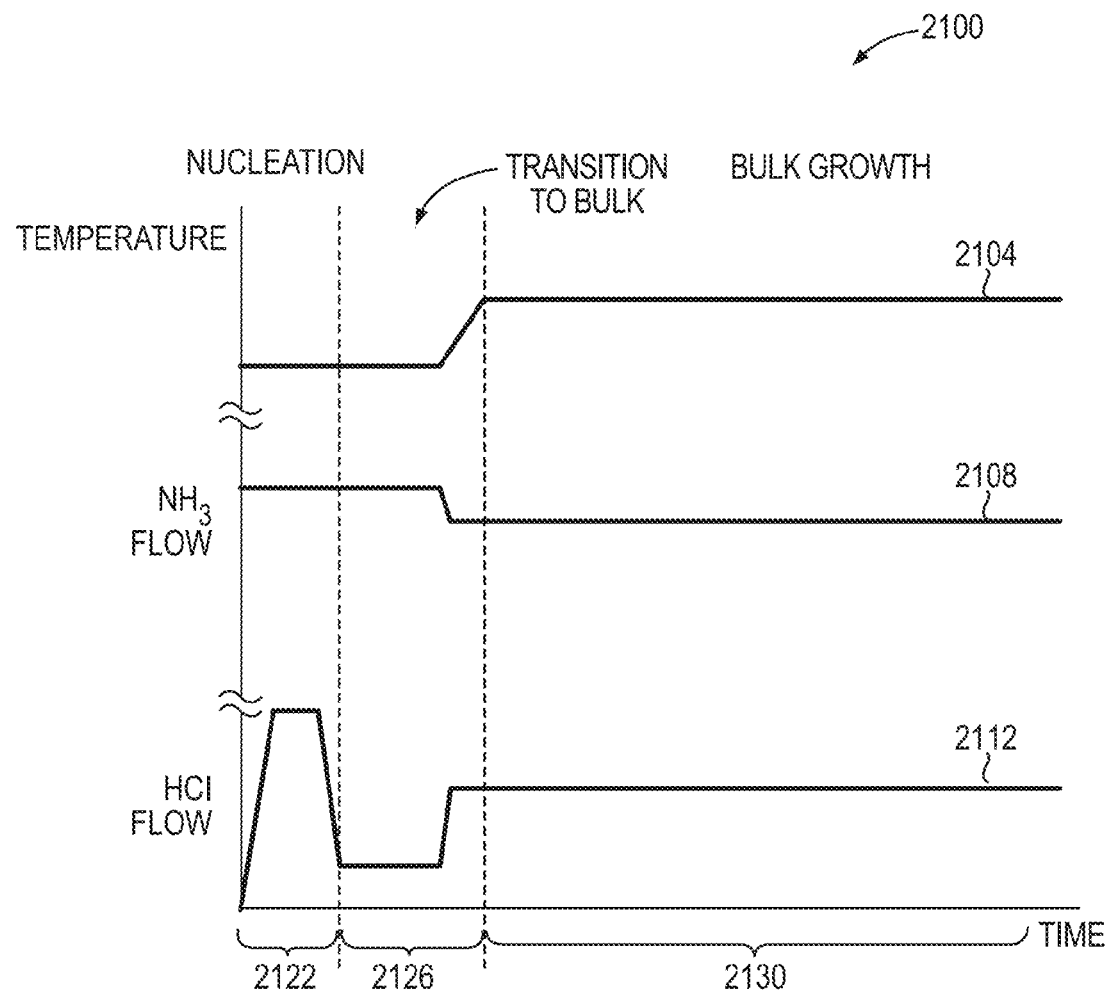
FIG. 21 is an illustration of an example of a growth process for undoped, bulk GaN with a pitted surface morphology, including the temperature, $NH_3$ flows, and HCl flows for the nucleation, transition, and bulk growth stages.

FIG. 21 is an illustration of an example of a process 2100 for growing the undoped bulk GaN substrate or boule with a pitted surface morphology, including the temperature 2104, $NH_3$ flows 2108, and HCl flows 2112 for the nucleation stage 2122, transition stage 2126, and bulk growth stage 2130. The bulk growth process 2100 included a nucleation step 2122 on the AlN-coated sapphire substrate with a rough surface morphology, transitioning 2126 the growth condition from the nucleation stage 2122 to the bulk growth stage 2130, and bulk growth 2130.

The nucleation layer consisted of a 10 μm thick layer with a pitted morphology, grown at lower temperature and higher growth rate than the bulk growth step. The growth rate for the nucleation layer was around 150 microns per hour, the growth time was around 5 minutes, the growth temperature was around 950° C., and the V:III ratio was around 30. At the end of the growth of the nucleation layer, the surface is substantially covered with small pits.

The transition to the bulk growth was accomplished by growing the GaN crystal at a slower growth rate by initially reducing HCl flow and keeping the same temperature and ammonia flow as for the nucleation layer. The growth rate for the transitional layer was around 30 microns per hour, the growth time was around 8 minutes, and the growth temperature was around 950° C. Because the HCl flow was reduced and the ammonia flow was kept the same, the V:III ratio was initially around 150. During the growth of the second stage of the transition layer, the V:III ratio was gradually reduced to achieve the desired conditions for bulk growth. The growth rate was increased to around 100 microns per hour, the growth temperature was increased to around 955° C. and the V:III ratio was reduced to around 30. The density of pits on the growing GaN surface was reduced and the size of the pits was increased during the growth of the transitional layer.

Following growth of the transition layer, the bulk layer was grown. The bulk layer was grown for at least 16 hours at the growth conditions at the end of growth of the transition layer. Depending on the final growth rate and temperature, the $NH_3$ flow or the temperature or the growth rate or some combination of the three were adjusted to maintain the coverage of the surface pits and faceted growth morphology.

Figure 22:
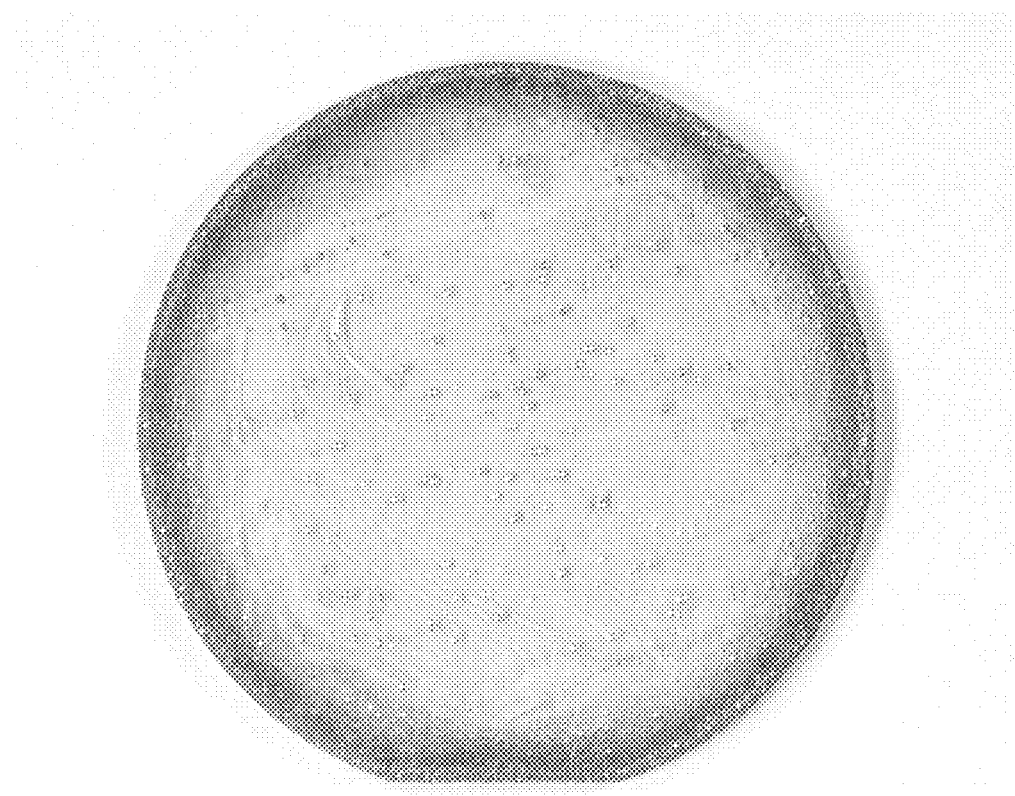
FIG. 22 is an optical image of a crack-free boule grown with the undoped growth scheme.

After the completion of the growth, the resulting GaN/sapphire bi-layer was cooled to room temperature. During the cooling down process, the sapphire substrate completely delaminated from the GaN/sapphire bi-layer, forming a freestanding crack-free GaN article (substrate, boule, etc.). FIG. 22 is an optical picture of the GaN article obtained in this example. The GaN article was 2 inches in diameter and the thickness of the article was about 1.6 mm. The surface of article had some pits that were removed during the wafer polishing process.

The freestanding GaN article was sliced into two wafers and wafers were mechanically lapped and polished in several stages with progressively smaller diamond slurries to achieve a mirror finish on the front side. The backside is also lapped to achieve a matte finish. Optionally, the backside can also be polished to a mirror finish. The lap/polish process of both front and back sides of the substrate ensures the final wafer has minimal thickness variation across the wafer and minimal bow. A chemical mechanical polish (CMP) process was used as the final polish step, which produced a damage-free surface. Other suitable surface finishing techniques may alternately or additionally be employed.

Figure 23:
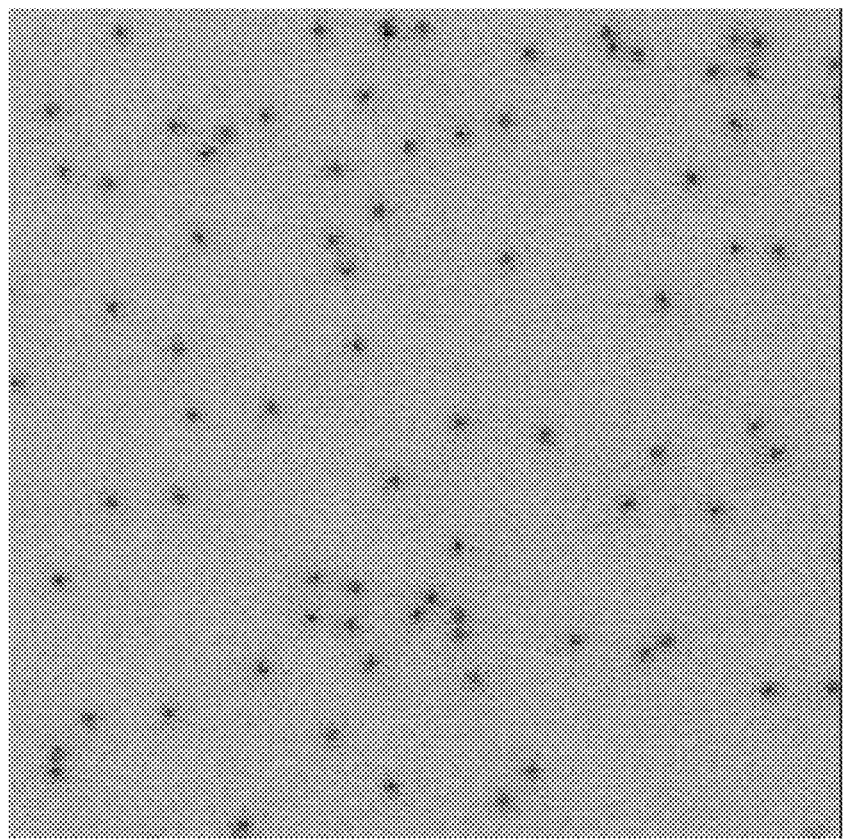
FIG. 23 is a 30×30 µm room-temperature panchromatic cathodoluminescence image of the surface of a polished undoped GaN boule. The dislocation density is $8.8 \times 10^6$ cm$^{-2}$.

The dislocation density of the wafer was measured using a CL imaging technique. FIG. 23 is a CL image of an area of the wafer produced in this example, showing the dislocation density of the wafer was about $8 \times 10^6$ cm$^{-2}$.

Example 7

Si-Doped Conductive GaN Boule with Smooth Surface Morphology

This example illustrates an embodiment of the present invention in which the GaN was doped with silicon for n-type conductivity and the surface of the boule during the growth was maintained essentially pit-free. Sapphire was used as the starting substrate. Using the sputtering method disclosed in U.S. Pat. No. 6,784,085, an AlN layer approximately 0.7 μm thick was grown on the sapphire substrate for use as a nucleation layer for the HVPE GaN growth. X-ray diffraction was used to verify the AlN film was single crystal. The AlN/sapphire structure was loaded into the previously described vertical HVPE system and the GaN growth was commenced.

Figure 24:
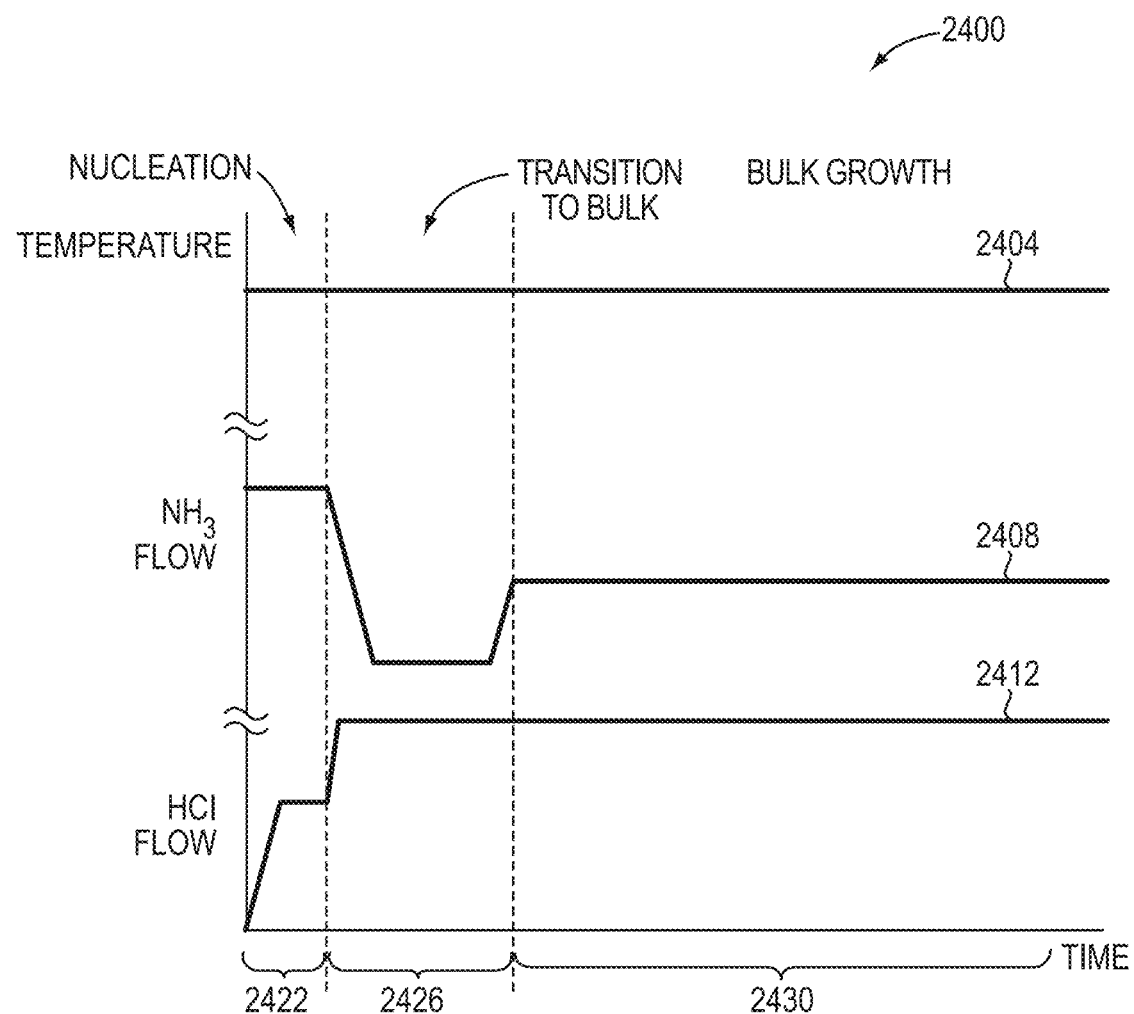
FIG. 24 is an illustration of the growth process for n-type, bulk GaN with a smooth surface morphology, including the temperature, $NH_3$ flows, and HCl flows for the nucleation, transition, and bulk growth stages.

FIG. 24 is an illustration of an example of a growth process 2400 for n-type, bulk GaN with a smooth surface morphology, including the temperature 2404, $NH_3$ flows 2408, and HCl flows 2412 for the nucleation stage 2422, transition stage 2426, and bulk growth stage 2430. The bulk growth process 2400 included a nucleation step 2422 on the AlN-coated sapphire substrate with a rough surface morphology, transitioning 2426 the growth condition from the nucleation stage 2422 to the bulk growth stage 2430, and bulk growth 2430. Silane with a specific flow rate and concentration to achieve $[Si]=1-5 \times 10^{18}$ cm$^{-3}$ was delivered into the growth system during the nucleation 2422, transition 2426, and bulk growth 2430. In this example, the temperature of the growth was kept constant while the growth rate and V:III ratio was varied to achieve desirable nucleation, transition and bulk growth.

The nucleation layer consisted of a 14~20 μm thick layer with a pitted morphology that was achieved with a higher V:III ratio than the bulk growth. The growth rate of the nucleation rate was about 300 microns per hour. The growth time was around 5 minutes, the growth temperature was around 1000° C., and the V:III ratio was around 75. At the end of growth of the nucleation layer, the surface of the GaN film was covered with pits.

The transition to the bulk growth used a lower V:III ratio of 16 to achieve a smooth surface morphology for bulk growth. The growth rate was about 300 μm per hour. The growth time was around 2 hours, and the growth temperature was around 1000° C. During growth of the transition layer, the V:III ratio was gradually reduced in 5 minutes and then kept constant. This transition layer thickness was approximately 600 μm, which resulted in a surface nominally free of growth pits.

Following growth of the transition layer, the bulk growth layer was grown and a higher V:III ratio of 25 was used to maintain a nominally pit free surface and to prevent any possible defects, such as microcracking, from occurring during bulk stage. The total growth time was 40 hours and the length of the boule was about 1.2 centimeters.

Example 8

Si-Doped GaN Boule with Faceted Surface Morphology

In this example, we illustrate an embodiment of the invention where the GaN boule was grown with a faceted surface morphology during the boule growth. Sapphire was used as the starting substrate. Using the sputtering method disclosed in U.S. Pat. No. 6,784,085, an AlN layer approximately 0.7 µm thick was grown on the sapphire substrate for use as a nucleation layer for the HVPE GaN growth. X-ray diffraction was used to verify the AlN film was single crystal. The AlN/sapphire structure was loaded into the previously described vertical HVPE system and the GaN growth was commenced.

Figure 25:
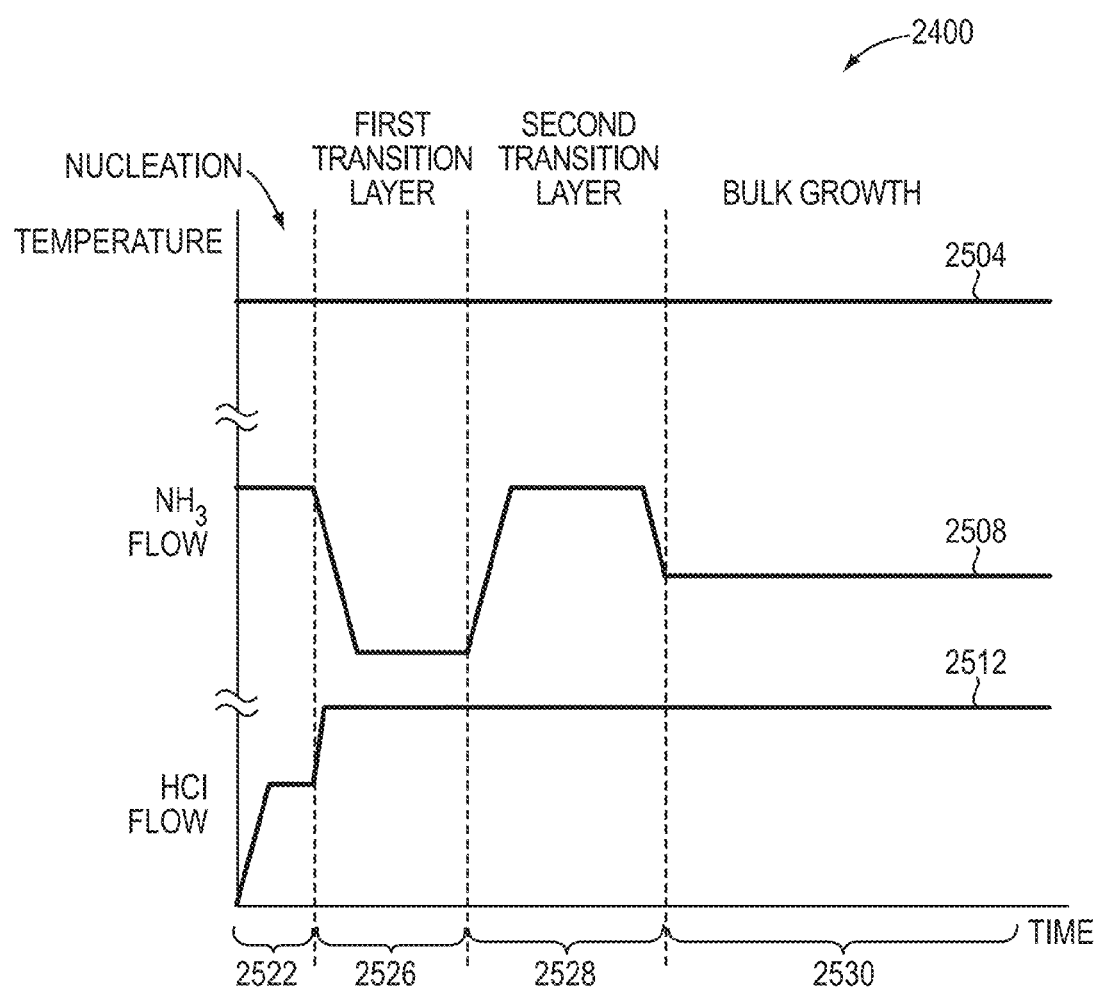
FIG. 25 is an illustration of the growth process for n-type, bulk GaN with a pitted surface morphology, including the temperature, $NH_3$ flows, and HCl flows for the nucleation, transition, and bulk growth stages.

FIG. 25 is an illustration of an example of a growth process 2500 for n-type, bulk GaN with a pitted surface morphology, including the temperature 2504, $NH_3$ flows 2508, and HCl flows 2512 for the nucleation stage 2522, transition stages 2526 and 2528, and bulk growth stage 2530. The bulk growth process 2500 included a nucleation step 2522 on the AlN-coated sapphire substrate with a rough surface morphology, transitioning 2526 the growth condition from the nucleation stage to a low pitting growth stage, a second transition stage 2528 where a controlled level of pitting and surface facet was established, and bulk growth 2530. Silane with a specific flow rate and concentration to achieve a $[Si]=1\text{-}5\times10^{18}$ cm$^{-3}$ was delivered into the growth system during the nucleation 2522, transition 2526 and 2528, and bulk growth 2530 for n-type doping. The growth temperature was held constant whereas the growth rate and V:III ratio was adjusted in the various stages of the growth.

The nucleation layer consisted of a 14~20 µm thick layer with a pitted morphology grown at a higher V:III ratio. The growth rate of the nucleation layer was about 300 microns per hour to achieve desired pitting level. The growth time was around 5 minutes, the growth temperature was around 1000° C., and the V:III ratio was around 75.

The first transition layer used a lower V:III ratio such as 16 to achieve a smooth morphology for bulk growth. This transition layer was approximately 600 µm thick. The growth time was around 2 hours, and the growth temperature was around 1000° C. During growth of the transition layer, the V:III ratio was gradually reduced to achieve the desired conditions in 5 minutes. It was important to achieve a smooth surface morphology and eliminate any large pits in the first transition layer prior to controllably introducing a pitted morphology, in order to prevent any pits from exceeding the desired size during the bulk growth. After growth of the first transition layer, a second transition layer was grown which resulted in a surface with a nominally uniform distribution of growth pits between 50 and 500 microns in size. The growth rate was around 300 microns per hour to achieve desired pitting level. The growth time was around 1 hour, the growth temperature was around 1000° C., and the V:III ratio was around 50.

Following growth of the second transition layer, the bulk growth layer was grown under conditions to maintain the pit size and distribution, and to prevent any possible defects, such as microcracking or polycrystalline GaN inclusions, from occurring during bulk stage. The $NH_3$ flow was lowered to prevent excessive growth in the pit size and to prevent polycrystalline GaN inclusions from forming. Depending on the final growth rate and temperature, the $NH_3$ flow or the temperature or the growth rate or some combination of the three were adjusted to maintain the surface morphology. The growth condition for this example was: growth rate about 300 microns per hour, V:III ratio 35, growth temperature 1000° C., and growth time 40 hours. A boule of about 1.2 centimeter in length was obtained.

The GaN boule was sliced into 17 wafers using a multiwire wire saw. The wafers were lapped and polished to mirror finish. A chemical mechanical polish was used as the final polishing step that removed surface and subsurface damage.

Freestanding Group III Nitride Crystals and Methods for Producing Same by Self-Separation Thermal Stress and Cracking of GaN Grown on Sapphire After discovering that HVPE GaN grown under conditions that yield pitted surface morphology eliminates the microcracks in GaN during the growth, we encountered another problem: cracking of GaN and sapphire when the wafer cooled down from the growth temperature to the ambient room temperature due to the mismatch in the coefficients of thermal expansion.

Figure 26:
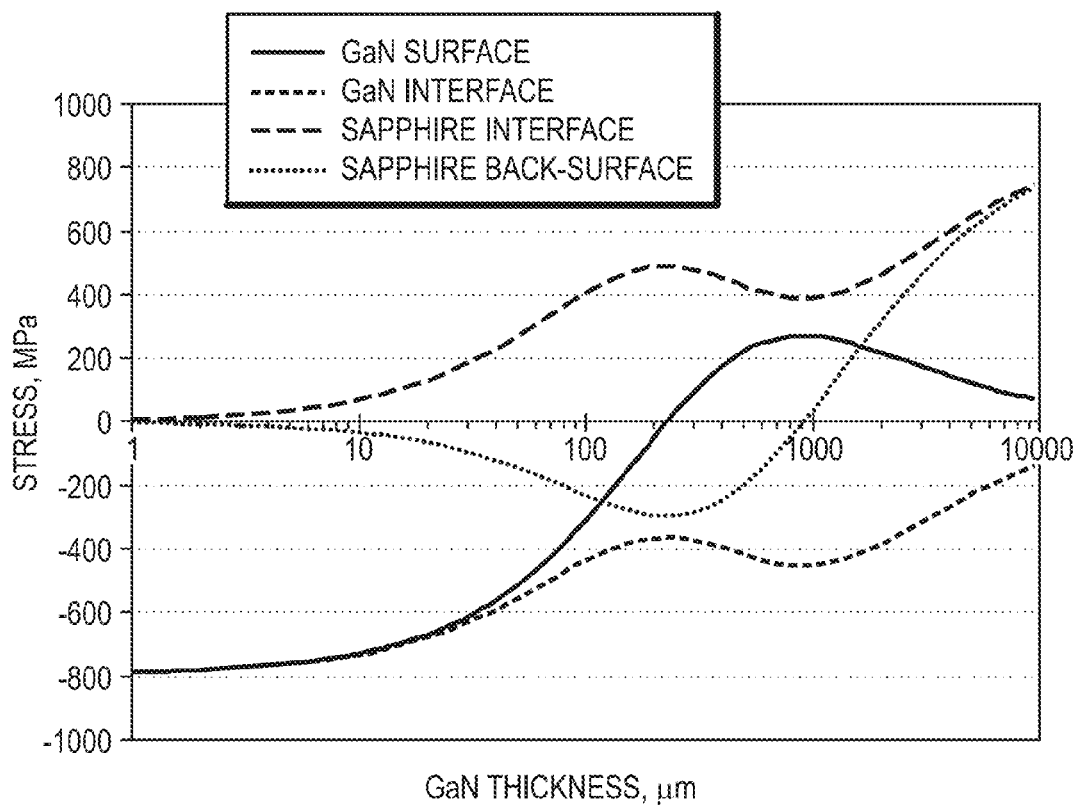
FIG. 26 illustrates plots of the calculated in-plane biaxial stresses in GaN and sapphire for a simple two-layer stress model as a function of GaN layer thickness. Positive stress values are tensile and negative stress values are compressive. The thickness of the sapphire is 430 µm and the growth temperature is taken to be 970° C.

A sapphire substrate has a larger coefficient of thermal expansion (CTE) than a gallium nitride thin or thick film. During cooling down from a growth temperature of, for example, about 1000° C. to room temperature, sapphire shrinks faster than the gallium nitride film. In a simple two-layer model, sapphire near the interface is under biaxial tensile stress and the GaN film near the interface is under biaxial compressive stress in the plane parallel to the interface. It is noted that the gallium nitride at the interface is always under biaxial compressive stress, whereas the stress on the gallium nitride surface depends on the thickness of the gallium nitride film (for a given sapphire substrate thickness). The stress on the gallium nitride surface is changed from compressive stress to tensile stress with increased gallium nitride film thickness. The calculated thermal stresses in GaN and sapphire for a simple two-layer model as a function of GaN layer thickness is shown in FIG. 26.

The thermal stress results in high strain energy in the GaN/sapphire composite. The strain energy may be released by cracking. Cracking occurs, in general, if the strain is above the critical strain and energy is released by cracking. For example, when the GaN film is quite thin and the sapphire is thick, the GaN/sapphire composite does not crack after cooling because the GaN is under compressive stress and sapphire is under tensile stress, which is still below the critical stress. When both the GaN layer and sapphire substrate are relatively thick, sapphire cracks under the tensile stress, which can propagate into the GaN film, causing GaN cracking as well.

There are four main possible types of crackings when considering the GaN/sapphire bilayer structure: cracks perpendicular to the surface and cracks parallel to the surface; and cracks in the GaN and sapphire. Cracks perpendicular to the surface break the wafer. Cracks in the GaN layer parallel to the surface (lateral cracks) can separate GaN from the sapphire substrate. Sometimes both types of cracks are present, which can result in small pieces of freestanding GaN.

Methods for Producing GaN Wafer by Self-Separation

An example of a GaN growth method that affects the stresses of the GaN film on a substrate such as sapphire will now be described. In general, a hetero-structure consisting substantially of a GaN/substrate bi-layer or composite is created such that, upon cool down from the growth temperature to room temperature, cracking perpendicular to the surface of a layer is greatly suppressed and lateral cracks in the GaN layer parallel to the surface are promoted to cause separation between the majority of the GaN layer and the underlying substrate. After the separation, a stress-free GaN wafer as large as the substrate, and the substrate with a thin GaN film, are obtained. This method of cracking may be strongly dependent on the substrate utilized, the nucleation layer utilized, the initial growth conditions and the bulk growth conditions of the GaN layers.

The GaN growth method in some implementations may include several growth steps, including depositing an epitaxial nitride (e.g., AlN) layer, growing a thin GaN layer under a 3D growth mode with a surface covered with pits, growing a recovery GaN layer to recover from a much pitted surface morphology to a less pitted surface morphology, and growing a bulk growth layer.

The GaN growth method according to this example will now be described with reference to FIG. 27, which schematically illustrates a GaN crystal structure 2700, and FIG. 28, which schematically illustrates a GaN crystal/substrate bi-layer 2800 after self-separation.

Figure 27:
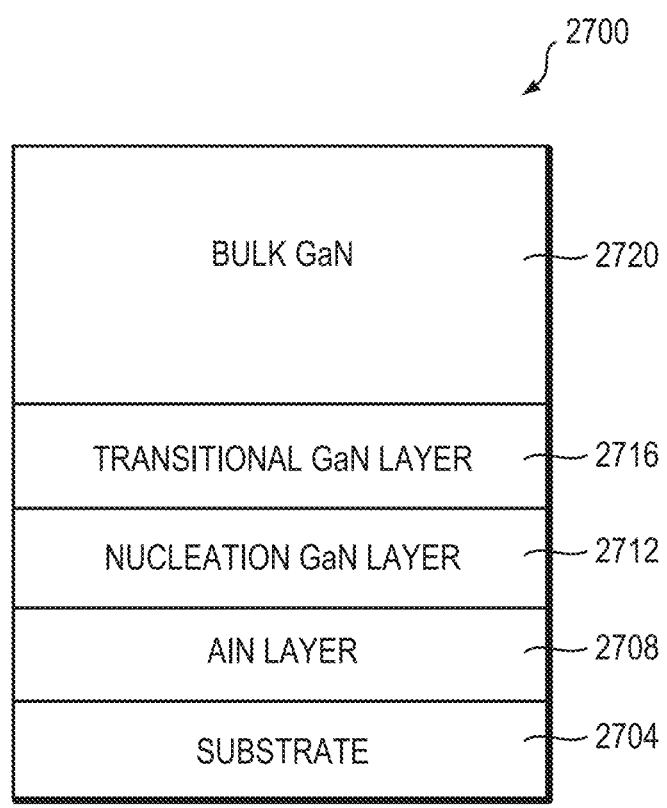
FIG. 27 is a schematic view of a GaN crystal structure that includes a bulk GaN crystal grown on a substrate, showing different layers of the crystal structure.

Referring to FIG. 27, a suitable substrate 2704 is provided. In some implementations, the substrate 2704 may have a characteristic dimension (e.g., diameter) of about 2 inches or greater. As further examples, the diameter of the substrate 2704 may be about 3" or greater, about 4" or greater, or any other suitable size such as about 12" or greater. The substrate 2704 may be sapphire ($Al_2O_3$), although other suitable single-crystal substrates 2704 may be utilized.

The first step of the growth process is to deposit a thin epitaxial nitride layer 2708 on the substrate 2704. The purpose of this epitaxial nitride layer 2708 is to provide a template for epitaxial growth of GaN. The epitaxial nitride layer 2708 in one embodiment is prepared by high-temperature sputtering in a sputtering chamber. The epitaxial nitride layer 2708 may also be formed by molecular beam epitaxy (MBE), metal-organic vapor phase epitaxy (MOVPE or MOCVD), hydride vapor phase epitaxy, or high-temperature annealing of the substrate 2704 in ammonia. In one example, the thickness of the epitaxial nitride layer 2708 is in the range (ranges) from about 0.05 to about 10 microns. In another example, the thickness of the epitaxial nitride layer 2708 is typically about 0.2 to about 2 microns. Other types of template layers may be used, for example, a GaN or AlGaN layer, grown by MOVPE, MBE or HVPE.

The second step of the growth process is to grow a single-crystalline GaN layer 2712 by hydride vapor phase expitaxy in a 3D growth mode. The nitride-coated substrate 2704/2708 is loaded into an HVPE reactor, and the reactor is purged with high-purity nitrogen to remove impurities. A layer 2712 of gallium nitride is then grown on the epitaxial nitride layer 2708. This GaN layer 2712 is grown in a three-dimensional (3D) growth mode, where the surface of the film is very rough and covered with pits.

The growth conditions for the 3D growth mode are the conditions that preferentially produce a pitted surface morphology. Such conditions are, for example, higher growth rate, and/or higher ammonia flow (or V:III ratio), and/or lower growth temperature than the "optimal" thin-film growth condition. The "optimal" thin-film growth condition is one that would produce smooth, substantially pit-free, crack-free thin films (e.g., with a thickness equal to or less than 3 microns), but would produce microcracked thick films (e.g., with a thickness equal to or greater than 20 microns). Example 1, given above, is an example of an optimized growth condition for a thin film. When growing a thin film (≤3 μm), this "optimal" thin-film growth condition typically produces a crack-free film, whereas when growing a thick film (≥20 μm), this "optimal" growth condition typically produces a microcracked film.

In growing the 3D-growth layer 2712, for a given growth temperature, there is a preferred growth rate and V:III ratio to achieve the desired result. As an example, for a growth temperature of about 940° C., the growth rate for 3D growth mode is approximately 190-200 μm/hr at a V:III ratio of around 17-18. A thickness of 15-20 μm has been shown to result in the desired outcome. As another example, for a growth temperature of about 980° C., the growth rate for 3D mode growth is approximately 250 μm/hr at a V:III ratio of about 50, and a thickness of 25-30 μm has shown similar results. In other examples, other growth conditions can achieve similar results.

There are two purposes for this 3D growth layer 2712: first is to prevent microcracking of GaN during the growth, and second is to present the GaN film with a certain stress condition that will facilitate the lateral cracks during cool down. In one example, the thickness of the 3D growth layer 2712 may range from about 5 to about 500 microns. In another example, the thickness of the 3D growth layer 2712 may range from about 5 to about 200 microns. In another example, the thickness of the 3D growth layer 2712 may range from about 5 to about 100 microns. In another example, the thickness of the growth layer 2712 ranges from about 10 to about 50 microns. In yet another example, the thickness of the 3D growth layer 2712 ranges from about 20 microns to about 30 microns. In another example, the thickness of the 3D growth layer 2712 is about 20 microns.

At the end of 3D nucleation layer growth, the growth surface has substantial amounts of pits. The pitting percentage of the 3D nucleation layer, defined as the percentage of the surface covered with pits, may be greater than about 50%. In other examples, the pitting percentage is greater than about 75%. In other examples, the pitting percentage is greater than about 90%.

In one implementation, the growth temperature in the 3D growth mode ranges from about 900° C. to about 1000° C., the V:III ratio in the 3D growth mode ranges from about 10 to about 100, and the growth rate in the 3D growth mode ranges from about 50 μm/hr to about 500 μm/hr.

If the GaN film is grown under the 3D growth mode with higher thickness, the GaN film quality is gradually changed from an epitaxial single-crystalline film to a polycrystalline film.

The third step of the growth process is to change the growth conditions to recover the surface morphology from a highly pitted surface morphology to a less pitted surface morphology, which prepares the surface of the growing crystal for the subsequent bulk growth stage where most of the GaN crystal is grown. In this third step, the growth mode is gradually changed from a 3D growth mode to a 2D growth mode. This transition is accomplished by growing a recovery layer 2716 on the 3D growth layer 2712 under conditions such as lower growth rate, and/or lower ammonia partial pressure, and/or higher growth temperature than the growth condition of the 3D nucleation layer 2712. In one example, the thickness of the morphology recovery layer 2716 may range from about 5 to about 500 microns. In another example, the thickness of the morphology recovery layer 2716 may range from about 5 to about 200 microns. In another example, the thickness of the morphology recovery layer 2716 may range from about 5 to about 100 microns. In another example, the thickness of the recovery layer 2716 ranges from about 5 to about 50 microns. In another example, the thickness of the recovery layer 2716 is about 8 microns. The purposes of the recovery layer 2716 are to prevent the GaN film from turning into polycrystalline, and to obtain a film stress state that facilitates lateral cracks during cool down.

In one implementation, the growth temperature in the recovery layer growth mode ranges from about 920° C. to about 1100° C., the V:III ratio in the recovery layer growth mode ranges from about 8 to about 80, and the growth rate in the recovery layer growth mode ranges from about 50 μm/hr to about 500 μm/hr.

The fourth growth step is the bulk growth step where the bulk of the GaN film is grown. As illustrated in FIG. 27, a bulk layer or crystal 2720 is grown on the recovery layer 2716. The growth condition is chosen so that the morphology of the GaN film is slightly pitted or pit-free. The GaN growth mode in this step is substantially a 2D growth mode. The growth conditions may be held constant during this step. Alternatively, the growth condition may be slightly ramped, for example, slightly ramping down ammonia flow or slightly ramping down the growth rate or slightly ramping up the temperature. The purpose of the ramping in the bulk growth step is to further reduce the density of the pits on the growing GaN surface. During the bulk growth step, the density of the pits on the growing GaN surface is gradually reduced. At the end of the bulk growth, the GaN surface is slightly pitted or pit-free. In one example, the thickness of the GaN bulk layer 2720 grown in the bulk growth step ranges from about 500 to about 2000 microns (0.5 to 2 mm). In another example, the thickness of the GaN bulk layer 2720 ranges from about 1000 to about 1500 microns (1 to 1.5 mm). In some implementations, the crystal growth process is performed to yield a single wafer. In other implementations, the process may be performed to grow a GaN boule that can be sliced into multiple wafers, in which case a thicker bulk layer 2720 may be grown, for example, about 2 mm or greater, from about 2 mm to about 10 mm, or about 10 mm or greater.

In one implementation, the growth temperature in the bulk growth stage ranges from about 950° C. to about 1100° C., the V:III ratio in the bulk growth stage ranges from about 5 to about 50, and the growth rate in the bulk growth stage ranges from about 50 µm/hr to about 500 µm/hr.

After completing the growth, the resulting thick GaN-on-substrate bi-layer is gradually cooled down. In one example, the cooling rate is less than about 20° C. per minute, and in another example is less than about 10° C. per minute. In another example, the rate of cooling is about 6° C. per minute. During this cool down time, lateral cracking occurs in the GaN film with the crack plane substantially or essentially parallel to the GaN/substrate interface, leading to the separation of GaN from the underlying substrate.

Figure 28:
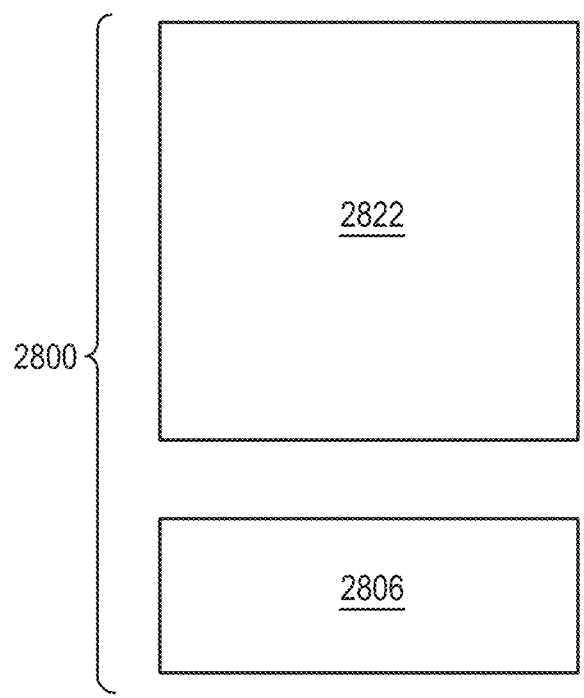
FIG. 28 is a schematic view of the GaN crystal structure illustrated in FIG. 7 after self-separation, yielding a free-standing GaN crystal separate from the underlying substrate.

FIG. 28 illustrates the resulting separated GaN/substrate bi-layer structure 2800. A thick GaN wafer 2822 having a characteristic dimension (e.g., diameter) as large as the initial substrate 2704 (FIG. 27) may be obtained, along with the substrate 2806 covered with a thin layer of GaN. As examples, when a 2" substrate 2704 is utilized, a 2" GaN wafer 2822 may be obtained. When a 3" substrate 2704 is utilized, a 3" GaN wafer 2822 may be obtained. The substrate 2806 may remain intact, or remain partially intact with edge fracture, or fracture into several pieces. The remaining GaN on the substrate 2806 is typically less than 500 microns thick. The thickness of the freestanding GaN wafer 2822 typically ranges from about 0.5 mm to about 10 mm.

When implementing methods of the invention, the lateral cracks occur in the GaN/substrate bi-layer structure 2800 because it is the most effective way to relieve the thermal stress. We wish not to be bound by any particular theory regarding how the lateral cracks occur, but here we present a possible mechanism by which lateral cracking in the bi-layer structure 2800 may occur. Since a substrate material such as sapphire shrinks more than GaN during cool down, the thermal stress condition of the GaN/substrate bi-layer structure 2800 results in the substrate being under tensile stress whereas the GaN near the interface is under the compressive stress. Film fracture behavior under compressive stress has been reported in the open literature (see, for example, "Fracture in Thin Films," S. Zuo, *Encyclopedia of Materials: Science and Technology*, Elsevier Science, 2001) and may be used to describe the GaN/substrate system. In accordance with methods described in the present disclosure, when a film is under compression, it can self-separate, or debond, from the underlying substrate.

In general, fracture is driven by the relaxation of residual stresses, in this case, thermal stress due to expansion mismatch. Fracture will occur if the driving force exceeds the fracture resistance for the particular fracture mechanism. Cracks can form at pre-existing flaws in the film, in the substrate, or at areas where the resolved stress is concentrated and exceeds the critical fracture value. The mechanics and process of the fracture processes are not fully understood, but under biaxial compressive stress, the in-plane lattice constants a and b of the GaN film are shortened whereas the lattice constant c is elongated. The increased lattice constant c under the biaxial stress weakens the bond strength causing the separation in the c direction, i.e., lateral cracking. This stress may be increased locally by geometric factors.

In the present case, the structure of the as-grown GaN layer(s) leads to conditions conducive to compressive debonding at or near the interface between the GaN and substrate. The epitaxial nitride (e.g., AlN) layer, the first GaN nucleation step, the second GaN nucleation step, or some combination of the three, results in the initiation of the debonding behavior during cool down. Experimentally, the initial debonding has been observed to occur near the center of the substrate bi-layer. After debonding, buckling occurs as the self-separated area increases. As the elastic constants of the GaN and the substrate (e.g., sapphire) are close in magnitude and plastic deformation is extremely small, the degree of buckling is limited. After buckling, both normal and shear stresses develop that will continue to grow the debonded area like a crack. Under preferred conditions, the debonding continues to the edge of the GaN/substrate bi-layer and separates the GaN layer from the substrate.

There are three major competing processes that have also been observed for the relief of the thermal stress in the GaN/substrate bi-layer: (1) lateral cracking in the GaN layer due to compressive stress in the GaN layer near the GaN/substrate interface, to form a whole piece of thick stress-free GaN wafer and a thinner-GaN/substrate bi-layer, (2) vertical cracks in sapphire due to tensile stress developed during cool down (the vertical cracks may also propagate to GaN), and (3) the presence of both lateral cracking in GaN and vertical cracking in substrate and GaN. A crack will occur in the direction where the stress exceeds the critical stress.

In addition to the thermal stress during cool down, the GaN/substrate bi-layer also experiences a growth stress built up during the crystal growth. The growth stress can lead to GaN microcracks under certain growth conditions as discussed in the previous paragraphs. The growth stress can also lead to the breaking of the substrate and the GaN layer during the growth, which is observed under non-optimal growth conditions.

The growth sequence employed in the present invention prepares in the GaN layer a certain stress state during the growth, such as increased compressive stress in the GaN layer near the interface or reduced tensile stress on the substrate, enabling the compressive stress debonding during cool down while preventing growth stress leading to microcracking or vertical cracking in the substrate or GaN layer, yielding a freestanding GaN substrate. The formation of the 3D nucleation layer is one key aspect for the separation of the bulk GaN layer during cool down. If the first nucleation layer is grown under conditions of 2D growth, the most likely mechanism for thermal stress relief for the thick GaN/substrate bi-layer is vertical cracking in the substrate that propagates to the GaN layer.

In some implementations, during the bulk growth, no impurity is introduced and all the gas sources are purified in order to achieve high-purity GaN crystals. In some examples, the impurity concentration in the high-purity GaN layer is less than about $10^{17}$ cm$^{-3}$. In other examples, the impurity concentration is less than about $10^{16}$ cm$^{-3}$. In other examples, the impurity concentration is less than about $10^{15}$ cm$^{-3}$.

Alternatively, in other implementations, during the bulk growth, n-type impurities, such as silicon (introduced, for example, as diluted silane) or oxygen, are introduced to produce n-type GaN crystals. The introduction of impurities may occur at any stage of the GaN growth. In some examples, the electron concentration in the n-type bulk GaN layer is greater than about $10^{17}$ cm$^{-3}$. In other examples, the electron concentration is greater than about $10^{18}$ cm$^{-3}$. In other examples, the electron concentration is greater than about $10^{19}$ cm$^{-3}$. In some examples, the resistivity of the n-type GaN layer is less than about 0.1 ohm-cm. In other examples, the resistivity is less than about 0.01 ohm-cm. In other examples, the resistivity is less than about 0.001 ohm-cm.

In other implementations, during the bulk growth, p-type impurities such as magnesium (Mg) are introduced to produce p-type GaN crystals. Mg may be introduced as metal-organic compound or as metal vapor. The introduction of impurities may occur at any stage of the growth. In some examples, the hole concentration in the p-type bulk GaN layer is greater than about $10^{17}$ cm$^{-3}$. In other examples, the hole concentration is greater than about $10^{18}$ cm$^{-3}$. In other examples, the hole concentration is greater than about $10^{19}$ cm$^{-3}$. In some examples, the resistivity of the p-type GaN layer is less than about 0.1 ohm-cm. In other examples, the resistivity is less than about 0.01 ohm-cm. In other examples, the resistivity is less than about 0.001 ohm-cm.

In other implementations, the electrical properties of the bulk GaN crystal can also be made semi-insulating by introducing a deep-level acceptor. Transition metals, such as iron, are deep level acceptors. Iron may be introduced to the deposition zone either via a metal-organic compound such as ferrocene or via iron chloride formed by reacting metallic iron with hydrochloric acid. The concentration of the transition metal in the bulk GaN layer may range from about $10^{16}$ to about $10^{20}$ cm$^{-3}$. In other examples, the concentration of the transition metal ranges from about $10^{17}$ to about $10^{19}$. In other examples, the concentration of the transition metal is around $10^{18}$ cm$^{-3}$. The resistivity of the SI bulk GaN layer at room temperature may be greater than about $10^6$ ohm-cm. In other examples, the resistivity is greater than about $10^7$ ohm-cm. In other examples, the resistivity is greater than about $10^8$ ohm-cm.

After self-separation, the GaN wafers may be mechanically polished to a specified wafer thickness. To remove the subsurface damage, the wafer may be chemically mechanically polished as the last step. Reactive ion etching or inductively coupled plasma etching may also be used to remove the damaged surface layer. Other suitable surface finishing techniques may alternately or additionally be employed.

Example 5, described above in conjunction with FIGS. 15-20, may be referred to as an example of a process for fabricating a free-standing, semi-insulating GaN substrate by self-separation. That example utilizes a growth sequence and growth conditions that produce a GaN/sapphire bi-layer. The GaN/sapphire bi-layer may be cooled to room temperature at a prescribed cooling rate that results in the sapphire substrate completely delaminating from the GaN/sapphire bi-layer, thereby forming the freestanding GaN substrate.

Example 6, described above in conjunction with FIGS. 21-23, may be referred to as an example of a process for fabricating a free-standing, undoped GaN substrate by self-separation. That example likewise utilizes a growth sequence and growth conditions that produce a GaN/sapphire bi-layer. The GaN/sapphire bi-layer may be cooled to room temperature at a prescribed cooling rate that results in the sapphire substrate completely delaminating from the GaN/sapphire bi-layer, thereby forming the freestanding GaN substrate.

The techniques described in the present disclosure for making free-standing GaN substrates differ from those of the prior art. In one aspect, methods of the present disclosure generate lateral cracks in GaN to separate GaN from the substrate. In another aspect, methods of the present disclosure employ several layers of GaN grown under different conditions to control the stress in the GaN film and promote the separation of GaN from the underlying substrate. In another aspect, methods of the present disclosure do not rely on the creation of voids in the films.

Low Defect Group III Nitride Films Useful for Electronic and Optoelectronic Devices and Methods for Making the Same The pitted surface morphology referred to in the above discussions eliminates the microcracks in the GaN film during the HVPE GaN growth. However, the surface is not desirable as a foundation for further growth of some GaN-based device structures. The present invention discloses methods for growing high-quality, low defect density, pit-free and crack-free GaN films by hydride vapor phase epitaxy. The GaN films are suitable for the further growth of electronic and optoelectronic devices based on group III nitride alloys.

The GaN growth method in this implementation may include several growth steps, including depositing an epitaxial nitride template layer on a suitable substrate, growing a thin GaN layer on the nitride-coated substrate under a condition that yields a surface covered with pits, and growing a GaN layer on or from the pitted GaN layer under a condition that fills the pits and yields a pit-free surface.

According to this implementation, the first step of the growth process is to deposit a thin epitaxial nitride (e.g., AlN) layer on a suitable substrate such as, for example, sapphire. The purpose of this epitaxial nitride layer is to provide a template for epitaxial growth of GaN. Without the epitaxial nitride template, the HVPE GaN film grown on a substrate such as sapphire under typical conditions may be polycrystalline. The epitaxial nitride layer in one implementation is prepared by high-temperature reactive sputtering in a sputtering chamber. For example, an aluminum target and an AC plasma of an inert gas or gas mixture (e.g., an Ar/$N_2$ gas mixture) may be utilized to deposit the epitaxial nitride layer on a heated substrate. The epitaxial nitride layer may alternatively be formed by molecular beam epitaxy (MBE), metal-organic vapor phase epitaxy (MOVPE or MOCVD), hydride vapor phase epitaxy, or high-temperature annealing in ammonia. In one example, the thickness of the epitaxial nitride layer is in the range (ranges) from about 0.05 to about 2 microns. In another example, the thickness of the epitaxial nitride layer ranges from about 0.2 to about 2 microns. Other types of template layers may alternatively be used, for example, GaN or AlGaN layers, grown by MOVPE, MBE or HVPE.

The second step of the growth process is to grow a GaN layer by hydride vapor phase epitaxy in a growth condition that yields a pitted surface morphology. The nitride-coated substrate is loaded into a HVPE reactor, and the reactor may be purged with high purity nitrogen to remove impurities. A layer of gallium nitride is then grown on the epitaxial nitride layer. The growth condition for this GaN layer is typically higher growth rate, and/or higher ammonia flow (or V:III ratio), and/or lower growth temperature than the "optimal"

thin-film growth condition. The "optimal" thin-film growth condition is one that would produce smooth, substantially pit-free, crack-free thin films (e.g., with a thickness equal to or less than 3 microns), but would produce microcracked thick films (e.g., with a thickness equal to or greater than 20 microns). Example 1, given above, is an example of an optimized growth condition for a thin film. When growing a thin film (≤3 µm), this "optimal" thin-film growth condition typically produces a crack-free film, whereas when growing a thick film (≥20 µm), the "optimal" growth conditions typically produces a microcracked film.

The GaN film grown under the growth condition of this second step is very rough and covered with pits. There are two purposes for this pitted layer: first is to prevent microcracking of GaN during the growth; and second is to promote annihilation of dislocations. In one example, the thickness of this pitted layer ranges from approximately 2 to approximately 50 microns. In another example, the thickness of this pitted layer ranges from approximately 5 to approximately 50 microns. If the GaN film is grown under the pitted growth condition with higher thickness, the GaN film quality is gradually changed from an epitaxial single-crystalline film to a polycrystalline film.

In one implementation, the growth temperature during growth of the first (pitted) epitaxial GaN layer ranges from about 900° C. to about 1000° C., the V:III ratio ranges from about 10 to about 100, and the growth rate ranges from about 50 µm/hr to about 500 µm/hr.

The third step of the growth process is to grow an additional GaN layer under conditions that cause the pits to be filled and yield a pit-free and crack-free surface. The growth condition for this layer is typically lower growth rate, and/or lower ammonia partial pressure, and/or higher growth temperature than the growth condition utilized for the pitted layer. The thickness of this layer is in one example greater than about 3 microns, in another example greater than about 5 microns, and in another example greater than about 10 microns. In another example, the thickness of second epitaxial GaN layer ranges from about 3 to about 200 microns. In another example, the thickness of second epitaxial GaN layer ranges from about 8 to about 200 microns. The optimal thickness of the pit-free layer depends on the thickness of the pitted layer. A thicker layer grown under pitted growth conditions correspondingly requires a thicker layer grown under pit-free conditions to completely fill the pits. The ratio of the thickness of the layer grown under pitted conditions to the thickness of the layer grown under pit-free condition is in one example between about 2:1 and about 1:5.

In one implementation, the growth temperature during growth of the second epitaxial GaN layer ranges from about 920° C. to about 1100° C., the V:III ratio ranges from about 8 to about 80, and the growth rate ranges from about 5 µm/hr to about 500 µm/hr.

Figure 29:
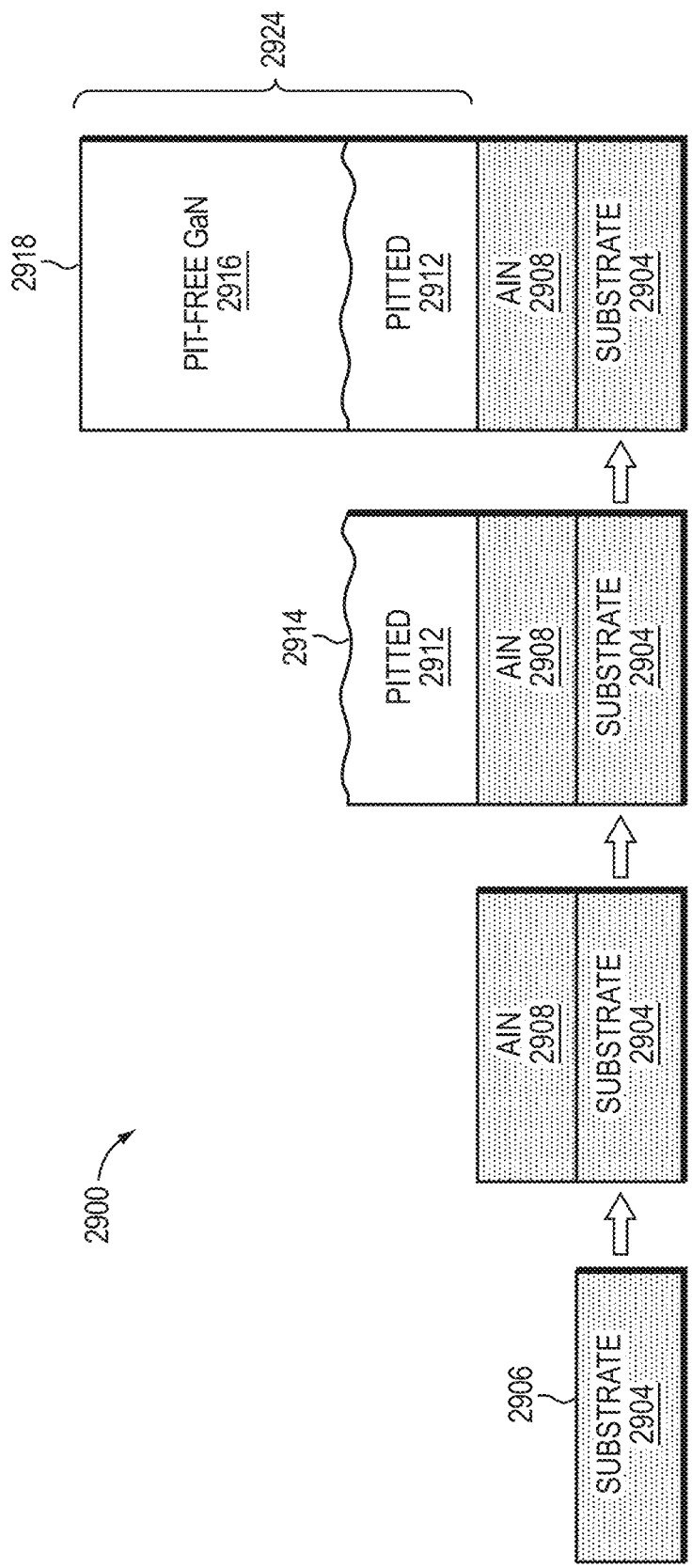
FIG. 29 is a schematic illustration of an example of a two-step GaN growth process of the present invention.

FIG. 29 is a schematic illustration of an exemplary growth process 2900 of the present invention. First, a substrate 2904 is provided. An epitaxial nitride (e.g., AlN) layer 2908 is then deposited on the substrate 2904. The deposition of the epitaxial nitride layer 2908 may be done in the same reactor for the subsequent GaN growth or in a different deposition chamber. GaN material is subsequently deposited on the nitride-coated substrate 2904/2908 by hydride vapor phase epitaxy in two steps with different growth conditions. A first GaN layer 2912 is grown under a condition that results in a pitted surface morphology, and such conditions are characterized by relatively higher growth rate, and/or high ammonia flow, and/or lower growth temperature than utilized during the second GaN growth step. A second GaN layer 2916 is then grown under a condition that fills the pits on the surface 2914 of the first GaN layer 2912 and yields pit-free smooth GaN layer, and such growth conditions are characterized by relatively lower growth rate, and/or lower ammonia flow, and/or higher growth temperature than employed in the first, pitted-growth step. The combination of the two GaN growth steps both eliminates the GaN microcracking during the growth and provides a smooth, low-defect GaN surface 2918 that is suitable for the further growth of devices based on Group III nitrides. The growth process 2900 yields a GaN film generally depicted at 2924 in FIG. 29.

The substrate 2904 may be any substrate that has a surface having a 3-fold symmetry or close to having a 3-fold symmetry. Some examples of the present disclosure utilize c-plane sapphire as the substrate 2904. Other substrates 2904 such as silicon, silicon carbide, diamond, lithium gallate, lithium aluminate, zinc oxide, spinel, magnesium oxide, and gallium arsenide may be utilized for the growth of low-defect, crack-free GaN films. In one example, the substrate 2904 has a characteristic dimension (e.g., diameter) of about 2 inches or greater. In other examples, the diameter of the substrate 2904 is about 2" or greater, about 3" or greater, about 4" or greater, or any other suitable size.

The substrate surface 2906 may be exactly c-plane or vicinal surfaces of the c-plane. Vicinal surfaces may promote step-flow during the HVPE GaN growth and may yield smoother surface morphology. The offcut angle of the vicinal surface with respect to the c-plane in one example ranges from about 0° to about 10°, in another example from about 0.1° to about 10°, and in another example from about 0.5° to about 5°. The direction of offcut may be along the <1-100> direction or along the <11-20> direction, or along a direction between <1-100> and <11-20>.

In some implementations, the deposition of the epitaxial nitride layer 2908 may be needed to grow single-crystalline GaN films on substrates 2904 such as sapphire substrates using the HVPE process. In one implementation, the epitaxial nitride layer 2908 is deposited by reactive sputtering on a heated substrate 2904 in a sputter deposition chamber. The nitride-coated substrate 2904/2908 is subsequently removed from the sputter chamber and loaded into the HVPE reactor for GaN growth. As alternatives to depositing AlN by HVPE, other nitride layers, such as AlN grown by MOCVD, GaN grown by MOCVD, AlGaN grown by MOCVD, and the like may also be used. A reactive sputtering-deposited AlN layer has the advantage of lower cost than MOCVD or MBE deposited nitride layers. AlN layers may also be grown in the HVPE reactor by incorporating an Al source so that hydrochloric acid reacts with Al to form aluminum chloride that reacts with ammonia in the deposition zone to form AlN on the substrate surface 2906.

Figure 30:
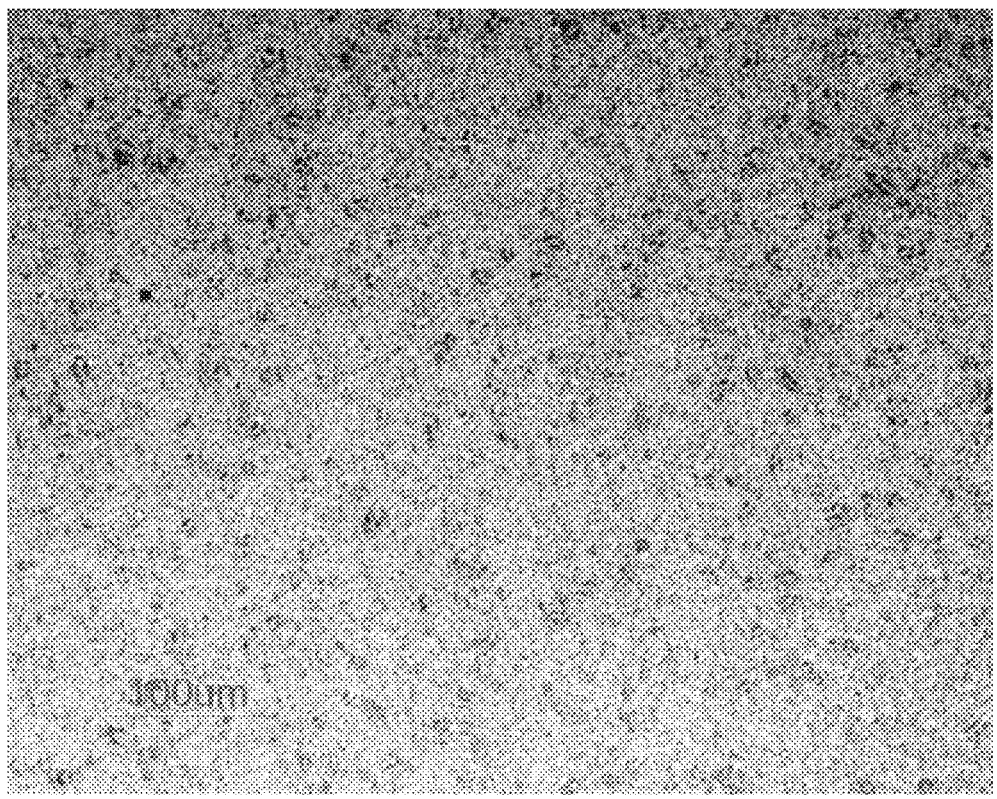
FIG. 30 is an optical micrograph at 200× magnification of the surface of a GaN layer at the end of a growth step in which the surface is pitted, according to one implementation of the present invention.

The growth of GaN film 2924 according to this implementation includes at least two growth steps with different growth conditions. The growth temperature is typically between 900° C. and 1100° C., the growth rate is typically between 5 and 500 microns per hour, and V:III ratio is typically between 5 and 100. The two-step GaN growth is characterized by the growth conditions of the first step having lower growth temperature, and/or higher ammonia flow, and/or higher growth rate than the second step. In one example, the growth temperature is about 15° C. hotter in the second step than in the first step, and the growth rate of the second step is about one-fourth of the first step. At the end of the first step, the GaN surface 2914 is rough and covered with the pits. If the growth is stopped at the end of the first step and wafer is taken out of the reactor, the GaN surface 2914 is not specular, as shown in a microphotograph in FIG. 30. The pit coverage, defined as the percentage of a surface covered with the pits on the surface, is in one example greater than about 50%, and in another example greater than about 75%, and in another example greater than about 90% at the end of the first GaN growth step. At the end of the second step, the GaN surface 2918 is smooth, specular and pit-free. The pit coverage in the final film is in one example less than 1%, in another example less than 0.1%, and in another example less than 0.01%.

The resulting GaN film 2924 may have a characteristic dimension (e.g., diameter) as large as the initial substrate 2904. As examples, when a 2" substrate 2904 is utilized, a 2" GaN film 2924 may be obtained. When a 3" substrate 2904 is utilized, a 3" GaN film 2924 may be obtained. When a 4" substrate 2904 is utilized, a 4" GaN film 2924 may be obtained. The thicknesses of the respective GaN layers 2912 and 2916 grown in the two steps is in one example in a ratio between about 2:1 and about 1:5, and in another example in a ratio between about 1:1 and about 1:3, and in another example in a ratio between about 1:1 and about 1:2. The exact conditions of the two steps may strongly depend on the reactor configuration and method of temperature measurement, and may be easily found by those skilled in the arts. The total thickness of the GaN film 2924 in one example ranges from approximately 10 to approximately 250 microns, in another example from approximately 10 to approximately 200 microns, and in another example from approximately 20 to approximately 100 microns, and in another example from approximately 20 to approximately 50 microns.

The HVPE GaN layers 2912 and 2916 may be grown without intentionally introduced impurities. However, because of the crystal defects and residual impurities such as oxygen and silicon from the reactor, an unintentionally doped GaN layer may still have n-type conductivity. The GaN may also be grown with the presence of intentionally introduced impurities such as silane or oxygen for n-type doping or magnesium for p-type doping. When transition metal impurities are introduced, the GaN film 2924 can be made semi-insulating. Transitional metal impurities, such as iron, may be introduced using, for example, volatile metal-organic compounds such as ferrocene. It will be understood that the growth conditions may be slightly different when the doping impurities are introduced. In one example, the dopant concentration (e.g., n-type, p-type, transition metal, etc.) is greater than about $1\times10^{18}$ cm$^{-2}$. In one example of a semi-insulating GaN film 2924 produced according to the present disclosure, the GaN film 2924 has a resistivity greater than about $1\times10^5$ ohm-cm.

Because of the thermal mismatch between the substrate 2904 and the GaN film 2924, the wafer is bowed after cooldown from the growth temperature to the ambient temperature. The bow of the wafer complicates the device fabrication process and a large bow of the wafer is not desirable. One aspect of the present invention is that the GaN material during growth develops a tensile stress that will compensate the thermal stress and reduce the wafer bow. The tensile stress of the GaN material during the growth is associated with the reduction of dislocations in the GaN material. In another implementation of the present invention, a thicker substrate 2904 may also be employed to reduce the GaN film bow. In another implementation, the backside of the substrate 2904 is mechanically lapped to introduce damage on the backside of the substrate 2904, which reduces the bow of the GaN film 2924 on the substrate 2904. In one example, the wafer bow is less than about 200 microns. In another example, the wafer bow is less than about 100 microns. In another example, the wafer bow is less than about 50 microns. In another example, the wafer bow is less than about 25 microns. Wafer bow may be defined as the deviation of the center point of the median surface of the wafer from a median-surface reference plane of the wafer.

Figure 31:
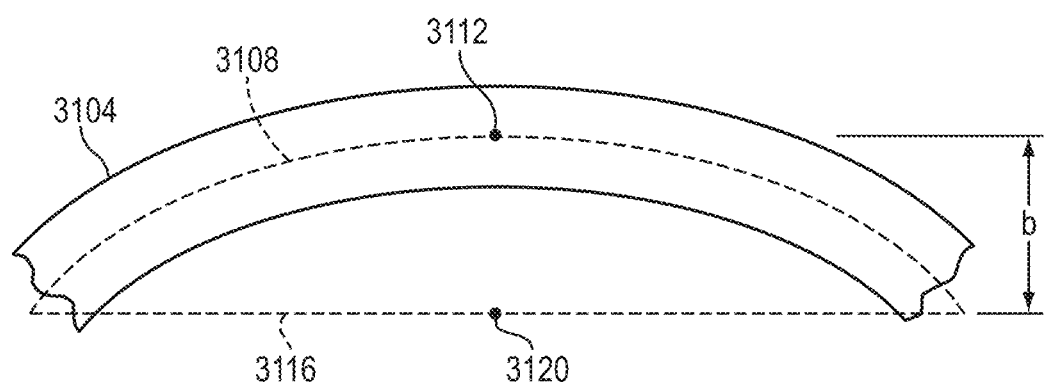
FIG. 31 is a cross-sectional view of a bowed wafer or layer of material.

As an example of wafer bowing, FIG. 31 illustrates a bowed wafer 3104 having a bowed median surface 3108 with a center point 3112. A median surface reference plane 3116 with a center point 3120 is established by three equally-spaced points on the median surface at the wafer circumference. In this example, the wafer bow b, projected to the right of the bowed wafer 3104, is the distance between the center point 3112 in the median surface of a free unclamped wafer and the center point 3120 in the median surface reference plane 3116. It will be understood that the radius of curvature of the bowed wafer 3104 as depicted in FIG. 31 is exaggerated for illustrative purposes.

The crystal defect density, specifically, threading dislocation density, decreases with the thickness of the GaN film grown. In implementations described in the present disclosure, the lattice mismatch between the GaN material and substrate that generates dislocation is first accommodated by the AlN layer. The dislocations in the GaN material are further annihilated during the two-step GaN growth. The reduction of dislocation density during HVPE GaN growth according to implementations described in the present disclosure is much faster than those disclosed in the prior arts. For example, U.S. Pat. Nos. 6,533,874 and 6,156,581 disclose a GaN base structure grown by an HVPE process. According to the prior art, the dislocation density of a 10-micron thick GaN film grown by HVPE on sapphire is approximately $10^9$ cm$^{-2}$, and the dislocation density is reduced to approximately $10^8$ cm$^{-2}$ for a 23-micron GaN film, and to approximately $10^7$ cm$^{-2}$ for a 300-micron GaN film. In implementations of the present invention, improved GaN films have been grown by HVPE on sapphire, as represented by the following examples: a dislocation density on the surface less than $10^8$ cm$^{-2}$ for a 10-micron GaN film, less than $5\times10^7$ cm$^{-2}$ for a 20-micron GaN film, and less than $2\times10^7$ cm$^{-2}$ for a 50-micron GaN film. The surface dislocation density of GaN film grown according to implementations of the present invention is approximately several factors lower than GaN films of the prior art at similar thickness. According to some examples of the invention, the threading dislocation density on the surface of the GaN film may be less than $1\times10^8$ cm$^{-2}$, in other examples less than $5\times10^7$ cm$^{-2}$, in other examples less than $1\times10^7$ cm$^{-2}$, and in other examples less than $5\times10^6$ cm$^{-2}$.

The wafer structure and method for making the structure of the present invention differ substantially from the prior art of U.S. Pat. Nos. 6,533,874 and 6,156,581. We were not able to grow device-quality epitaxial single-crystal GaN films using the methods taught by prior art such as in these patent references. By contrast, in accordance with the present invention, including the use of the epitaxial nitride template layer 2908 (FIG. 29) described above, we can reproducibly grow device-quality epitaxial single-crystal GaN films by HVPE. Additionally, the present invention discloses methods for eliminating GaN film microcracking during HVPE GaN growth. Microcracking of GaN film during the HVPE growth and methods for eliminating the growth microcracking have not been disclosed in the prior art. Implementations of the present invention employ a two-step HVPE GaN growth process to eliminate the growth microcracking and to produce smooth surfaces on the GaN films.

Low-defect single-crystal film of Group III nitride alloys, $Al_xGa_yIn_zN$ (x+y+z=1, 0≤x≤1, 0≤y≤1, 0≤z≤1), may be similarly grown according to additional embodiments of the present invention. An AlN nucleation layer is first deposited on a substrate. Single-crystal $Al_xGa_yIn_zN$ film is grown on the AlN-coated substrate by HVPE using the two-step growth process described above. The $Al_xGa_yIn_zN$ film is grown under a condition that yields a pitted surface morphology in the first step and then under a growth condition that promotes filling the pits to produce a smooth surface morphology in the second step. Typically, the first step has a lower growth temperature, and/or higher growth rate, and/or higher ammonia flow than the second growth step. The exact condition for the two-step $Al_xGa_yIn_zN$ growth depends on the reactor configuration and film composition, and may be easily determined by those skilled in the art. Thus, as previously noted, the term "GaN" encompasses "$Al_xGa_yIn_zN$."

Figure 32:
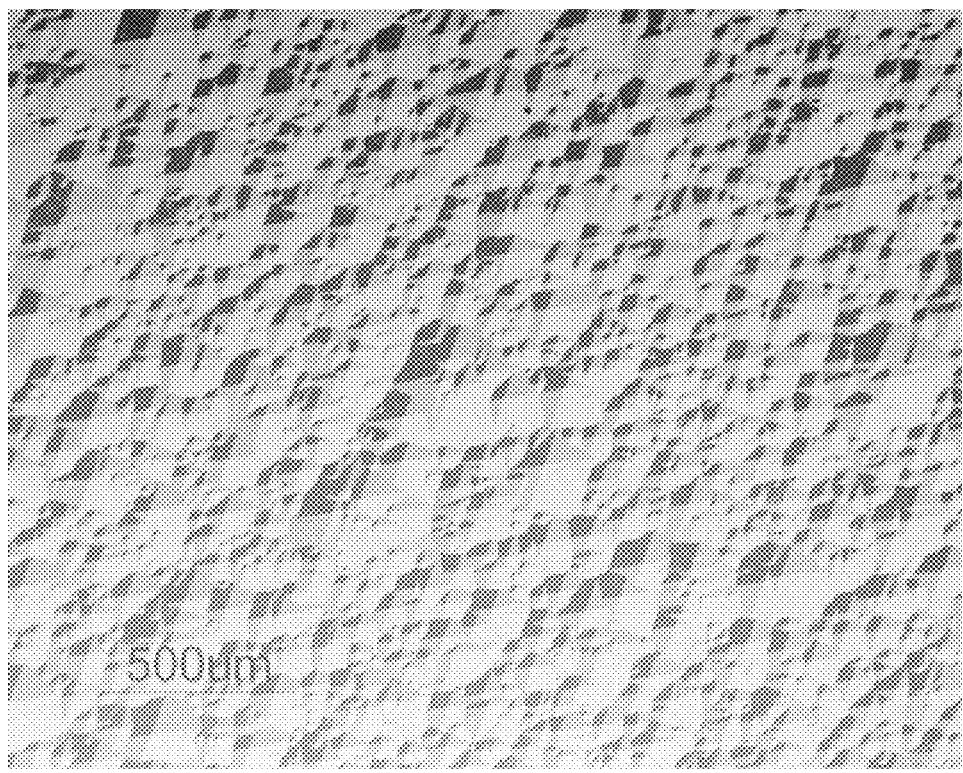
FIG. 32 is an optical micrograph at 50× magnification of the surface of an as-grown 60-micron GaN film on sapphire substrate, according to one implementation of the present invention.

The surface morphology of the low-defect GaN film 2924 may be further improved by using a chemical mechanical polish (CMP). The as-grown HVPE GaN film may exhibit some hillock features as shown in FIG. 32. In some applications, the macroscopic roughness of the GaN film surface 2918 (FIG. 29) is less desirable for further device layer growth. The GaN film surface 2918 may be improved by chemical mechanical polish. The CMP process does not produce surface and subsurface damage on the GaN film surface 2918 because of the active chemical etching during the polish.

The present invention can be further understood by following illustrative, non-limiting examples.

Example 9

Low-Defect GaN Film Growth

In this example, we illustrate the growth of a high-quality, low-defect GaN film suitable for the further growth of electronic and optoelectronic devices. A 2"-diameter, 430-micron thick sapphire was used as the starting substrate. Using the sputtering method disclosed in U.S. Pat. No. 6,784,085, an AlN layer approximately 0.7 µm thick was grown on the sapphire substrate for use as a template layer for the HVPE GaN growth. X-ray diffraction was used to verify the AlN film was single-crystal. The AlN/sapphire structure was loaded into a vertical HVPE system and the GaN growth was commenced.

The HVPE GaN film was grown by a two-step method. The GaN film was first grown under conditions of growth rate of approximately 260 microns per hour, growth temperature of 955° C., HCl flow rate of 92 sccm, and $NH_3$ flow rate of 2500 sccm. After growth of approximately 4 minutes under these growth conditions, the growth rate was reduced to approximately 65 microns per hour by reducing HCl flow to 23 sccm, and growth temperature was raised by 20° C. After growth of approximately 7 minutes under these conditions, the $NH_3$ flow was further reduced to 750 sccm for approximately 32 minutes. The total grown GaN film thickness was approximately 60 microns. The bow of the wafer was approximately 190 microns. The GaN film was specular visually, and under optical microscope observation, hillock features were present on the surface as shown in FIG. 32.

Figure 33:
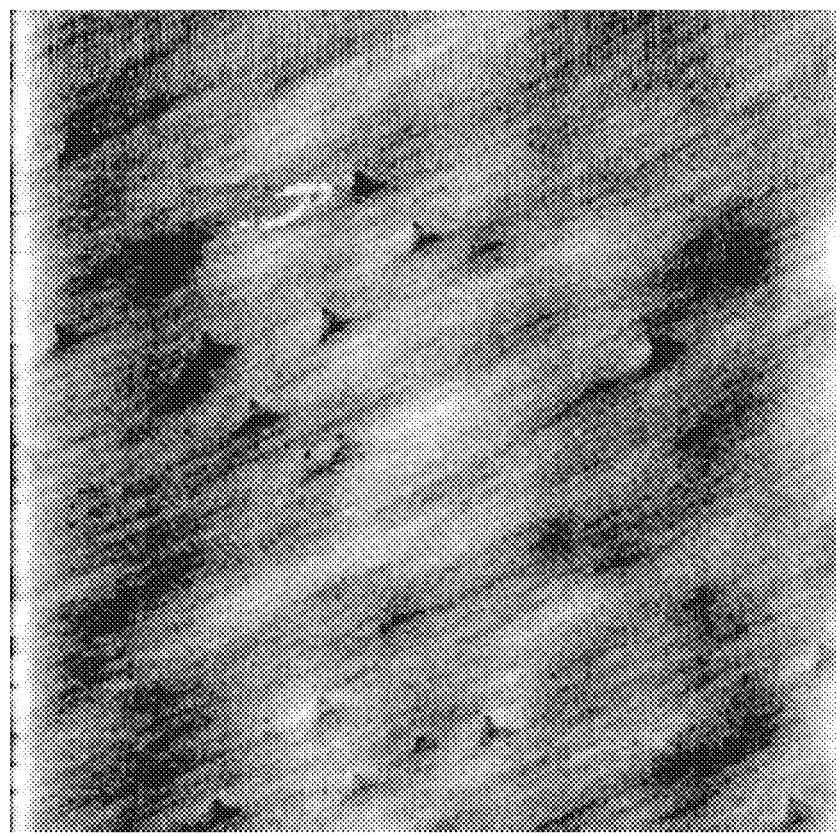
FIG. 33 is a 10×10-micron AFM scan of a 60-micron thick GaN film on sapphire, grown according to one implementation of the present invention.

An atomic force microscope (AFM) was used to image the wafer surface and to measure the threading dislocation density. A threading dislocation terminates on the surface as a pit that can be observed with AFM. FIG. 33 is a 10-micron by 10-micron AFM scan of the wafer surface. The pit density, i.e., the threading dislocation density on the surface, was approximately $1.9 \times 10^7$ $cm^{-2}$.

Example 10

Low-Defect GaN Film Growth

In this example, we illustrate the growth of another high-quality, low-defect GaN film suitable for the further growth of electronic and optoelectronic devices. A 2"-diameter 430-micron thick sapphire was used as the starting substrate. Using the sputtering method disclosed in U.S. Pat. No. 6,784,085, an AlN layer approximately 0.7 µm thick was grown on the sapphire substrate for use as a template layer for the HVPE GaN growth. The AlN/sapphire structure was loaded into a vertical HVPE system and the GaN growth was commenced.

The HVPE GaN film was grown by a two-step method. The GaN film was first grown under conditions of growth rate of approximately 260 microns per hour, growth temperature of 955° C., HCl flow rate of 92 sccm, and $NH_3$ flow rate of 2500 sccm. After growth of approximately 3 minutes under these growth conditions, the growth rate was reduced to approximately 30 microns per hour by reducing the HCl flow rate to 10 sccm. At the same time, the growth temperature was raised by 20° C. and the $NH_3$ flow rate was reduced to 400 sccm for an additional 25 minutes. The total grown GaN film thickness was approximately 25 microns. The bow of the wafer was approximately 95 microns. The GaN film was specular visually, and under optical microscope observation hillock features were present on the surface.

Example 11

Low-Defect GaN Film Growth with Lapping Treatment

The GaN film on sapphire obtained from Example 10 is mounted on a stainless steel plate using wax with the GaN film facing the plate. The backside of the sapphire substrate is lapped on a metal lapping plate with 30-micron diamond slurry. After removing approximately 10 microns from the backside of the sapphire substrate, the wafer bow is reduced from approximately 95 microns to approximately 40 microns.

Example 12

Low-Defect GaN Film Growth with Polishing Treatment

The GaN film on sapphire obtained from Example 11 is mounted on a stainless steel plate using wax with the GaN film facing up. The surface of the GaN film is then chemical mechanically polished to remove approximately one micron of surface material. The root-mean square (RMS) surface roughness of the GaN film is reduced from approximately 5 nm for the as-grown film to approximately 0.5 nm or less for the CMP polished surface.

Inclusion-Free Uniform Semi-Insulating Group III Nitride Substrates and Methods for Making Same As noted above, semi-insulating GaN substrates can be fabricated when deep-level impurities are introduced during the growth process. An iron impurity, for example, may be introduced into the reactor vessel by using a suitable iron source such as, for example, ferrocene (bis(cyclopentadienyl) iron).

FIG. 16 is an optical picture of an as-grown iron-doped GaN substrate grown according to methods described above. The iron-doped GaN is semi-insulating as measured with contactless resistivity mapping (COREMA) and Hall measurement techniques. A 10 mm×10 mm polished GaN wafer was obtained from the wafer and the resistivity of the piece was measured. FIG. 19 shows the Hall resistivity and carrier concentration as a function of temperature. The room temperature resistivity of the sample was greater than about $2\times10^8$ ohm-cm. FIG. 20 is a COREMA resistivity map of a 10 mm×10 mm GaN substrate obtained from the iron-doped GaN wafer. The mean room temperature resistivity was about $1\times10^9$ ohm-cm and the minimum resistivity measured on the sample was about $5\times10^8$ ohm-cm.

Figure 34:
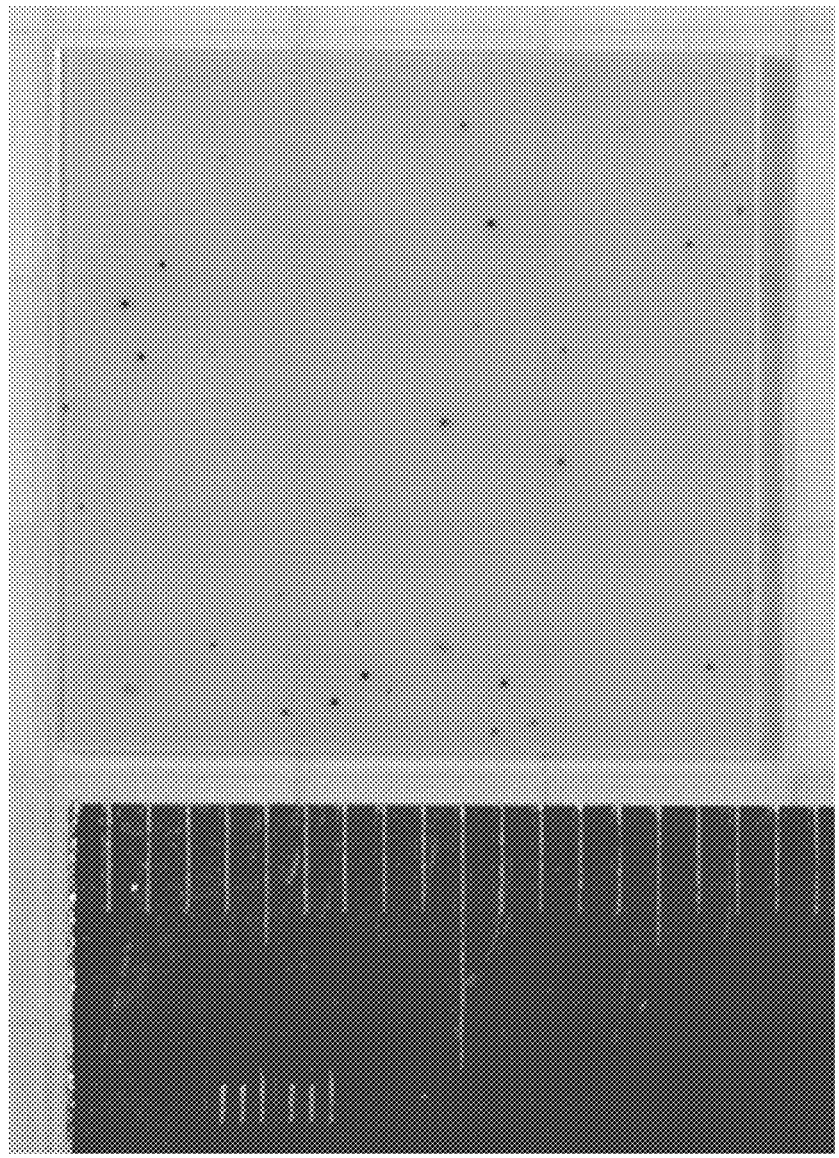
FIG. 34 is a photograph of an iron-doped GaN wafer showing a few brown inclusions.

The GaN obtained according to methods described above still has a few pits as shown in FIG. 16. These pits may be removed by mechanically grinding or lapping away the surrounding materials and polishing the surface to a mirror finish. FIG. 34 shows a photograph of a polished GaN wafer, showing some inclusions of brown or darker materials in the wafer. The brown inclusions correspond to the areas where pits were present prior to the polishing. The inclusions are still single-crystal gallium nitride, but with different impurity levels, in particular, with higher oxygen impurity in the inclusion than the surrounding area.

The resistivity of the iron-doped GaN wafers with a few brown inclusions were measured with Hall and COREMA methods, and were found be semi-insulating (above $1\times10^8$ ohm-cm). The resistivity of the wafers was also measured with the Lehighton method using a LEI 1500 sheet resistance mapping system manufactured by Lehighton Electronics, Inc. The Lehighton method is a known method for measuring the sheet resistance of semi-insulating wafers, such as semi-insulating GaAs. When the sheet resistance of a wafer above $1\times10^5$ ohm is measured with the Lehighton method, it is considered off-scale for the Lehighton measurement, and the wafer is considered as semi-insulating. We measured a set of polished wafers that contained a few brown inclusions with the Lehighton method and found that typical sheet resistance was between 50 and 5000 ohm/sq, and resistivity was between 2.5 and 250 ohm-cm, much lower than the value obtained with Hall and COREMA measurements.

The discrepancy between the Lehighton measurement and the COREMA measurement may be explained by the physical nature of the measurement techniques. The Lehighton measurement is based on eddy current and measures the sampling area in parallel, whereas the COREMA measurement is based on capacitance and measures the sampling area in series. If the resistivity within the sampling area is not uniform, the resistivity data obtained by the Lehighton technique will be dominated by the low-resistivity area, whereas the resistivity data obtained by COREMA measurement will be dominated by the high-resistivity area. The brown spots (inclusions) have higher donor impurity concentration and lower resistivity. The inclusion of low-resistivity material reduces performance and yield of the electronic devices grown on the substrate.

Methods for Producing Inclusion-Free Uniform Semi-Insulating GaN

The present invention discloses methods for producing uniform semi-insulating gallium nitride, without inclusion of conductive spots. In one aspect of the present invention, the morphology of the growth surface is essentially pit-free during the HVPE growth of semi-insulating GaN on c-plane substrate. The presence of pits during the SI GaN growth is the source of the inclusion of conductive spots. The elimination of the pits during the growth eliminates the conductive spots in the SI GaN substrates.

In one implementation, the uniform semi-insulating GaN without inclusion of conductive spots is made from HVPE GaN growth on a sapphire substrate. The growth process is similar to SI GaN growth methods described above, but with improvements that ensure complete elimination of pits during the later stage of the growth. The present method will be described by with reference to FIGS. 35 and 36.

Figure 35:
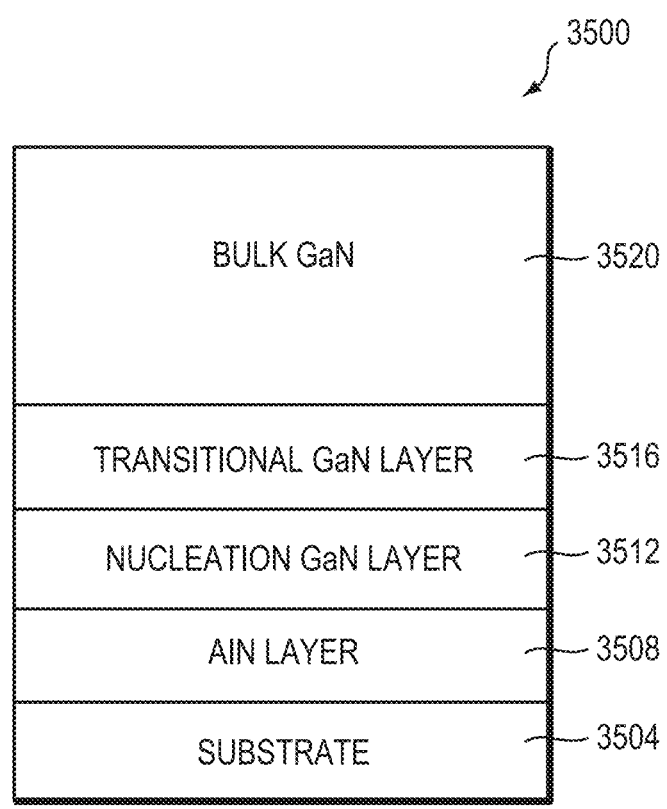
FIG. 35 is a schematic view of a GaN crystal structure that includes a bulk GaN crystal grown on a substrate, showing different layers of the crystal structure.

Referring to FIG. 35, a suitable substrate 3504 is provided. In some implementations, the substrate 3504 may have a characteristic dimension (e.g., diameter) of about 2 inches or greater. As further examples, the diameter of the substrate 3504 may be about 3" or greater, about 4" or greater, or any other suitable size such as about 12" or greater. The substrate 3504 may be sapphire ($Al_2O_3$), although other suitable single-crystal substrates 3504 may be utilized.

The surface of the substrate 3504 may be exactly c-plane or vicinal surfaces of the c-plane. Vicinal surfaces may promote step-flow during the HVPE GaN growth and may yield smoother surface morphology. The offcut angle of the vicinal surface with respect to the c-plane is in one example between about 0.1° and about 10°, and in another example between about 0.5° and about 5°. The direction of offcut may be along the <1-100> direction or along the <11-20> direction, or along a direction between <1-100> and <11-20>.

An epitaxial nitride (e.g., AlN) layer 3508 is then deposited on the substrate 3504. The purpose of this epitaxial nitride layer 3508 is to provide a template for epitaxial growth of GaN. The deposition of epitaxial nitride layer 3508 may be done in the same reactor as for the subsequent GaN growth, or in a different deposition chamber. In one implementation, the epitaxial nitride layer 3508 is deposited by reactive sputtering on a heated substrate in a sputter deposition chamber. The nitride-coated substrate 3504/3508 is subsequently removed from the sputter chamber and loaded into the HVPE reactor for GaN growth. Other nitride layers such as, for example, AlN grown by MOCVD or MBE, GaN grown by MOCVD or MBE, AlGaN grown by MOCVD or MBE, or the like may also be used. In some implementations, a reactive sputtering-deposited AlN layer has an advantage of lower cost than MOCVD- or MBE-deposited nitride layers. AlN layers may also be grown in the HVPE reactor by incorporating an Al source so that hydrochloric acid reacts with Al to form aluminum chloride, which reacts with ammonia in the deposition zone to form AlN on the substrate surface. In one example, the thickness of the epitaxial nitride layer 3508 is in the range (ranges) from about 0.01 to about 2 microns. In another example, the thickness of the epitaxial nitride layer 3508 ranges from about 0.05 to about 10 microns. In another example, the thickness of the epitaxial nitride layer 3508 ranges from about 0.05 to about 2 microns. In another example, the thickness of the epitaxial nitride layer 3508 ranges from about 0.2 to about 2 microns.

In some implementations, depending on such factors as process conditions and the specific reactor being employed, the deposition of the epitaxial nitride layer 3508 may be desirable for growing single-crystal GaN films on sapphire substrates using the HVPE process. In other HVPE reactor systems, however, the single-crystalline GaN layer 3512 may be grown directly on the substrate 3504 by HVPE without using a template layer such as the epitaxial nitride layer 3508 prior to HVPE growth. In such cases, the growth sequence according to the teaching of the present invention can skip the nitride-coating step and proceed directly to the next growth step.

The second step of the growth process is to grow an epitaxial GaN layer 3512 via 3D growth mode by hydride vapor phase epitaxy with a growth condition that yields a pitted surface morphology. The uncoated substrate 3504 or nitride-coated substrate 3504/3508 is loaded into an HVPE reactor, and the reactor may be purged with high-purity nitrogen to remove impurities. An epitaxial layer 3512 of gallium nitride is then grown. This GaN layer 3512 is grown in a three-dimensional (3D) growth mode, where the surface of the film is very rough and covered with pits. The purpose of this single-crystal but pitted GaN layer 3512 is to prevent future microcracking during growth. Without this pitted, rough GaN layer 3512, a smooth GaN layer grown on an AlN-coated sapphire substrate typically microcracks when the thickness of the smooth layer is greater than about 20 microns. The growth condition for the pitted layer 3512 is typically a higher growth rate, and/or higher ammonia flow (or V:III ratio), and/or lower growth temperature than the optimal thin-film growth condition that would produce a smooth surface morphology.

In one example, the thickness of the 3D growth layer 3512 ranges from about 5 to about 100 microns. In another example, the thickness of the 3D growth layer 3512 ranges from about 10 to about 50 microns. In another example, the thickness of the 3D growth layer 3512 ranges from about 20 to about 30 microns. In another example, the thickness of the 3D growth layer 3512 is about 20 microns. The surface coverage of pits, which is defined as the percentage of the area covered with pits over the total c-plane growth area, is in one example greater than about 50%, in another example greater than about 75%, and in another example greater than about 90% at the end of this step. The distribution of pits, i.e., the size of pits and the depth of pits, is preferably a normal distribution. The aspect ratio of the pits, defined as the depth of the pit divided by the diameter of the pit, is in some implementations preferred to be a constant. Additional gaseous hydrochloric acid that does not go through the gallium metal (i.e., does not produce GaCl) may be added to the reactor and the flow rate of the gas controlled to achieve a constant aspect ratio of the pits. A deep-level compensating dopant, such as iron, may be optionally introduced in this step.

In one implementation, the growth temperature in the 3D growth mode ranges from about 900° C. to about 1000° C., the V:III ratio in the 3D growth mode ranges from about 10 to about 100, and the growth rate in the 3D growth mode ranges from about 50 µm/hr to about 500 µm/hr.

The third step of the growth process changes the HVPE growth conditions to transition the surface morphology from a heavily pitted surface morphology to a gradually less pitted surface morphology. The transition layer 3516 is grown under conditions such as lower growth rate, and/or lower ammonia flow, and/or higher growth temperature than the growth condition of the 3D nucleation layer 3512. In one example, the thickness of this morphology transition layer 3516 ranges from about 5 to about 500 microns. In another example, the thickness of the transition layer 3516 ranges from about 10 to about 200 microns. The purposes of the transition layer 3516 are to prevent the GaN film from turning polycrystalline, and to prepare the film with a stress state that facilitates the formation of lateral cracks during cool-down.

At the end of growth of the transitional layer 3516, the growth surface is substantially pit-free. Because nucleation growth conditions are used in the second step that yield pits with preferably uniform characteristics, such as same aspect ratio and crystal orientations of the faces of the pits, most pits can be closed during the growth of the transitional layer 3516. The surface coverage of pits at the end of growth of the transitional layer 3516 is in one example less than about 10%, in another example less than about 5%, and in another example less than about 1%. Deep-level compensating doping, such as with iron, may be introduced in this step. Iron doping may be achieved, for example, by introduction of a volatile metal organic compound such as ferrocene into the reactor.

In one implementation, the growth temperature in the transitional layer growth mode ranges from about 920° C. to about 1100° C., the V:III ratio in the transitional layer growth mode ranges from about 8 to about 80, and the growth rate in the transitional layer growth mode ranges from about 50 µm/hr to about 500 µm/hr.

The fourth growth step is the bulk growth step where the bulk of the GaN film is grown. As illustrated in FIG. 35, a bulk layer or crystal 3520 is grown on the transition layer 3516. The growth condition is chosen to further eliminate any remaining pits so that the morphology of the GaN film is essentially pit-free and the GaN growth mode in this step is substantially a 2D growth mode. The bulk growth conditions may be lower ammonia flow and/or higher growth temperature than employed during the transitional layer step. At the end of the bulk growth, the GaN surface is essentially pit-free. The density of surface pits at the end of bulk growth is in one example less than about 5 $cm^{-2}$, in another example less than about 1 $cm^{-2}$, and in another example about 0 $cm^{-2}$. The thickness of the GaN grown in the fourth bulk growth step in one example ranges from about 500 to about 2000 microns (about 0.5 to about 2 mm), and in another example ranges from about 1000 to about 1500 microns (about 1 to about 1.5 mm). Deep-level compensating doping, such as iron, may be introduced in this step. Iron doping may be achieved, for example, by introduction of a volatile metal organic compound such as ferrocene into the reactor.

In one implementation, the growth temperature during the bulk growth step ranges from about 950° C. to about 1100° C., the V:III ratio during the bulk growth step ranges from about 5 to about 50, and the growth rate during the bulk growth step ranges from about 50 µm/hr to about 500 µm/hr.

Figure 36:
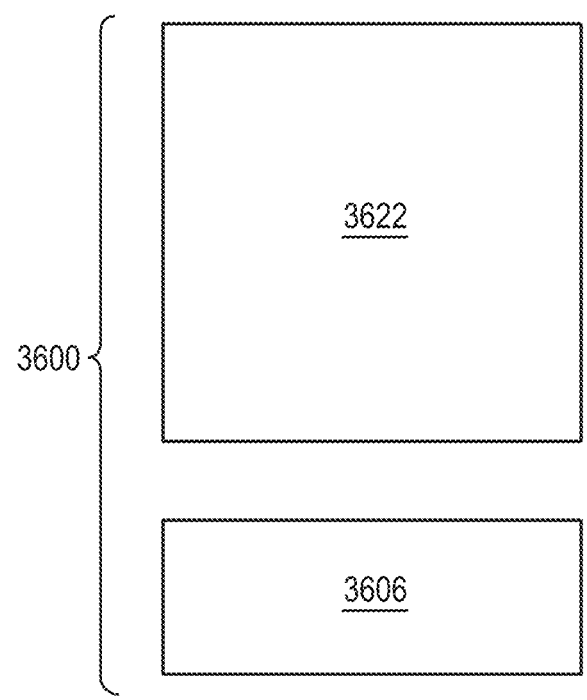
FIG. 36 is a schematic view of the GaN crystal structure illustrated in FIG. 35 after self-separation, yielding a freestanding GaN crystal separate from the underlying substrate.

Referring to FIG. 36, after completing the growth, the thick GaN-on-substrate bi-layer 3600 is gradually cooled down. The cooling rate is in one example less than about 20° C. per minute, and in another example less than about 10° C. per minute. In another example, the rate of cooling is about 6° C. per minute. During this cool down time, lateral cracking occurs in the GaN film with the crack plane essentially parallel to the GaN/sapphire interface, leading to the separation of GaN from the underlying substrate. A thick GaN article or wafer 3622 having a characteristic dimension (e.g., diameter) as large as the initial substrate 3504 (FIG. 35) may be obtained, along with the substrate 3606 covered with a thin layer of GaN. For instance, when a 2" substrate 3504 is utilized, a 2" GaN article 3622 may be obtained. When a 3" substrate 3504 is utilized, a 3" GaN article 3622 may be obtained. In some examples, the GaN article 3622 may be broken into several large pieces during cool down, in which case large pieces may be sized into desired wafer shapes such as a circle (optionally with flat) or rectangle (optionally with flat).

The thick, freestanding GaN wafers 3622 may be further processed into uniform semi-insulating GaN wafers by using lapping, polishing and chemical mechanical polishing. Because the GaN layer 3520 was first grown with a pitted surface morphology which has more oxygen incorporation and thus lower resistivity on the backside, the more conductive layer near the backside of the article 3622 may be completely removed to ensure the semi-insulating nature of the wafer. In one example, the freestanding GaN article 3622 is first sized into a desired wafer shape (herein defined as a wafer blank), optionally with major and minor flats to indicate the crystal orientation of the substrate. In one example, the sized GaN wafer blank is about 10 mm×10 mm square or greater—i.e., the sized GaN wafer blank includes a side having a length of about 10 mm or greater. In another example, the sized GaN wafer blank is about 18 mm×18 mm square. In another example, the sized GaN wafer blank is about 1 inch round or greater—i.e., the sized GaN wafer blank is circular and has a diameter of about 1 inch or greater. In another example, the sized GaN wafer blank is about 2 inches round or greater. The front of the wafer blank is the Ga-face and the back of the wafer blank is the nitrogen-face of the single-crystalline GaN. Material may be removed from the back side of the wafer blank by mechanical means such as grinding and/or lapping. The thickness removed from the back side of the wafer blank may be at least as much as or greater than the thickness of the grown transitional layer. The front side (Ga face) may be further polished with diamond slurry. The Ga-surface may be finished with a chemical-mechanical polish step that removes the surface and subsurface damage and produces an epi-ready surface. The back side of the wafer blank may be processed by mechanical means such as grinding or lapping to planarize (mechanically flatten) the surface and to achieve the desired wafer thickness. Since the crystal defect density is reduced during the growth of single-crystalline GaN, it may be preferable to take away material from the back side to achieve the desired wafer thickness. Optionally, the back side may be polished to produce an optical finish.

Figure 37:
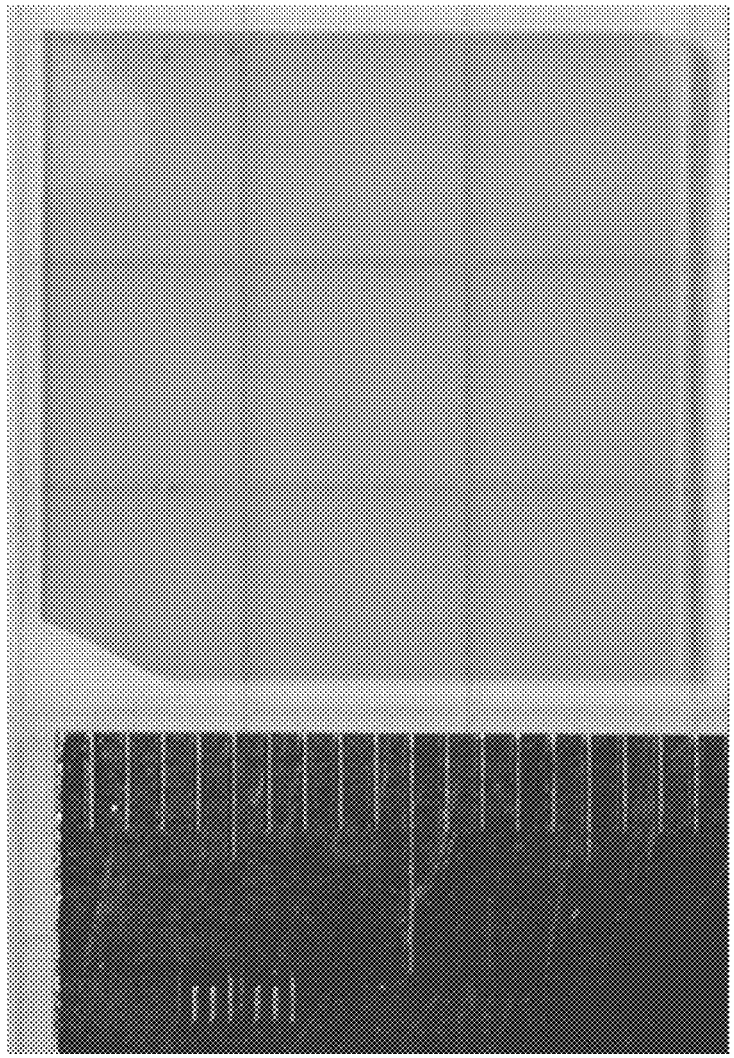
FIG. 37 is a photograph of an inclusion-free semi-insulating GaN wafer obtained according to one implementation of the present invention.

FIG. 37 shows a photograph of an inclusion-free uniform semi-insulating GaN wafer produced according to one implementation of the invention. No brown inclusion is present on the wafer. Lehighton resistivity mapping measurement of the wafers produced with the methods described in this disclosure shows that the sheet resistance of the wafer is off-scale of the instrument, and thus the wafers are semi-insulating in nature.

In another implementation of the present invention, a native GaN seed is utilized for making inclusion-free semi-insulating GaN wafers. The c-plane GaN seed wafer is chemical-mechanically polished to remove any residual surface and subsurface damage from the mechanical polish process. After a thorough cleaning of the seed wafer, it is loaded into a HVPE reactor. Gallium nitride film is grown on the GaN seed by the HVPE process. Ferrocene as an iron-doping source is introduced for yielding semi-insulating GaN. The growth condition is chosen to ensure that the surface of the growing GaN crystal (growth surface) remains pit-free during the entire growth process. Typical growth conditions for this implementation are: growth rate about 100-400 microns per hour, growth temperature about 950-1050° C., $NH_3/GaCl$ (V/III) ratio about 5-50, and reactor pressure about 100-760 Torr. It will be understood, however, that the various growth conditions are not limited to the foregoing ranges. The exact conditions for the growth depend on the reactor configuration, and may be determined by those who are familiar with the art. An aspect of the invention is to maintain the growth surface and morphology pit-free during the entire growth process. Under a condition of lower temperature and/or higher V/III ratio than the optimal growth condition window, pits can be formed on the growth surface, which is undesirable. The iron-doped GaN crystal is grown on the GaN seed crystal by hydride vapor phase epitaxy under optimal growth conditions that maintain the pit-free growth surface morphology. In one example, the length of the grown GaN crystal is about 1 mm or greater. In another example, the length of the GaN crystal is about 5 mm or greater. In another example, the length of the GaN crystal is about 1 cm or greater. The grown GaN crystal may be sliced into multiple wafers, which may be further processed into epi-ready GaN wafers by mechanical and chemical-mechanical polishing. The density of the brown spot inclusion is minimal. In one example, the density of the grown spot inclusion is equal to or less than about 1 $cm^{-2}$. In another example, the density of the brown spot inclusion is about 0 $cm^{-2}$.

In conjunction with the above-described implementations, the iron doping level in the iron-doped semi-insulating GaN crystal may be controlled by the partial pressure of the volatile iron compound in the gas flow. When ferrocene is used as the iron source, the amount of ferrocene transported from the ferrocene bubbler to the reactor is determined by the bubbler temperature and carrier gas flow. In general, the higher concentration of the volatile iron compound in the gas phase corresponds to a higher concentration of iron in the grown GaN crystal. The exact relationship between the iron concentration in the GaN crystal and the flow of iron compound depends on the reactor configuration, and can be determined by those skilled in the art. The iron concentration should be higher than the total concentration of n-type impurities and defects. In one example, the iron concentration ranges from about $10^{16}$ to about $10^{19}$ $cm^{-3}$. The iron-doped GaN is semi-insulating. In one example, the resistivity is greater than about $1 \times 10^7$ ohm-cm.

Other deep-level acceptors may alternatively be introduced into the gallium nitride crystal by using proper precursors. For instance, transition metals (e.g., Fe, Ni, Co, Mn, Cr, etc.) may be introduced into the HVPE reactor by the respective metal-organics, or by reacting the respective metal element with gaseous hydrochloric acid.

The n-type impurities such as silicon and oxygen in the GaN crystal should be reduced to a minimum. Some precautionary steps may be used to reduce oxygen impurities in the GaN crystal grown by HVPE methods. The reactor should be leak-tight. A sufficient purge time should be allowed after loading the substrate into the reactor and prior to crystal growth. A load-lock system may be employed for the substrate loading to prevent the exposure of the reactor interior to the ambient air during loading of the substrate. Purification of gas sources to remove oxygen impurities may be implemented. In one example, the concentration of n-type impurities is less than about $10^{17}$ $cm^{-3}$, in another example less than about $5 \times 10^{16}$ $cm^{-3}$, and in another example less than about $10^{16}$ $cm^{-3}$.

Certain implementations of the present invention may be further understood by following illustrative, non-limiting example.

Example 13

Semi-Insulating GaN Growth

In this example, we illustrate a method for making an inclusion-free uniform semi-insulating GaN substrate. Sapphire(0001) was used as the starting substrate. An AlN layer approximately 0.25 μm thick was grown on the sapphire substrate by carrying out reactive sputtering on the heated substrate. X-ray diffraction was used to verify the AlN film was single-crystal with full width at half maximum (FWHM) of 55 arcsec. The AlN/sapphire structure was loaded into the previously described vertical HVPE system 100 (FIG. 1) and the GaN growth was commenced.

The HVPE GaN film was grown by a multiple-step method. The GaN film was first grown under conditions of growth rate of approximately 260 microns per hour, growth temperature of 968° C., HCl flow rate of 92 sccm, and $NH_3$ flow rate of 2000 sccm. This layer was grown on the AlN-coated surface under a 3D growth mode. The growth time for the nucleation layer was approximately 4 minutes and the thickness of this layer was approximately 18 microns. In some runs, the growth was stopped at this point, and the wafer was taken out of the reactor for examination. The wafer surface was visually not specular, and appeared rough. Under microscope examination, the surface was covered with a high density of pits.

After growth of the nucleation layer, the growth rate was reduced to approximately 65 microns per hour by reducing HCl flow to 23 sccm while keeping the same $NH_3$ flow and growth temperature. After growth for approximately 7 minutes under these conditions, the HCl flow was increased to 46 sccm, the $NH_3$ flow was reduced to 1500 sccm and growth temperature was raised by 15° C. to 983° C. for approximately 1 hour. These two growth conditions were considered as the transitional layer growth stage where surface morphology was improved with less pits. Ferrocene was introduced in the growth system with a nitrogen carrier gas flow of 200 sccm. In some runs, the growth was stopped at this point and the wafer was taken out of the reactor for examination. The wafer surface was visually specular and smooth. A few pits still remained, but the percentage of the surface covered by pits was less than 1%. The growth mode was transitioned from the 3D mode of the nucleation to a 2D growth mode during this step.

After the growth of the transitional layer, the $NH_3$ flow was further reduced to 900 sccm for an additional growth time of 7 hours. Ferrocene was introduced in the growth system with a nitrogen carrier gas flow of 200 sccm. This was the bulk growth step.

Figure 38:
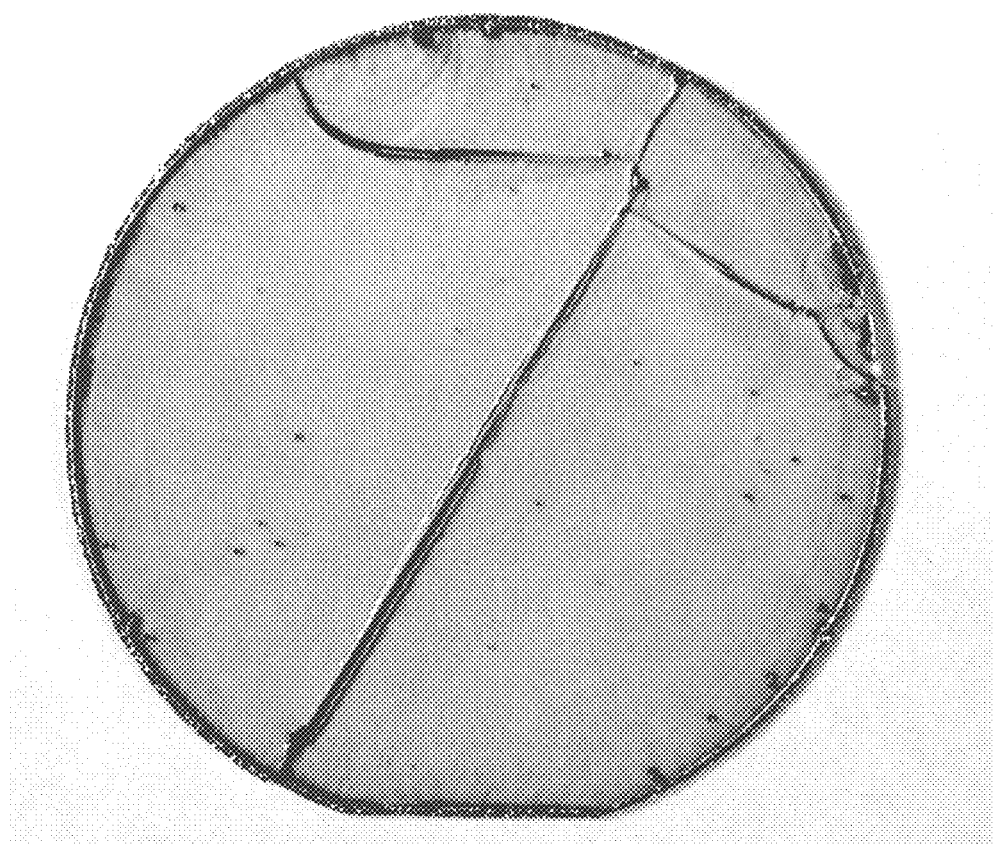
FIG. 38 is a photograph of 2" freestanding substrate separated from sapphire after cooling from the growth temperature.

After completion of the growth sequence, the resulting GaN/sapphire bi-layer was cooled to room temperature at a cooling rate of approximately 6° C. per minute. During the cooling process, the sapphire substrate completely delaminated from the GaN/sapphire bi-layer, thereby forming a freestanding GaN substrate. FIG. 38 is an optical picture of the GaN substrate obtained in this example. The GaN substrate was 2 inches in diameter and the thickness of the substrate was approximately 1.2 mm. The wafer was broken into two large pieces during the separation process. The surface was almost pit-free, which is a significant improvement when compared to the wafer in FIG. 16 obtained using other GaN growth methods described above.

The as-grown freestanding GaN was cut into 18×18 mm and 10×10 mm wafers. The front surface (Ga-face) was lightly ground to even the surface and approximately 700 microns of the back side was ground away to eliminate any potential conductive layer. The front side was further polished with a diamond slurry that had diamond particles of approximately 2-4 microns in diameter. The GaN was finished with a chemical mechanical polishing process to remove any surface and subsurface damage. The finished wafer was approximately 500 microns thick. FIG. 37 is a photograph of a 18×18 mm inclusion-free substrate obtained in this example.

The crystal defect density was analyzed by etching with phosphoric acid heated to approximately 240° C. to create etch pits and the density of the etch pits was measured with an atomic force microscope. The etch pit density, which corresponds to the threading dislocation density, was approximately $5 \times 10^6$ cm$^{-2}$ for the wafers obtained in this example.

The electric property of the wafers was measured with contactless resistivity mapping (COREMA) and Lehighton techniques. The room temperature resistivity of the sample was greater than $2 \times 10^8$ ohm-cm based on COREMA measurement. The sheet resistance of the wafer was greater than $1 \times 10^5$ ohm/square based on Lehighton measurements. Both techniques showed uniform resistive electric properties within the spatial resolution of the instruments. The wafers obtained in this example were uniformly semi-insulating, and were absent of brown spot inclusions. On the other hand, some wafers obtained using other methods described above had inclusion of brown spots and a sheet resistance of less than 1000 ohm/square measured by the Lehighton method, although COREMA measurements showed resistivity greater than $2 \times 10^8$ ohm-cm.

Single Crystal Group III Nitride Articles and Methods for Producing Same by HVPE Method Incorporating a Polycrystalline Layer for Yield Enhancement Methods for Producing GaN Articles with the Use of a Polycrystalline Layer In some cases, methods of GaN substrate production described above for making a freestanding substrate may suffer a drawback; namely, GaN may also break during the separation, reducing the yield of the process. According to the present disclosure, such methods may be further improved by introducing a mechanically stronger polycrystalline layer to cap the single-crystalline GaN layer, thus improving the yield of the process.

Figure 39:
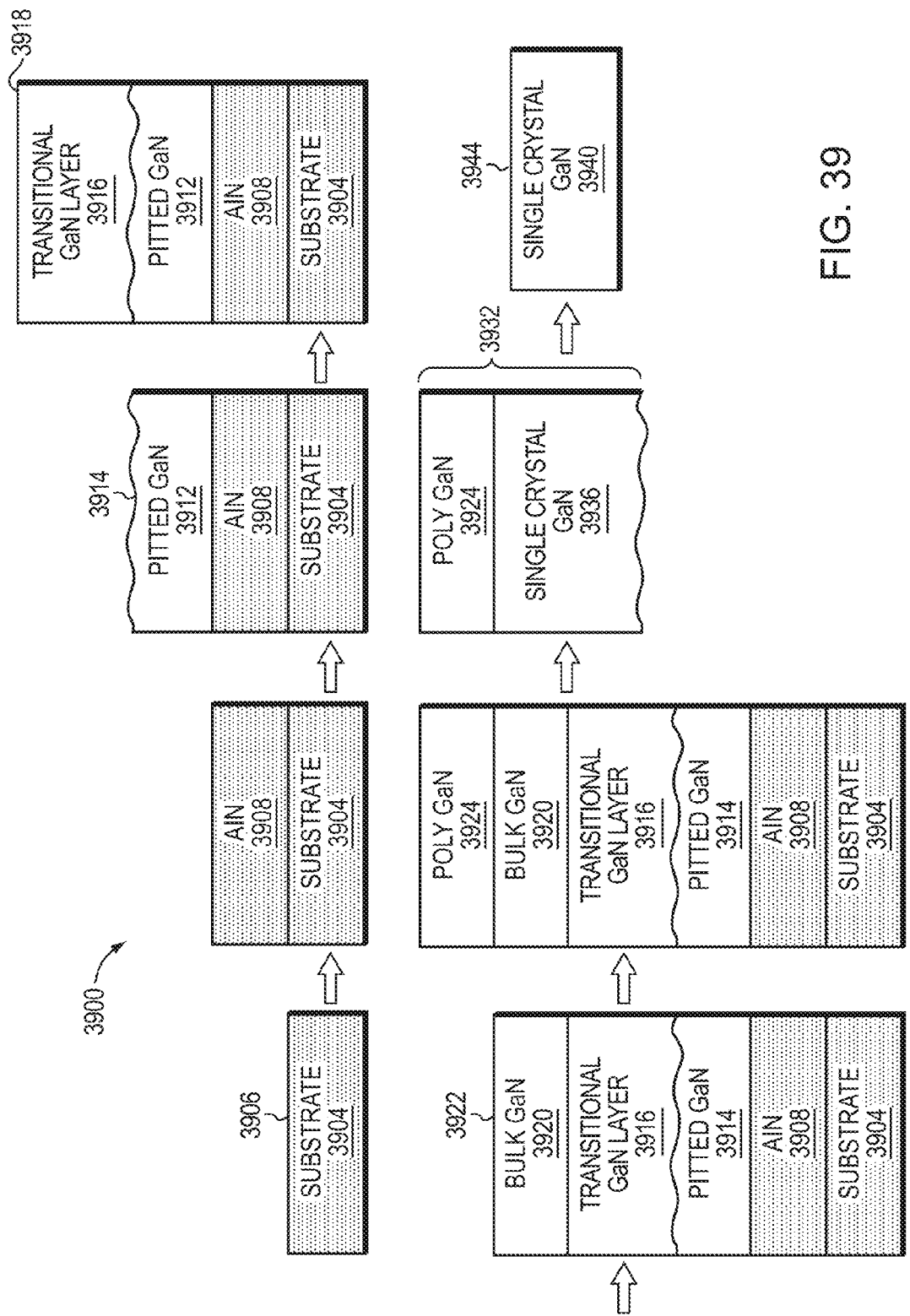
FIG. 39 is a schematic illustration of a method for producing a single crystal GaN wafer according to an implementation of the present invention.

FIG. 39 is a schematic, sequential illustration of an example of a process 3900 of the present invention. First, a sapphire substrate 3904 is provided. An epitaxial nitride (e.g., AlN) layer 3908 is then deposited on a surface 3906 of the sapphire substrate 3904. The deposition of epitaxial nitride layer 3908 may be done in the same reactor as for the subsequent GaN growth, or in a different deposition chamber. GaN material is subsequently deposited on the nitride-coated substrate 3904/3908 by hydride vapor phase epitaxy in multiple steps with different growth conditions for each step. A first GaN layer 3912 is grown under a condition that results in a pitted surface morphology, and such conditions are characterized by relatively higher growth rate, and/or high ammonia flow, and/or lower growth temperature than the optimal thin-film growth conditions that would yield a smooth surface morphology. The first GaN layer 3912 thus has a pitted surface 3914. A second GaN layer 3916 is grown from the first GaN layer 3912. The second GaN layer 3916 functions as a transitional layer that is grown under a condition that gradually fills the pits and yields a much less pitted GaN surface 3918, and such growth conditions are characterized by relatively lower growth rate, and/or lower ammonia flow, and/or higher growth temperature than the first pitted growth step. A third GaN layer 3920 is then grown on the second GaN layer 3916. The third GaN layer 3920 is the bulk layer where the majority of single-crystal GaN is grown. A fourth GaN layer 3924 is then grown on the third GaN layer 3920. The fourth GaN layer 3924 is a polycrystalline GaN layer that is provided to increase the overall mechanical strength of the entire GaN layers.

During cooling down from the growth temperature to ambient room temperature, the grown GaN film separates from the sapphire substrate 3904 via lateral cracking, producing a free-standing crack-free GaN article 3932 that includes a single-crystal layer 3936 and the polycrystalline layer 3924. The polycrystalline GaN material 3924 is mechanically stronger than the single-crystal layer 3936 and reduces the breakage of the GaN article 3932. The freestanding crack-free GaN article 3932 is processed by removing the polycrystalline GaN layer 3924 to yield a single crystal GaN wafer 3940.

Continuing with the example illustrated in FIG. 39, in some implementations, the substrate 3904 may have a characteristic dimension (e.g., diameter) of about 2 inches or greater. As further examples, the diameter of the substrate 3904 may be about 3" or greater, about 4" or greater, or any other suitable size such as about 12" or greater. The substrate 3904 may be sapphire ($Al_2O_3$), although other suitable single-crystal substrates 3904 may be utilized.

The surface 3906 of the substrate 3904 may be exactly c-plane or vicinal surfaces of the c-plane. Vicinal surfaces may promote step-flow during the HVPE GaN growth and may yield smoother surface morphology. The offcut angle of the vicinal surface with respect to the c-plane is in one example between about 0.1° and about 10°, and in another example between about 0.5° and about 5°. The direction of offcut may be along the <1-100> direction or along the <11-20> direction, or along a direction between <1-100> and <11-20>.

In one implementation, the epitaxial nitride layer 3908 is deposited by reactive sputtering on a heated substrate in a sputter deposition chamber. The nitride-coated substrate 3904/3908 is subsequently removed from the sputter chamber and loaded into the HVPE reactor for GaN growth. Other nitride nucleation layers such as, for example, AlN grown by MOCVD or MBE, GaN grown by MOCVD or MBE, AlGaN grown by MOCVD or MBE, or the like may also be used. In some implementations, a reactive sputtering-deposited AlN layer has an advantage of lower cost than MOCVD- or MBE-deposited nitride layers. AlN layers may also be grown in the HVPE reactor by incorporating an Al source so that hydrochloric acid reacts with Al to form aluminum chloride, which reacts with ammonia in the deposition zone to form AlN on the substrate surface. In one example, the thickness of the epitaxial nitride layer 3908 is in the range (ranges) from about 0.05 to about 10 microns. In another example, the thickness of the epitaxial nitride layer 3908 ranges from about 0.05 to about 2 microns. In another example, the thickness of the epitaxial nitride layer 3908 ranges from about 0.5 to about 2 microns.

In some implementations, depending on such factors as process conditions and the specific reactor being employed, the deposition of the epitaxial nitride layer 3908 may be desirable for growing single-crystal GaN films on sapphire substrates using the HVPE process. In other HVPE reactor systems, however, the single-crystalline GaN layer 3912 may be grown directly on the substrate 3904 by HVPE without using a template layer such as the epitaxial nitride layer 3908 prior to HVPE growth. In such cases, the growth sequence according to the teaching of the present invention can skip the nitride-coating step and proceed directly to the next growth step.

Figure 40:
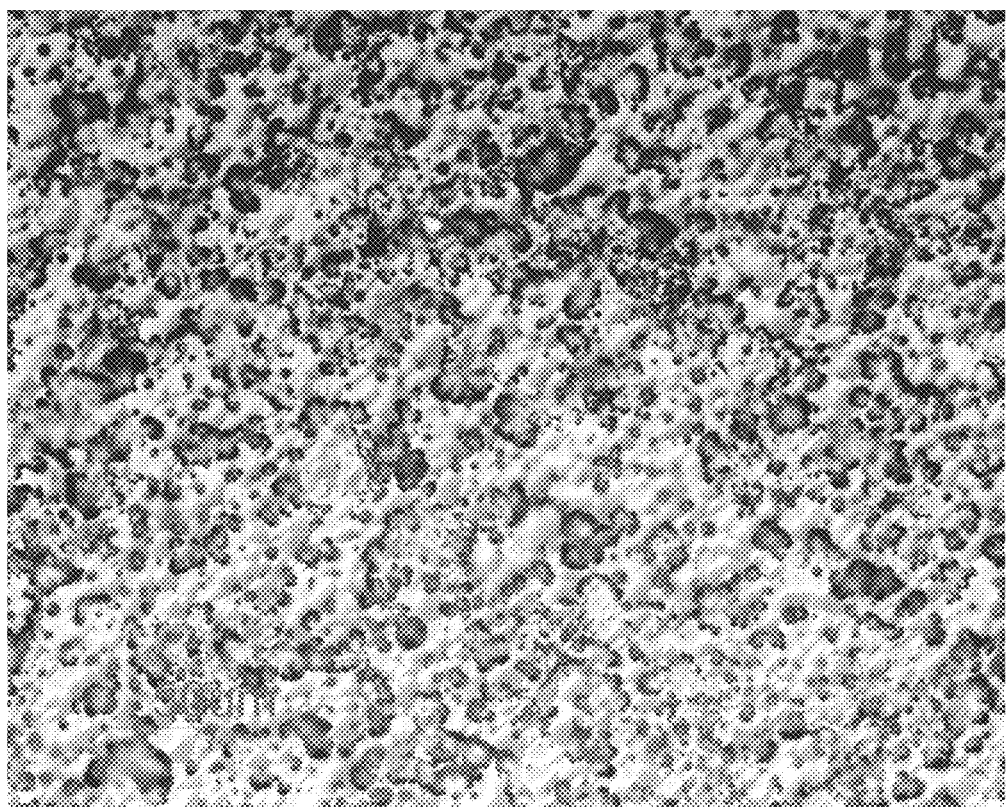
FIG. 40 is an optical micrograph of a GaN film according to an implementation of the present invention.

The second step of the growth process is to grow an epitaxial GaN layer 3912 by hydride vapor phase epitaxy in a 3D growth mode. The uncoated substrate 3904 or nitride-coated substrate 3904/3908 is loaded into an HVPE reactor, and the reactor may be purged with high-purity nitrogen to remove impurities. An epitaxial layer 3912 of gallium nitride is then grown. This GaN layer 3912 is grown in a three-dimensional (3D) growth mode, where the surface 3914 of the film is very rough and covered with pits. If the growth is stopped at the end of the first step and wafer taken out of the reactor, the GaN surface 3914 is not specular, as shown in a microphotograph in FIG. 40. The GaN film at this stage is still single-crystalline film as demonstrated by x-ray rocking curve measurements. The pit coverage, defined as the percentage of the surface covered with the pits on the surface, is in one example greater than about 50%, and in another example greater than about 75% at the end of this step. In other examples, the pitting percentage is greater than about 90%. The growth condition for this layer 3912 is typically higher growth rate, and/or higher ammonia flow (V:III ratio), and/or lower growth temperature than the "optimal" thin-film growth condition. An example of an "optimal growth condition" is an HVPE GaN growth condition that would yield a pit-free GaN thin film (<3 µm thick) on AlN-coated sapphire substrate as shown in Example 1.

There are two purposes for this 3D growth layer 3912: first is to prevent microcracking of GaN during the growth, and second is to present the GaN film with a certain stress condition that will facilitate the lateral cracks during cool down. In one example, the thickness of the 3D growth layer 3912 may range from about 5 to about 100 microns. In another example, the thickness of the growth layer 3912 ranges from about 10 to about 50 microns. In yet another example, the thickness of the 3D growth layer 3912 ranges from about 20 microns to about 30 microns. In another example, the thickness of the 3D growth layer 3912 is about 20 microns.

In one implementation, the growth temperature in the 3D growth mode ranges from about 900° C. to about 1000° C., the V:III ratio in the 3D growth mode ranges from about 10 to about 100, and the growth rate in the 3D growth mode ranges from about 50 µm/hr to about 500 µm/hr.

If the GaN film is grown under the 3D growth mode with higher thickness, the GaN film quality is gradually changed from an epitaxial single-crystalline film to a polycrystalline film.

The third step of the growth process is to change the HVPE growth conditions to transition the surface morphology from a heavily pitted surface morphology to a gradually less pitted surface morphology. The transition layer 3916 is grown under conditions such as lower growth rate, and/or lower $NH_3$ flow, and/or higher growth temperature than the growth condition of the nucleation layer 3912. In one example, the thickness of this morphology transition layer 3916 ranges from about 5 to about 500 microns. In another example, the thickness of the transition layer 3916 ranges from about 5 to about 200 microns. In another example, the thickness of the transition layer 3916 ranges from about 5 to about 100 microns. In another example, the thickness of the transition layer 3916 ranges from about 5 to about 50 microns. In another example, the thickness of the transition layer 3916 is about 8 microns. The purposes of the transition layer 3916 are to prevent the GaN film from turning into polycrystalline, and to prepare in the film a stress state that facilitates lateral cracks during cool down. At the end of growth of the transitional layer 3916, the growth surface 3918 is substantially pit-free. The surface coverage of pits at the growth surface 3918 after growing the transitional layer 3916 is in one example less than about 10%, in another example less than about 5%, and in another example less than about 1%.

In one implementation, the growth temperature in the recovery layer growth mode ranges from about 920° C. to about 1100° C., the V:III ratio in the recovery layer growth mode ranges from about 8 to about 80, and the growth rate in the recovery layer growth mode ranges from about 50 µm/hr to about 500 µm/hr.

The fourth growth step is the bulk growth step where the bulk of the single-crystalline GaN film is grown. The growth condition is chosen so that the morphology of the GaN film remains slightly pitted or pit-free. The GaN growth mode in this step is substantially a 2D growth mode. The growth conditions may be held constant during this step. Alternatively, one or more growth conditions may be slightly ramped, for example, slightly ramping down ammonia flow or slightly ramping down the growth rate or slightly ramping up the temperature. The purpose of the ramping in the bulk growth step is to further reduce the density of the pits on the growing GaN surface. During the bulk growth step, the density of the pits on the growing GaN surface is gradually reducing. At the end of the bulk growth, the GaN surface 3922 is slightly pitted or pit-free. In one example, the thickness of the GaN bulk layer 3920 grown in the bulk growth step ranges from about 500 to about 2000 microns (about 0.5 to about 2 mm). In another example, the thickness of the GaN bulk layer 3920 ranges from about 1000 to about 1500 microns (about 1 to about 1.5 mm).

In one implementation, the growth temperature in the bulk growth stage ranges from about 950° C. to about 1100° C., the V:III ratio in the bulk growth stage ranges from about 5 to about 50, and the growth rate in the bulk growth stage ranges from about 50 μm/hr to about 500 μm/hr.

The fifth step is to grow a polycrystalline GaN film 3924 on top of the single-crystalline GaN film 3920 grown in the fourth step by changing the growth condition. The polycrystalline GaN film 3924 may be grown by reducing the growth temperature, and/or increasing the $NH_3$ flow, and/or increasing the growth rate, as compared with the growth conditions employed in the preceding bulk growth step. In one example, the thickness of the polycrystalline GaN film 3924 ranges from about 500 to about 2000 microns (0.5 to 2 mm).

In one implementation, the growth temperature in the polycrystalline growth stage ranges from about 850° C. to about 1000° C., the V:III ratio in the bulk growth stage ranges from about 20 to about 200, and the growth rate in the bulk growth stage ranges from about 100 μm/hr to about 500 μm/hr.

The polycrystalline layer 3924 is postulated herein to improve the integrity of the GaN article 3932 in the following manners. In a single crystal, the cleavage planes of the crystal are substantially aligned and when a crack forms, there is little to blunt the crack from progressing through the thickness or length of the crystal. When a polycrystalline layer 3924 is deposited on the single crystal, the crystal cleavage planes in the polycrystal are not aligned with the planes in the single crystal. If a crack were to propagate through the single crystal, the energy required to propagate the crack through the polycrystal increases, thus making the article stronger. Additionally, when a polycrystalline layer 3924 is deposited on top of the single crystal, the thickness of the crystal changes and the stress in the entire GaN layer due to thermal expansion mismatch is reduced. This reduces the likelihood of crack formation in the article.

After completing the growth, the thick GaN-on-substrate bi-layer is gradually cooled down. The cooling rate is in one example less than about 20° C. per minute, and in another example less than about 10° C. per minute. In another example, the rate of cooling is about 6° C. per minute. During this cool down time, lateral cracking occurs in the GaN film with the crack plane essentially parallel to the GaN/substrate interface, leading to the separation of GaN from the underlying substrate. A thick GaN article 3932 having a characteristic dimension (e.g., diameter) as large as the initial substrate 3904 may be obtained, along with the substrate covered with a thin layer of GaN. As examples, when a 2" substrate 3904 is utilized, a 2" GaN article 3932 may be obtained. When a 3" substrate 3904 is utilized, a 3" GaN article 3932 may be obtained. When a 4" substrate 3904 is utilized, a 4" GaN article 3932 may be obtained. The substrate 3904 may remain intact, or remain partially intact with edge fracture, or fracture into several pieces. The remaining GaN on the substrate 3904 is typically less than 500 microns thick. The resulting freestanding GaN article 3932 is typically 1-4 mm thick.

The freestanding GaN article 3932 may be processed into a single-crystalline GaN wafer or substrate 3940 by mechanical means such as grinding or lapping and polishing. In one example, the freestanding GaN article 3932 is first sized into a desired wafer shape (herein defined as a wafer blank), optionally with major and minor flats to indicate the crystal orientation of the substrate 3940. In one example, the sized GaN wafer blank is about 10 mm×10 mm square or greater—i.e., the sized GaN wafer blank includes a side having a length of about 10 mm or greater. In another example, the sized GaN wafer blank is about 18 mm×18 mm square. In another example, the sized GaN wafer blank is about 1 inch round or greater—i.e., the sized GaN wafer blank is circular and has a diameter of about 1 inch or greater. In another example, the sized GaN wafer blank is about 2 inches round or greater. The front of the wafer blank is the polycrystalline GaN and the back of the wafer blank is the nitrogen-face of the single-crystalline GaN. The polycrystalline part of the wafer blank may be removed by mechanical means such as grinding and/or lapping. The thickness removed from the front side of the wafer blank may be at least as much as or greater than the thickness of the polycrystalline material to expose the Ga-face 3944 of the single crystalline GaN substrate 3940. After completely removing the polycrystalline material from the front side of the wafer blank, the front side (Ga face) may be further polished with diamond slurry. The Ga-surface 3944 may be finished with a chemical-mechanical polish step that removes the surface and subsurface damage and produces an epi-ready surface. The back side of the wafer blank may be processed by mechanical means such as grinding or lapping to planarize (mechanically flatten) the surface and to achieve the desired wafer thickness. Since the crystal defect density is reduced during the growth of single-crystalline GaN, it may be preferable to take away material from the back side to achieve the desired wafer thickness. Optionally, the back side may be polished to produce an optical finish.

In some implementations, during the bulk growth, no impurity is introduced and all the gas sources are purified, in order to achieve high-purity GaN crystals. In some examples, the impurity concentration in the high-purity GaN layer is less than about $10^{17}$ $cm^{-3}$. In other examples, the impurity concentration is less than about $10^{16}$ $cm^{-3}$. In other examples, the impurity concentration is less than about $10^{15}$ $cm^{-3}$.

Alternatively, in other implementations, during the bulk growth, n-type impurities, such as silicon (introduced, for example, as diluted silane) or oxygen, are introduced to produce n-type GaN crystals. The introduction of impurities may occur at any stage of the GaN growth. In some examples, the electron concentration in the n-type bulk GaN layer is greater than about $10^{17}$ $cm^{-3}$. In other examples, the electron concentration is greater than about $10^{18}$ $cm^{-3}$. In other examples, the electron concentration is greater than about $10^{19}$ $cm^{-3}$. In some examples, the resistivity of the n-type GaN layer is less than about 0.1 ohm-cm. In other examples, the resistivity is less than about 0.01 ohm-cm. In other examples, the resistivity is less than about 0.001 ohm-cm. Conductive GaN wafers may be used as substrates for the fabrication of optoelectronic devices such as light emitting diodes, laser diodes, and photodetectors. Conductive GaN wafers may also be used as substrates for electronic devices such as Schottky diodes and heterojunction bipolar transistors.

In other implementations, during the bulk growth, p-type impurities such as magnesium (Mg) are introduced to produce p-type GaN crystals. Mg may be introduced as metalorganic compound or as metal vapor. The introduction of impurities may occur at any stage of the growth. In some examples, the hole concentration in the p-type bulk GaN layer is greater than about $10^{17}$ $cm^{-3}$. In other examples, the hole concentration is greater than about $10^{18}$ $cm^{-3}$. In other examples, the hole concentration is greater than about $10^{19}$ $cm^{-3}$. In some examples, the resistivity of the p-type GaN layer is less than about 0.1 ohm-cm. In other examples, the resistivity is less than about 0.01 ohm-cm. In other examples, the resistivity is less than about 0.001 ohm-cm.

In other implementations, the electrical properties of the bulk GaN crystal can also be made semi-insulating by introducing a deep-level acceptor. Transition metals, such as iron, are deep level acceptors. Iron can be introduced to the deposition zone either via a metal-organic compound such as ferrocene or via iron chloride formed by reacting iron with hydrochloric acid. The concentration of the transition metal in the bulk GaN layer may range from about $10^{16}$ to about $10^{20}$ cm$^{-3}$. In other examples, the concentration of the transition metal ranges from about $10^{17}$ to about $10^{19}$. In other examples, the concentration of the transition metal is around $10^{18}$ cm$^{-3}$. The resistivity of the SI bulk GaN layer at room temperature may be greater than about $10^6$ ohm-cm. In other examples, the resistivity is greater than about $10^7$ ohm-cm. In other examples, the resistivity is greater than about $10^8$ ohm-cm. Semi-insulating GaN wafers can be used as substrates for electronic devices such as high electron mobility transistors.

Certain implementations of the present invention may be further understood by the following illustrative, non-limiting examples.

Example 14

Si-Doped GaN Growth

In this example, we illustrate production of silicon-doped 2" single crystalline GaN wafer. A 2" c-plane sapphire was used as the starting substrate. An epitaxial AlN layer was deposited using high temperature reactive sputtering method, as disclosed in U.S. Pat. No. 6,704,085. The thickness of the AlN layer was approximately 0.25 μm. X-ray rocking curve measurement showed a full width at half maximum of about 55 arcsec for the AlN(0002) reflection, indicating high crystal quality of the AlN film. The AlN-coated sapphire substrate was loaded into the previously described vertical HVPE system and the GaN growth was commenced.

Figure 41:
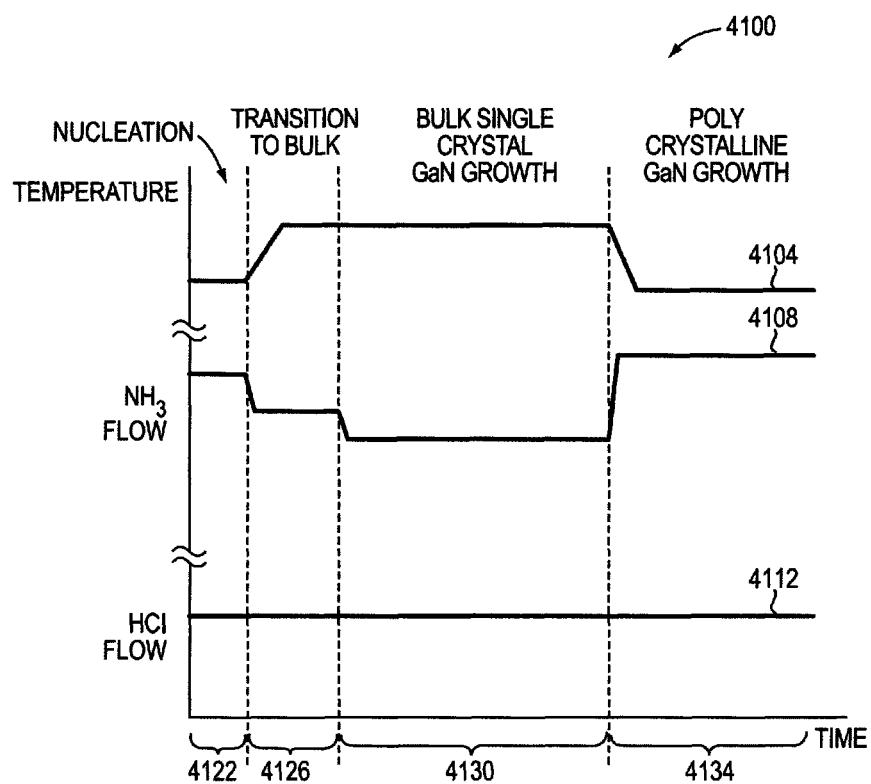
FIG. 41 is an illustration of a GaN growth process, including the temperature, $NH_3$ flows, and HCl flows for the nucleation, transition, bulk growth, and polycrystalline growth stages according to one example of the present invention.

FIG. 41 is an illustration of the HVPE GaN growth process 4100 for this example, including the temperature 4104, NH$_3$ flows 4108, and HCl flows 4112 for the nucleation stage 4122, transition stage 4126, bulk growth stage 4130, and polycrystalline growth stage 4134. The growth process included a nucleation step 4122 on the AlN-coated sapphire substrate with a rough surface morphology (3D growth mode), transitioning 4126 the growth condition from the nucleation stage (3D growth mode) 4122 to the single crystalline bulk growth stage (2D growth mode) 4130, single-crystalline bulk growth 4130, and polycrystalline cap growth 4134.

The nucleation layer was grown at a growth temperature of about 995° C., HCl flow of about 120 sccm, and NH$_3$ flow of about 4000 sccm, corresponding to a growth rate of about 330 μm/hr. The growth time was about 5 minutes, corresponding to a thickness of about 28 μm. In some examples, the growth was stopped at this stage and the wafer was taken out for examination. The GaN surface was very rough and not specular. Under optical microscope examination, the surface contains high density of pits, similar to the image shown in FIG. 40.

Figure 42:
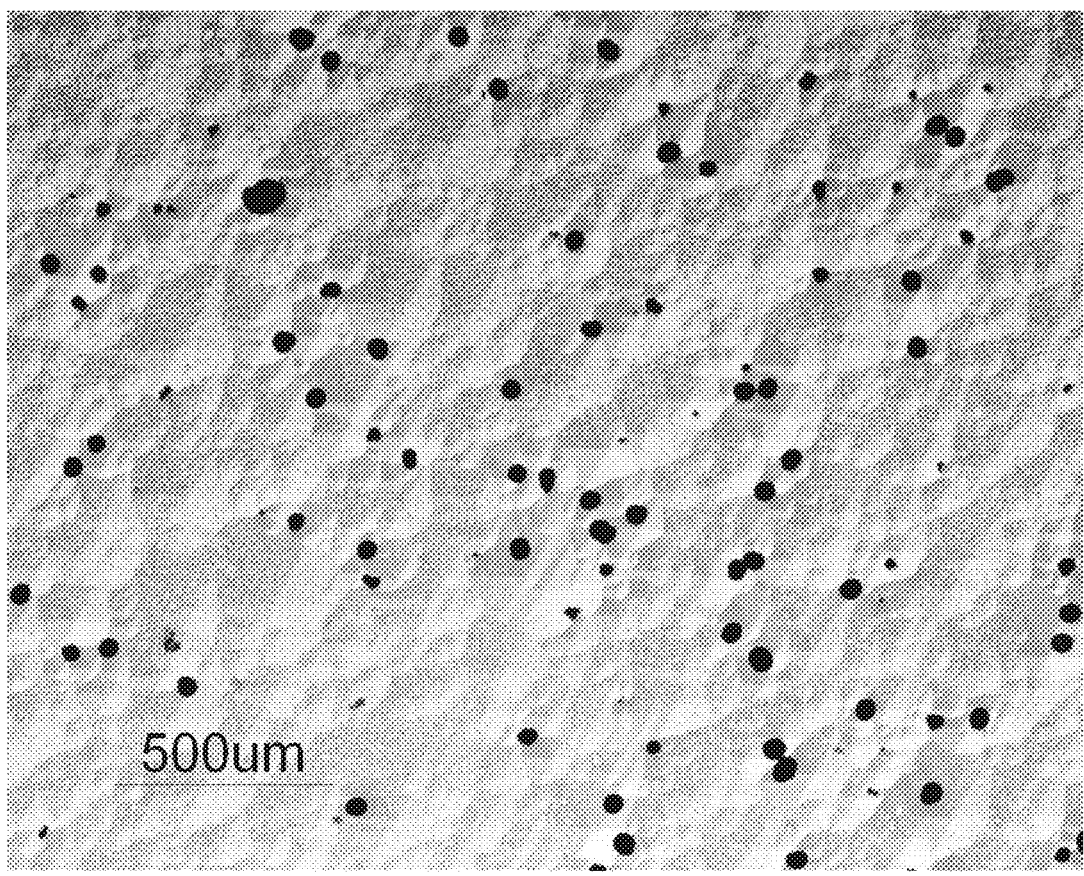
FIG. 42 is an optical micrograph of a GaN film according to an implementation of the present invention.

After the growth of the 3D nucleation layer, the growth condition was changed to influence the evolution of the surface morphology from a heavily pitted surface to a much less pitted surface. The growth temperature was raised by about 15° C. to about 1010° C., NH$_3$ flow was reduced from about 4000 sccm to about 2000 sccm. The growth rate was remained at 330 μm/hr and the growth time was 30 minutes, corresponding to a nominal thickness of about 165 μm for the transitional layer. Silane was introduced into the reactor during the growth. In some examples, the growth was stopped at this stage, and the wafer was taken out of the reactor for examination. The GaN surface was visually specular. When examined under optical microscope, the GaN surface exhibited typical hillock morphology with some pits. FIG. 42 shows an optical micrograph of the GaN film grown at this stage. The surface area occupied by the pits was quite low, typically less than 5%.

Following the transition layer, the single crystalline bulk GaN layer was grown. The growth temperature and the growth rate remained the same as those for the transitional layer, 1010° C. and 330 μm/hr. The NH$_3$ flow was further reduced from 2000 sccm to 1600 sccm for this stage of the growth. The silane flow was not changed. The growth time for this step was 3.5 hours, corresponding to a nominal thickness of about 1.1 mm for the material grown in this step. The total epitaxial single-crystalline GaN film grown was about 1.35 mm thick. In some examples, the growth was stopped at this stage, and the wafer was taken out of the reactor for examination. The surface morphology was similar to that shown in FIG. 42, except that the hillock feature is larger and surface is almost pit-free. Under these growth conditions, the GaN cracked laterally during cool down and separated the GaN from the sapphire (the sapphire still has a thin GaN layer). Because the GaN also has a few cracks from the fracture during cool-down, frequently only large pieces of freestanding GaN and not the whole 2" substrate were obtained.

After the growth of the bulk single crystalline GaN layer, the growth condition was changed to grow a mechanically stronger polycrystalline GaN cap. The growth temperature was reduced by 20° C. to 990° C. and the NH$_3$ flow was increased from 1600 sccm to 6000 sccm. The HCl flow was kept at 120 sccm for a nominal growth rate of 330 μm/hr. At this growth condition, the GaN film gradually changed into a polycrystalline film during the growth. In this example, the growth time for the polycrystalline cap was about 4 hours and the nominal thickness of the polycrystalline GaN material was about 1.3 mm. The total GaN thickness was about 2.6 mm.

After completion of the growth sequence, the GaN/sapphire bi-layer was cooled to room temperature at a cooling rate of approximately 6° C. per minute. During the cooling process, the GaN cracked laterally, forming a 2" freestanding GaN article and the sapphire substrate with a thin GaN layer still attached. Because of the presence of the mechanically stronger polycrystalline GaN layer, the GaN article did not crack vertically during the laterally cracking separation. The freestanding 2" GaN article was crack-free. The thickness of the freestanding GaN article was about 2.1 mm.

The top surface of the freestanding GaN was polycrystalline material and the bottom surface was the nitrogen face (N-face) of the single crystalline GaN. The bottom surface was not flat because it was generated from lateral cracking.

The 2" freestanding GaN article was processed into 2" GaN wafer. First, edge grinding was performed to make into within 0.005" tolerance of the 2" wafer diameter. Because the initial sapphire had a major flat, the grown GaN article also had a flat. The ground 2" GaN article is called a wafer blank herein.

The 2" GaN wafer blank was mounted on a fixture using wax with the front surface facing the fixture. The back surface (N-face) was lapped on a metal plate with diamond slurry until a uniform surface finish was achieved. At this stage, the thickness of the blank was about 1.8 mm. The 2" GaN wafer blank was removed from the fixture and mounted again using wax with the back side facing the fixture. The front side was lapped on a metal plate with diamond slurry. About 1.3 mm of the front material was removed. At this stage, the polycrystalline material was completely removed, resulting in a 2" single crystalline GaN wafer about 500 micron thick. Because silicon doping was used during the growth, the GaN wafer was conductive with a resistivity less than 0.05 ohm-cm.

Example 15

Semi-Insulating GaN Growth

In this example, we illustrate production of semi-insulating 2" GaN substrate. Sapphire(0001) was used as the starting substrate. An AlN layer approximately 0.25 µm thick was grown on the sapphire substrate using reactive sputtering on the heated substrate. X-ray diffraction was used to verify the AlN film was single crystal with a full width at half maximum of 55 arcsec. The AlN/sapphire structure was loaded into the previously described vertical HVPE system and the GaN growth was commenced.

Figure 43:
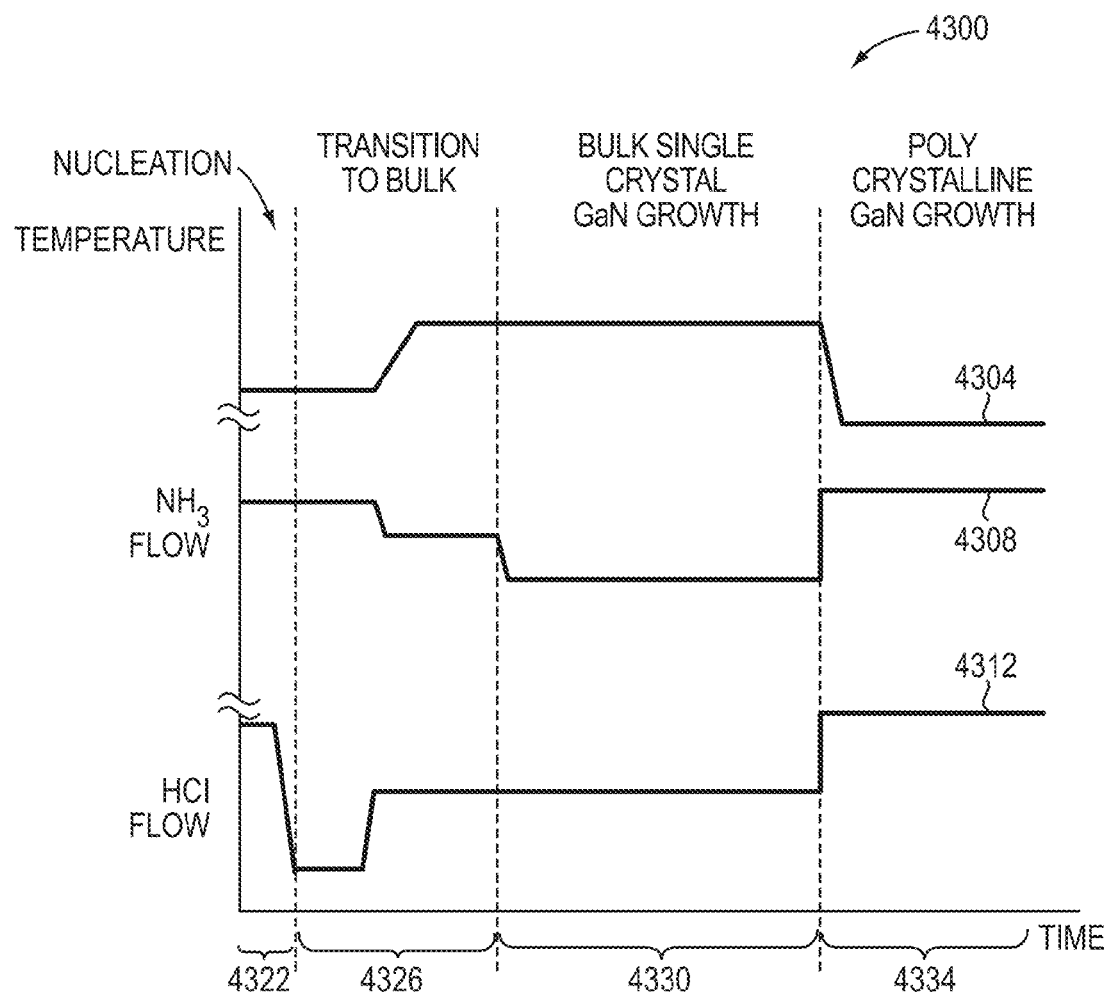
FIG. 43 is an illustration of a GaN growth process, including the temperature, $NH_3$ flows, and HCl flows for the nucleation, transition, bulk growth, and polycrystalline growth stages according to another example of the present invention.

The HVPE GaN film was grown by a multiple-step method. FIG. 43 is an illustration of the HVPE GaN growth process 4300 for this example, including the temperature 4304, $NH_3$ flows 4308, and HCl flows 4312 for the nucleation stage 4322, transition stage 4326, bulk growth stage 4330, and polycrystalline growth stage 4334. The growth process 4300 included a nucleation step 4322 on the AlN-coated sapphire substrate with a rough surface morphology (3D growth mode), transitioning 4326 the growth condition from the nucleation stage (3D growth mode 4322) to the single-crystalline bulk growth stage (2D growth mode) 4330, single-crystalline bulk growth 4330, and polycrystalline cap growth 4334.

The GaN film was first grown under conditions of growth rate of approximately 260 microns per hour, growth temperature of 968° C., HCl flow rate of 92 sccm, and $NH_3$ flow rate of 2000 sccm. This was the GaN nucleation layer on the AlN-coated surface. The growth time for the nucleation layer was approximately 4 minutes and the thickness of this layer was approximately 18 microns. In some runs, the growth was stopped at this point, and the wafer was taken out of the reactor for examination. The wafer surface was visually not specular, and appeared rough. Under microscope examination, the surface was covered with high density of pits. This layer was grown under a 3D growth mode.

After growth of the nucleation layer, the growth rate was reduced to approximately 65 microns per hour by reducing HCl flow to 23 sccm while keeping the same $NH_3$ and growth temperature. After growth of approximately 7 minutes under these conditions, the HCl flow was increased to 46 sccm, the $NH_3$ flow was reduced to 1500 sccm and growth temperature was raised by 15° C. to 983° C. for approximately 1 hour. These two growth conditions were considered as the transitional layer where the surface morphology was improved with less pits. Ferrocene was introduced in the growth system using a nitrogen carrier gas flow of 200 sccm. In some runs, the growth was stopped at this point and wafer was taken out of the reactor for examination. The wafer surface was visually specular and smooth. A few pits still remained, but the percentage of the surface covered by pits was less than 1%. In this step the growth mode was transitioned from the 3D mode of the nucleation to 2D growth mode.

After the growth of the transitional layer, the $NH_3$ flow was further reduced to 900 sccm for additional growth time of 7 hours. The ferrocene flow was maintained during this layer.

After the growth of the bulk single crystalline GaN layer, the growth condition was changed to grow a mechanically stronger polycrystalline GaN cap. The growth temperature was reduced by 20° C. to 963° C. and the $NH_3$ flow was increased from 900 sccm to 5000 sccm. The HCl flow increased to 120 sccm for a nominal growth rate of 330 µm/hr. At this growth condition, the GaN film gradually changed into polycrystalline during the growth. In this example, the growth time for the polycrystalline cap was about 4 hours and the nominal thickness of the polycrystalline GaN material was about 1.3 mm. The total GaN thickness was about 2.6 mm.

After completion of the growth sequence, the GaN/sapphire bi-layer was cooled to room temperature at a cooling rate of approximately 6° C. per minute. During the cooling process, the GaN cracked laterally, forming a 2" freestanding GaN article and the sapphire substrate with a thin GaN layer still attached. Because of the presence of the mechanically stronger polycrystalline GaN layer, the GaN article did not crack vertically during the laterally cracking separation. The freestanding 2" GaN article was crack-free. The thickness of the freestanding GaN article was about 2.1 mm.

The top surface of the freestanding GaN was polycrystalline material and the bottom surface was the nitrogen face (N-face) of the single crystalline GaN. The bottom surface was not flat because it was generated from lateral cracking.

The 2" freestanding GaN article was processed into 2" GaN wafer. First, edge grinding was performed to make into within 0.005" tolerance of the 2" wafer diameter. Because the initial sapphire had a major flat, the grown GaN article also had a flat. The ground 2" GaN article is called wafer blank herein.

The 2" GaN wafer blank was mounted on a fixture using wax with the front surface facing the fixture. The back surface (N-face) was lapped on a metal plate with diamond slurry until a uniform surface finish was achieved. At this stage, the thickness of the blank was about 1.8 mm. The 2" GaN wafer blank was removed from the fixture and mounted again using wax with the back side facing the fixture. The front side was lapped on a metal plate with diamond slurry. About 1.3 mm of the front material was removed. At this stage, the polycrystalline material was completely removed, resulting in a 2" single crystalline GaN wafer about 500 micron thick. Because iron doping was used during the growth, the GaN wafer was semi-insulating with a resistivity greater than $10^6$ ohm-cm.

Many examples of the present invention utilized AlN-coated sapphire as the substrate for the GaN crystal growth. As previously noted, other substrates, coated with another type of Group III nitride such as GaN or more generally (Al, Ga, In)N, may also be used in the present invention and thus are included within the scope of the invention. In other HVPE reactor systems that enable direct nucleation of single crystalline GaN film on bare sapphire substrate, bare sapphire may be used as substrate for the bulk GaN growth in accordance with the scope of the present invention. GaN wafers, which may be produced according to implementations of the present invention, may also be used as the substrate for the bulk GaN crystal growth.

Many examples of the present invention utilized several specific growth sequences. It should be understood that these specific growth processes are meant for illustrative purposes and are not limiting. It should also be noted that growth conditions cited in the examples are specific to the HVPE growth reactor employed in the examples. When employing a different reactor design or reactor geometry, it may be desirable to utilize a different condition to achieve similar results. However, the general trends are still similar.

It will be apparent to those skilled in the art that various modifications and variations can be made in the growth of the bulk GaN crystal within the scope of the present invention. Thus it is construed that the present invention covers the variations and modifications of this invention provided they come within the scope of the appended claims and their equivalents.

What is claimed is:

1. A method for forming a bulk crystal structure, the method comprising:
   providing a substrate within a growth reactor;
   growing a GaN nucleation layer over the substrate under nucleation layer growth conditions that produce a pitted nucleation layer surface;
   introducing a first doping impurity into the growth reactor during at least a portion of the growth of the GaN nucleation layer, at least some of the first doping impurity being incorporated within the GaN nucleation layer;
   growing a GaN transitional layer over the GaN nucleation layer under transitional layer growth conditions that (i) are different from the nucleation layer growth conditions and (ii) produce a transitional layer surface having a lesser percentage of pits than the pitted nucleation layer surface; and
   growing a GaN bulk layer over the transitional layer, the GaN bulk layer having a surface that is substantially free of pits.

2. The method of claim 1, further comprising depositing an AlN layer over the substrate prior to growing the GaN nucleation layer.

3. The method of claim 1, wherein the AlN layer is deposited by sputtering.

4. The method of claim 1, wherein at least one of the GaN nucleation layer, the GaN transitional layer, or the GaN bulk layer are grown by hydride vapor phase epitaxy.

5. The method of claim 1, wherein the nucleation layer growth conditions include a first growth temperature, a first ammonia partial pressure, a first V:III ratio, and a first growth rate, the transitional layer growth conditions include a second growth temperature, a second ammonia partial pressure, a second V:III ratio, and a second growth rate, and the transitional layer growth conditions are selected from the group consisting of the first growth temperature being increased to the second growth temperature, the first ammonia partial pressure being reduced to the second ammonia partial pressure, the first growth rate being reduced to the second growth rate, and two or more of the foregoing.

6. The method of claim 5, wherein the first growth temperature ranges from about 900° C. to about 1000° C., the first V:III ratio ranges from about 10 to about 100, the first growth rate ranges from about 50 μm/hr to about 500 μm/hr, the second growth temperature ranges from about 920° C. to about 1100° C., the second V:III ratio ranges from about 8 to about 80, and the second growth rate ranges from about 50 μm/hr to about 500 μm/hr.

7. The method of claim 1, wherein a pitting percentage of the pitted nucleation layer surface is greater than about 50%.

8. The method of claim 1, wherein a diameter of pits of the pitted nucleation layer surface ranges from about 5 to about 50 microns.

9. The method of claim 1, wherein a pit density within the GaN transitional layer decreases as a function of a thickness of the GaN transitional layer.

10. The method of claim 1, wherein the transitional layer surface has a smooth surface morphology, and a surface morphology of the GaN bulk layer remains smooth during growth thereof.

11. The method of claim 1, wherein the GaN nucleation layer is substantially free of cracks and microcracks.

12. The method of claim 1, wherein a concentration of the first doping impurity within the GaN bulk layer is less than about $10^{17}$ cm$^{-3}$.

13. The method of claim 1, wherein a concentration of the first doping impurity within the GaN bulk layer is less than about $10^{16}$ cm$^{-3}$.

14. The method of claim 1, wherein a concentration of the first doping impurity within the GaN bulk layer is less than about $10^{15}$ cm$^{-3}$.

15. The method of claim 1, wherein the first doping impurity is not introduced within the growth reactor during growth of the GaN bulk layer.

16. The method of claim 1, wherein the first doping impurity comprises at least one of silicon, oxygen, or magnesium.

17. The method of claim 1, wherein the first doping impurity comprises at least one of iron, beryllium, cobalt, nickel, manganese, or zinc.

18. The method of claim 1, wherein a thickness of the GaN bulk layer is greater than about 1 mm.

19. The method of claim 1, wherein an average dislocation density of the GaN bulk layer is less than about $10^7$ cm$^{-2}$.

20. The method of claim 1, further comprising introducing a second doping impurity into the growth reactor during at least a portion of the growth of the GaN transitional layer, at least some of the second doping impurity being incorporated within the GaN transitional layer.

21. The method of claim 20, wherein the second doping impurity is the same as the first doping impurity.

22. The method of claim 20, wherein the first and second doping impurities are different.

* * * * *